(12) United States Patent
Kiuchi et al.

(10) Patent No.: US 9,152,062 B2
(45) Date of Patent: Oct. 6, 2015

(54) PATTERN FORMING DEVICE, PATTERN FORMING METHOD, AND DEVICE MANUFACTURING METHOD

(75) Inventors: Tohru Kiuchi, Higashikurume (JP); Hideo Mizutani, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 517 days.

(21) Appl. No.: 13/526,428

(22) Filed: Jun. 18, 2012

(65) Prior Publication Data

US 2012/0270144 A1    Oct. 25, 2012

Related U.S. Application Data

(62) Division of application No. 12/822,773, filed on Jun. 24, 2010, now Pat. No. 8,235,695.

(60) Provisional application No. 61/226,330, filed on Jul. 17, 2009, provisional application No. 61/226,458, filed on Jul. 17, 2009.

(51) Int. Cl.
*B29C 35/02* (2006.01)
*G03F 7/20* (2006.01)
*G03F 9/00* (2006.01)

(52) U.S. Cl.
CPC .......... *G03F 7/70791* (2013.01); *G03F 9/7003* (2013.01)

(58) Field of Classification Search
CPC ............................. G03F 7/70791; G03F 9/7003
USPC ......... 355/64, 72, 77; 430/311–314; 264/231, 264/234
See application file for complete search history.

(56) References Cited

U.S. PATENT DOCUMENTS

| 5,196,745 | A  | 3/1993  | Trumper |
| 5,652,645 | A  | 7/1997  | Jain |
| 5,945,059 | A  | 8/1999  | Atake |
| 6,243,160 | B1 | 6/2001  | Takano |
| 6,552,775 | B1 | 4/2003  | Yanagihara |
| 6,778,257 | B2 | 8/2004  | Bleeker et al. |
| 2005/0218554 | A1 | 10/2005 | Suzuki |
| 2006/0066715 | A1 | 3/2006  | Fukui |

(Continued)

FOREIGN PATENT DOCUMENTS

| CN | 1573559 A | 2/2005 |
| JP | A-2000-095402 | 4/2000 |

(Continued)

OTHER PUBLICATIONS

International Search Report and Written Opinion mailed Oct. 25, 2010, for International Patent Application No. PCT/JP2010/062483.

(Continued)

*Primary Examiner* — Joseph S Del Sole
*Assistant Examiner* — Thukhanh T Nguyen
(74) *Attorney, Agent, or Firm* — Finnegan, Henderson, Farabow, Garrett & Dunner, L.L.P.

(57) ABSTRACT

Presented are methods for forming a predetermined pattern in a predetermined area of an elongated sheet material. The methods include applying a two-dimensional tension to a portion including the predetermined area of the sheet material, and allowing a flat reference surface to adsorb a rear surface portion corresponding to the predetermined area of the sheet material applied with the two-dimensional tension. The methods then illuminate an energy beam corresponding to the pattern to the predetermined area of the sheet material adsorbed to the reference surface.

13 Claims, 30 Drawing Sheets

(56) References Cited

U.S. PATENT DOCUMENTS

2008/0165334 A1 7/2008 Kumazawa et al.
2009/0154790 A1 6/2009 Narabayashi

FOREIGN PATENT DOCUMENTS

| JP | 2004-347964 | 12/2004 |
| JP | A-2004-341280 | 12/2004 |

OTHER PUBLICATIONS

Office Action issued by the Chinese Patent Office in counterpart Application 201080031672.9, mailed Nov. 21, 2013 (36 pages).

Office Action (or Notice of Reasons for Rejection) issued by Japanese Patent Office in counterpart Application 2010-161296, mailed Jan. 17, 2014 (7 pages).

FIG. 8
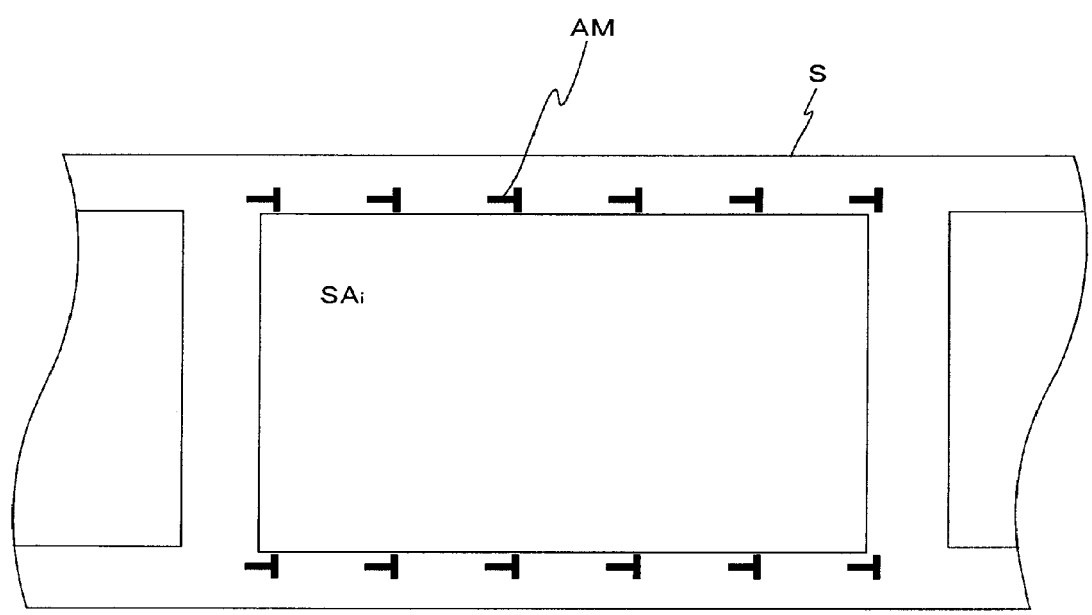
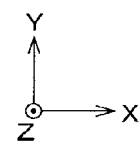

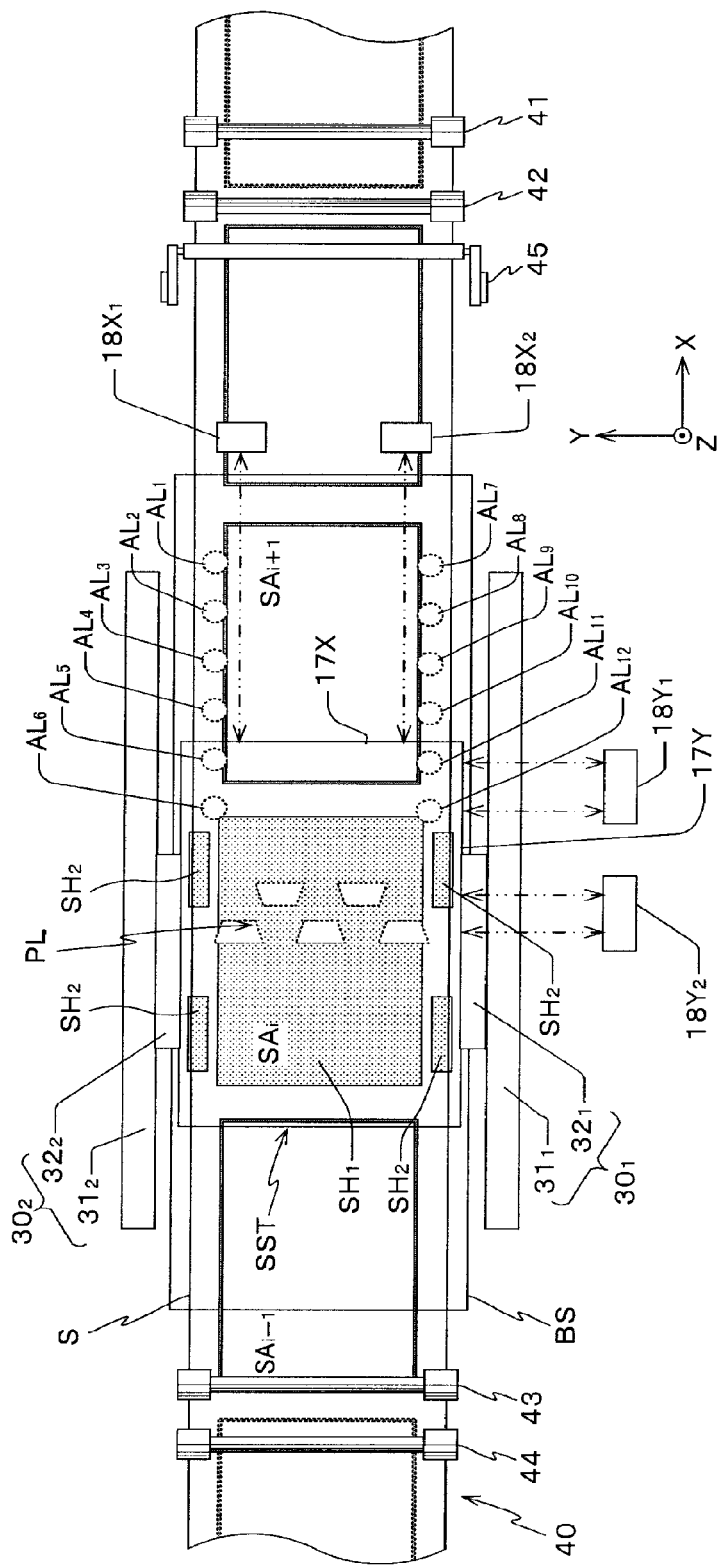

FIG. 28
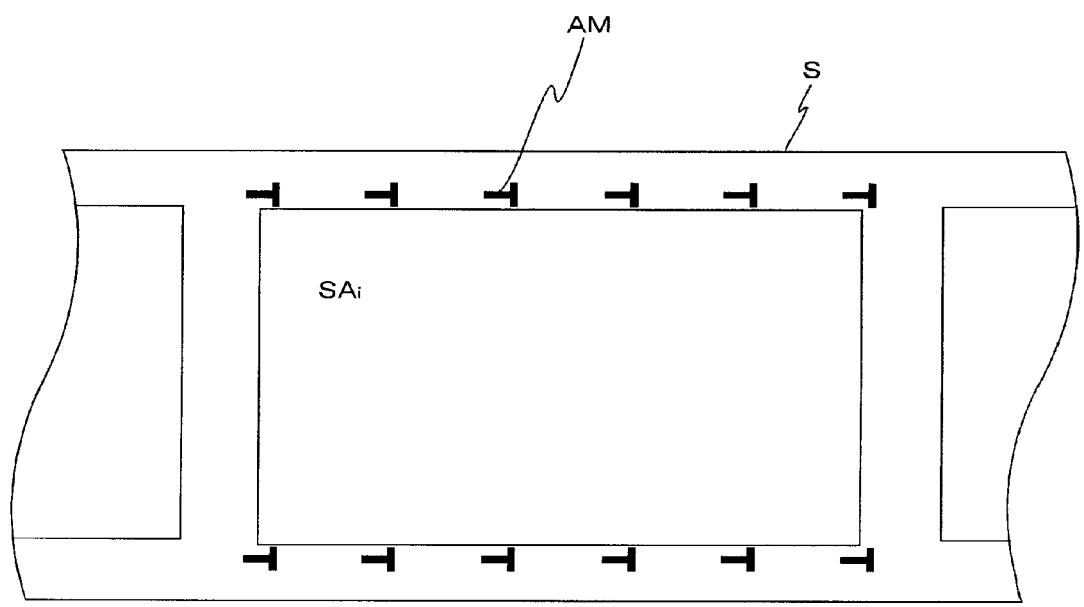
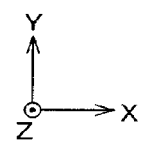

PATTERN FORMING DEVICE, PATTERN FORMING METHOD, AND DEVICE MANUFACTURING METHOD

CROSS-REFERENCE TO RELATED APPLICATION

This is a divisional application of U.S. application Ser. No. 12/822,773, filed Jun. 24, 2010, now U.S. Pat. No. 8,235,695, which claims the benefit of U.S. Provisional Application No. 61/226,330, filed Jul. 17, 2009, and U.S. Provisional Application No. 61/226,458, filed Jul. 17, 2009, all of which are incorporated herein by reference.

BACKGROUND

1. Field of the Invention

The present invention relates to a pattern forming device, a pattern forming method, and a device manufacturing device, and more particularly, to a pattern forming device and a pattern forming method of forming a pattern in a plurality of areas of a surface of an elongated sheet material through a scanning exposure, and to a device manufacturing method of manufacturing an electronic device by using the pattern forming method.

2. Description of Related Art

The size of a flat display panel such as a liquid crystal display panel and a plasma display panel has been increased. For example, in the case of the liquid crystal display panel, as a glass substrate (large substrate) used for the manufacture thereof, a large substrate of which the length of a side is more than 3 m is used in order to efficiently manufacture a plurality of displays as a whole. For this reason, a stage device for holding the substrate increases in size in accordance with an increase in size of the substrate. In the stage device for treating a substrate weighing several tens of kg, the weight of a movable portion is almost equal to 10 tons, and the entire weight of the device exceeds 100 tons. For this reason, in the near future, the manufacture and the delivery of the substrate can be difficult due to a further increase in size of the substrate. In addition, it is certain that a large amount of investment is necessary for the infrastructure improvement due to a further increase in size of the stage device.

Meanwhile, there is known an exposure device which is mainly used in the field of manufacturing a printed interconnection substrate, and a roll-sheet-like recording medium is set as an exposure target object. When such an exposure device is applied to manufacture, for example, a liquid crystal display element, various problems caused by an increase in size of the above-described glass substrate can be solved. For this reason, this exposure device can be used as one of the exposure devices for manufacturing the liquid crystal display element in the future.

As the existing exposure devices for a sheet-like recording medium, for example, there are known exposure devices disclosed in Patent Documents (U.S. Pat. No. 5,652,645, US Patent Application Publication No. 2006/0066715, U.S. Pat. No. 6,243,160). However, even when such exposure devices are directly used to manufacture the liquid crystal display element, it is difficult to manufacture the liquid crystal display element with desired precision. For example, in the liquid crystal display element, patterns are overlapped in a plurality of layers through an exposure. However, since each of the layers is subjected to a process, a phenomenon arises in that the sheet is contracted by heat or the like. Accordingly, such a phenomenon needs to be handled.

SUMMARY

According to a first aspect of the present invention, there is provided a pattern forming device for forming a predetermined pattern in a predetermined area of an elongated sheet material, the pattern forming device including: a tension applying device which applies a two-dimensional tension to a portion including the predetermined area of the sheet material; an adsorption device which includes a reference surface member having a flat reference surface and allows the reference surface to adsorb a rear surface portion corresponding to the predetermined area of the sheet material applied with the two-dimensional tension; and an illumination device which illuminates an energy beam corresponding to the pattern to the predetermined area of the sheet material adsorbed to the reference surface.

Accordingly, the two-dimensional tension is applied to the portion including the predetermined area of the sheet material by the tension applying device, and the rear surface portion corresponding to the predetermined area of the sheet material applied with the two-dimensional tension is adsorbed to the flat reference surface by the adsorption device. In addition, the energy beam corresponding to the pattern is illuminated to the predetermined area of the flat sheet material adsorbed to the reference surface by the illumination device, so that the sheet material is exposed and the pattern is formed thereon. Accordingly, even in the case of the sheet material becoming contracted by, for example, heat generated during a treatment of a process, it is possible to perform the exposure with high precision.

According to a second aspect of the present invention, there is provided a pattern forming method of forming a predetermined pattern in a predetermined area of an elongated sheet material, the pattern forming method including: applying a two-dimensional tension to a portion including the predetermined area of the sheet material; allowing a flat reference surface to adsorb a rear surface portion corresponding to the predetermined area of the sheet material applied with the two-dimensional tension; and illuminating an energy beam corresponding to the pattern to the predetermined area of the sheet material adsorbed to the reference surface.

Accordingly, even in the case of the sheet material contracted by, for example, heat generated during a treatment of a process, it is possible to perform the exposure with high precision.

According to a third aspect of the present invention, there is provided a device manufacturing method including: forming a pattern on an elongated sheet material by using the pattern forming device according to the present invention; and performing a process on the sheet material having the pattern formed thereon.

According to a fourth aspect of the present invention, there is provided a pattern forming method of forming a predetermined pattern in a predetermined area of a surface of an elongated sheet material, the pattern forming method including: restraining at least two positions of the sheet material in the longitudinal direction so as to apply a first tension to the predetermined area in the longitudinal direction; restraining both sides of the sheet material in the width direction intersecting the longitudinal direction of the sheet material so as to apply a second tension to the predetermined area in the width direction; allowing a rear surface portion corresponding to the predetermined area of the sheet material to change in accordance with a flat reference surface in the state where the first and second tensions are applied to the predetermined area; and illuminating an energy beam corresponding to the pattern to the predetermined area of the flattened sheet material.

Accordingly, even in the case of the sheet material becoming contracted by, for example, heat generated during a treatment of a process, it is possible to perform the exposure with high precision.

According to a fifth aspect of the present invention, there is provided a device manufacturing method including: forming a pattern on an elongated sheet material by using the pattern forming method according to the present invention; and performing a process on the sheet material having the pattern formed thereon.

According to a sixth aspect of the present invention, there is provided a pattern forming device for forming a predetermined pattern in a predetermined area of a surface of an elongated sheet material, the pattern forming device including: a first tension applying device which restrains at least two positions of the sheet material in the longitudinal direction so as to apply a first tension to the predetermined area in the longitudinal direction; a second tension applying device which restrains both sides of the sheet material in the width direction intersecting the longitudinal direction of the sheet material so as to apply a second tension to the predetermined area in the width direction; a flattening device which includes a reference surface member having a flat reference surface, and allows a rear surface portion corresponding to the predetermined area of the sheet material to change in accordance with the reference surface in the state where the first and second tensions are applied to the predetermined area; and an illumination device which illuminates an energy beam corresponding to the pattern to the predetermined area of the flattened sheet material.

Accordingly, the first tension applying device restrains at least two positions of the sheet material in the longitudinal direction so as to apply the first tension to the predetermined area in the longitudinal direction, and the second tension applying device restrains both sides of the sheet material in the width direction so as to apply the second tension to the predetermined area in the width direction. Then, in the state where the first and second tensions are applied to the predetermined area of the sheet material, the flattening device allows the rear surface portion corresponding to the predetermined area of the sheet material to change in accordance with the flat reference surface of the reference surface member. Then, the illumination device illuminates the energy beam corresponding to the predetermined pattern to the predetermined area of the flattened sheet material, so that the sheet material is exposed and a pattern is formed thereon. Accordingly, even in the case of the sheet material becoming contracted by, for example, heat generated during a treatment of a process, it is possible to perform the exposure with high precision.

According to a seventh aspect of the present invention, there is provided a device manufacturing method including: forming a pattern on an elongated sheet material by using the pattern forming device according to the present invention; and performing a process on the sheet material having the pattern formed thereon.

BRIEF DESCRIPTION OF THE DRAWINGS

FIG. 8 is a diagram showing an example of an arrangement of alignment marks (positioning marks) attached to each separate area on the sheet S.

FIG. 26 is a plan view showing a stage device and a sheet transporting system provided in the exposure device of FIG. 21.

FIG. 28 is a diagram showing an example of an arrangement of alignment marks (positioning marks) attached to each separate area on the sheet S.

DESCRIPTION OF EMBODIMENTS

First Embodiment

Hereinafter, first embodiment of the present invention will be described with reference to FIGS. 1 to 19.

Figure 1:
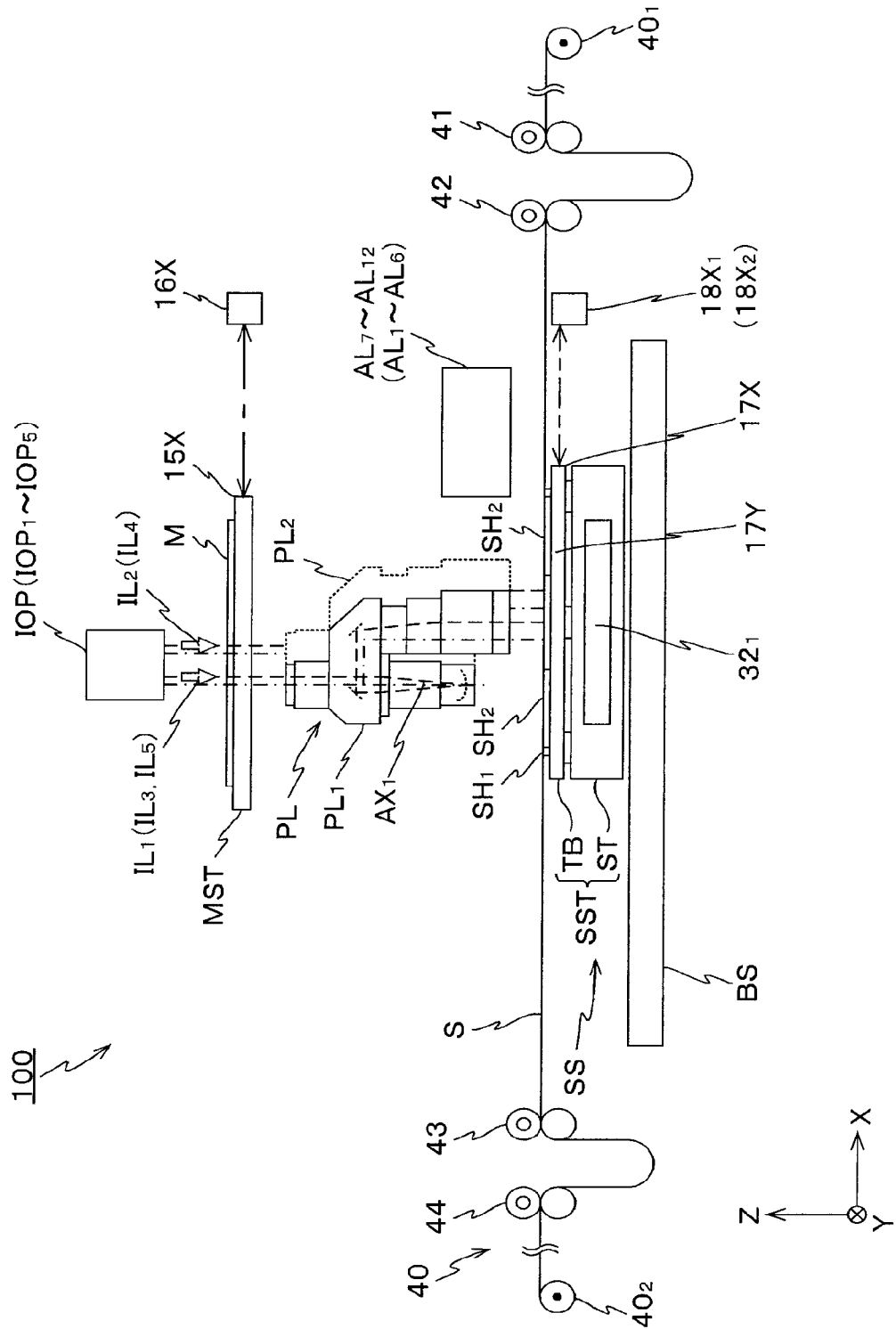
FIG. 1 is a diagram showing a schematic configuration of an exposure device according to a first embodiment.

FIG. 1 shows a schematic configuration of an exposure device 100 according to a first embodiment. The exposure device 100 is a multi-lens type projection exposure device, that is, a so-called scanner in which a flexible sheet or film (hereinafter, totally referred to as a sheet) is an exposure target object. In the embodiment, as an example, a sheet having a thickness of about 100 μm is used.

The exposure device 100 includes an illumination system IOP, a mask stage MST which holds a mask M, a projection optical system PL which projects an image of a pattern formed on the mask M onto a sheet S, a stage device SS which includes a sheet stage (hereinafter, simply referred to as a stage) SST for holding the sheet S, a sheet transporting system 40 which transports the sheet S, a control system thereof, and the like.

In addition, the sheet S used in the exposure device 100 of the embodiment is a continuously elongated sheet. The sheet S is wound in a roll shape, and is set in a roller $40_1$. As described below, the sheet S is extracted from the roller $40_1$ by (transportation roller portions 41 to 44 constituting) the sheet transporting system 40, passes through an area directly below of the projection optical system PL, and is wound on a winding roller $40_2$. In addition, a photosensitizing agent (resist) is coated on the surface of the sheet S. In the embodiment, as an example, the sheet S is extracted from the roller $40_1$ and is wound on the winding roller $40_2$, but the present invention is not limited thereto. A sheet extracted from a resist coating device for performing a treatment before an exposure, for example, a resist coating treatment and transported to a developing device for performing a treatment after an exposure, for example, a developing treatment can be subjected to an exposure by the exposure device 100.

Hereinafter, a vertical direction (the up/down direction of FIG. 1) parallel to the light axis (here, the middle portion between both portions is excluded) of the object surface side and the upper surface side of the projection optical system PL is set to the Z-axis direction, a scanning direction (the left/right direction of FIG. 1) in which the mask M and the sheet S are relatively scanned by the projection optical system PL within a plane perpendicular to the Z-axis direction is set to the X-axis direction, and a direction perpendicular to the Z-axis direction and the X-axis direction is set to the Y-axis direction. Then, the rotation (inclination) directions of the X, Y, and Z-axis directions are respectively described as θx, θy, and θz directions.

The illumination system IOP includes a plurality of (herein, five) illumination system modules (hereinafter, simply referred to as illumination systems) $IOP_1$ to $IOP_5$. Each of the illumination systems $IOP_1$ to $IOP_5$ includes an ultra high pressure mercury lamp (light source) which emits UV light, an oval mirror which collects the UV light from the light source, a wavelength selection filter which is disposed on the light path of the collected UV light, an optical integrator, and an illumination optical system (are not shown) which includes a visual field diaphragm. The emission line, for example, a line i (having a wavelength of 365 nm), a line g (having a wavelength of 436 nm), or a line h (having a wavelength of 405 nm) from the UV light is extracted as illumination light $IL_1$ to $IL_5$ through the wavelength selection filter. Each of the extracted illumination light $IL_1$ to $IL_5$ is emitted (toward the mask M) on the outside of the illumination system IOP ($IOP_1$ to $IOP_5$) along each of the light axes $AX_1$ to $AX_5$ (refer to FIG. 2).

Figure 2:
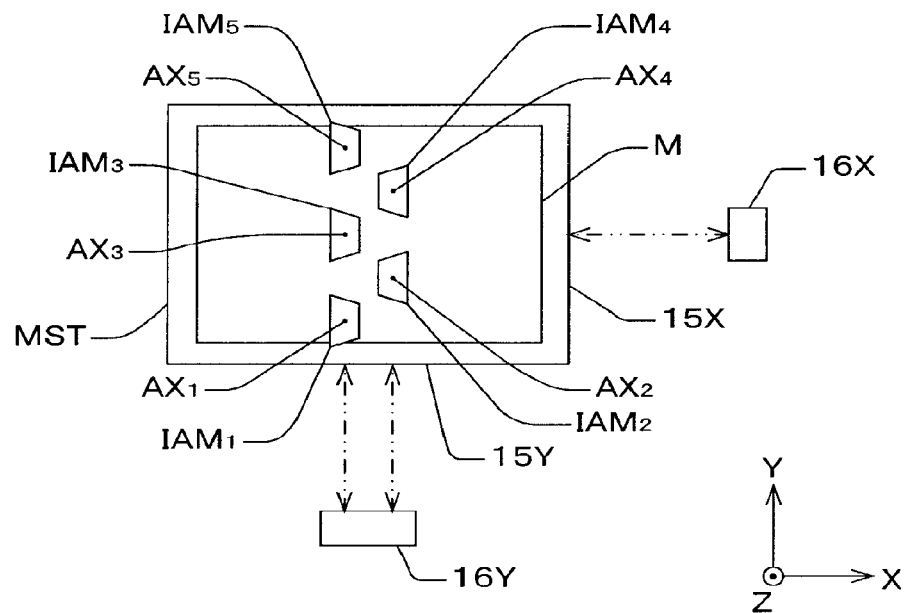
FIG. 2 is a plan view showing an arrangement of an illumination area and a schematic configuration of a mask stage provided in the exposure device of FIG. 1.

In addition, as shown in FIG. 2, the light axes $AX_1$, $AX_3$, and $AX_5$ are arranged at a predetermined interval in the Y-axis direction within the XY plane (the pattern surface of the mask M). Further, the light axes $AX_2$ and $AX_4$ are respectively disposed between the light axes $AX_1$ and $AX_3$ and between the light axes $AX_3$ and $AX_5$ with a predetermined distance therebetween from the light axes $AX_1$, $AX_3$, and $AX_5$ to the +X side. That is, the light axes $AX_1$ to $AX_5$ are arranged in a zigzag shape within the XY plane.

The illumination systems $IOP_1$ to $IOP_5$ illuminate illumination light $IL_1$ to $IL_5$ to illumination areas $IAM_1$ to $IAM_5$ on the mask M along the light axes $AX_1$ to $AX_5$ with uniform intensity of illumination. Each of the illumination areas has an isosceles trapezoid shape stipulated by the visual field diaphragm (not shown) within the illumination optical system. In addition, the detailed configuration of the illumination system IOP ($IOP_1$ to $IOP_5$) is disclosed in, for example, the specification of U.S. Pat. No. 6,552,775.

As shown in FIG. 1, the mask stage MST is disposed at the low position (−Z side) of the illumination system IOP. The rectangular mask M is fixed onto the mask stage MST by, for example, vacuum adsorption, where the mask indicates that a rectangular pattern area is formed in the pattern surface (−Z side surface). The mask stage MST can be minutely driven within the XY plane by a mask stage driving system MSD (not shown in FIG. 1, refer to FIG. 9) including a linear motor and the like, and can be driven at a predetermined scanning speed of a predetermined stroke in the scanning direction (X-axis direction).

Positional information within the XY plane of the mask stage MST is constantly measured while having, for example, a resolution of about 0.25 to 1 nm by laser interferometers (hereinafter, simply referred to as interferometers) 16X and 16Y constituting a part of a mask stage interferometer system 16 (refer to FIG. 9). As shown in FIG. 2, the +X side surface and the −Y side surface of the mask stage MST are subjected to mirror-like finishing so as to have reflection surfaces 15X and 15Y. The interferometer 16X measures the rotation in the direction θz and the position (X position) in the X-axis direction of the mask stage MST by emitting a plurality of length measurement beams to the reflection surface 15X along the light path parallel to the X axis and receiving the reflected beams from the reflection surfaces 15X. The substantial length measurement axis of the interferometer 16X is an axis parallel to the X axis perpendicular to the light axis $AX_3$. The interferometer 16Y measures the position (Y position) in the Y-axis direction of the mask stage MST by emitting two length measurement beams to the reflection surface 15Y along the light path parallel to the Y axis perpendicular to the light axes $AX_1$ and $AX_2$ and receiving the reflected beams from the reflection surface 15Y. In addition, instead of the above-described reflection surfaces 15X and 15Y, a moving mirror formed by a plane mirror can be fixed to the mask stage MST.

Figure 9:
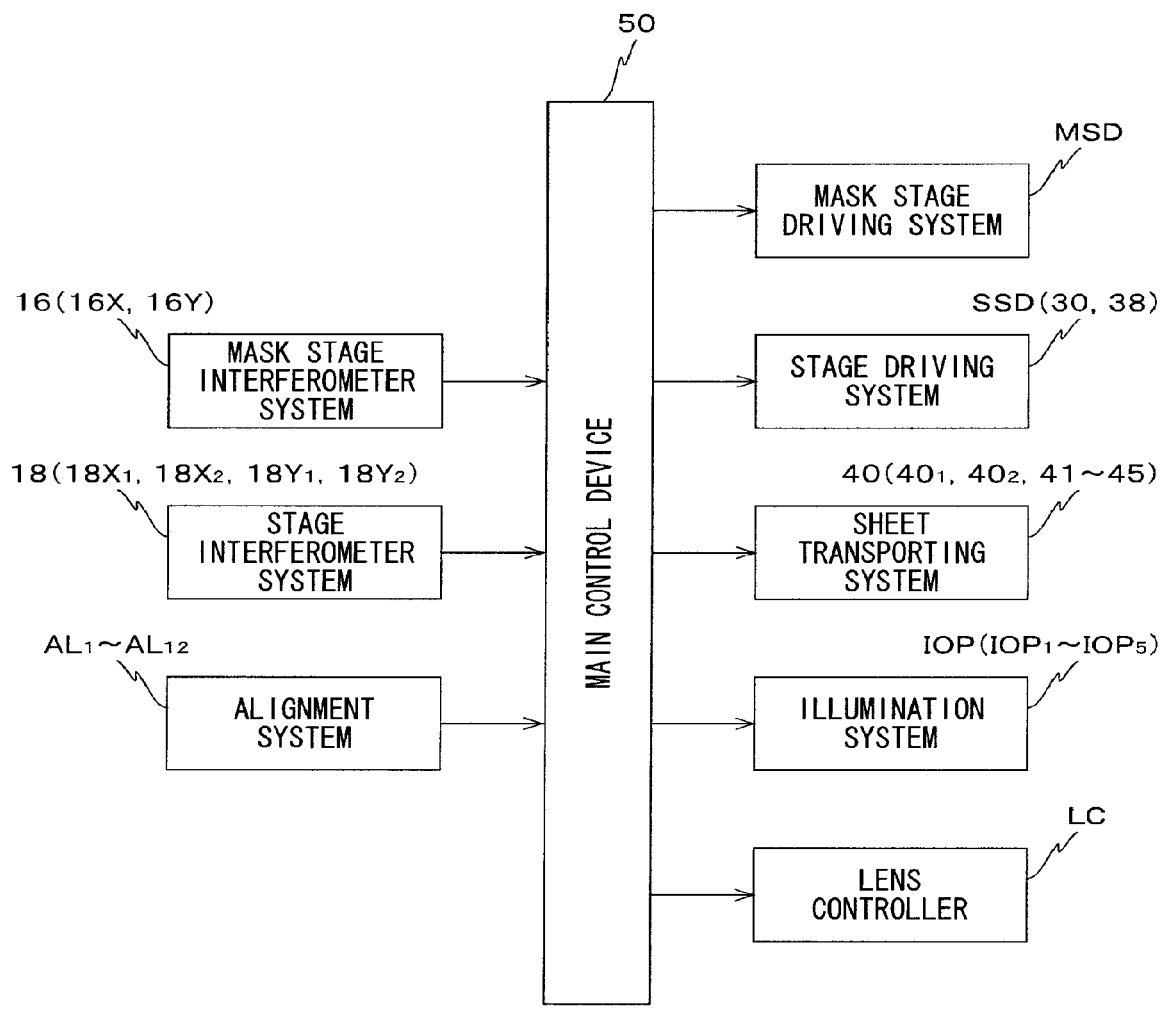
FIG. 9 is a block diagram showing an input/output relationship of a main control device provided in the exposure device of FIG. 1.

The measurement information of the interferometers 16X and 16Y is supplied to a main control device 50 (refer to FIG. 9). The main control device 50 controls the mask stage MST through the mask stage driving system MSD on the basis of the measurement information (the positional information of the mask stage MST) of the interferometers 16X and 16Y.

Figure 3:
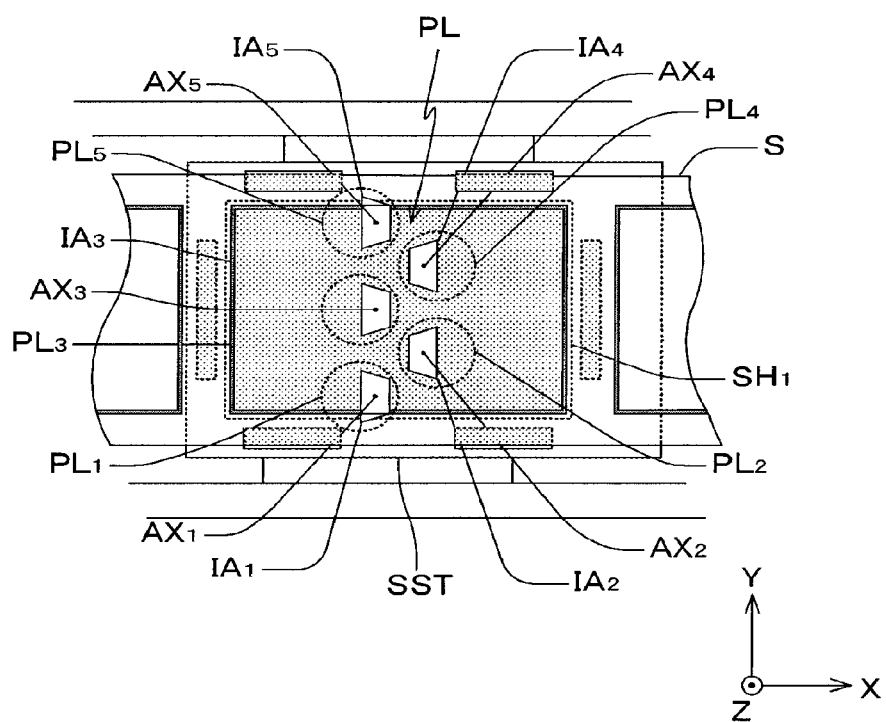
FIG. 3 is a plan view showing an arrangement of a projection area (exposure area) on a sheet and a projection optical system provided in the exposure device of FIG. 1.

As shown in FIG. 1, the projection optical system PL is disposed at the low position (−Z side) of the mask stage MST. For example, as shown in FIG. 3, the projection optical system PL according to the embodiment includes five projection optical system modules (hereinafter, simply referred to as projection optical systems) $PL_1$ to $PL_5$ which are disposed in a zigzag shape so as to correspond to arrangement of the light axes $AX_1$ to $AX_5$. In FIG. 1, the projection optical systems $PL_3$, $PL_5$, and $PL_4$ are disposed backward the projection optical systems $PL_1$ and $PL_2$ in this paper plane. As each of the projection optical systems $PL_1$ to $PL_5$, for example, a both-side telecentric reflection-refraction system is used which forms an erect image on an image surface at the same magnification.

By means of the arrangement of the above-described projection optical systems $PL_1$ to $PL_4$ (the light axes $AX_1$ to $AX_5$), the projection areas $IA_1$ to $IA_5$ where the image of the pattern is projected by the projection optical systems $PL_1$ to $PL_5$ on the sheet S are arranged in a zigzag shape as in the illumination areas $IAM_1$ to $IAM_5$. Here, the projection areas $IA_1$ to $IA_5$ have an isosceles trapezoid shape as in the illumination areas $IAM_1$ to $IAM_5$. By means of the arrangement and the shape of the projection areas $IA_1$ to $IA_5$, the mask M and the sheet S are driven in a synchronized manner in the scanning direction (X-axis direction) while the image (the partial image) of the pattern within the illumination areas $IAM_1$ to $IAM_5$ on the mask M is projected onto the projection areas $IA_1$ to $IA_5$ on the sheet S through the projection optical systems $PL_1$ to $PL_5$, so that the partial images of the pattern projected onto the sheet S are synthesized as one image (synthesized image) which is the same as the pattern formed in the mask M. Accordingly, by means of the scanning exposure, the pattern of the mask M is transferred onto (one short area (separate area) $SA_i$) the sheet S through the projection optical systems $PL_1$ to $PL_5$. In addition, the detail of the scanning exposure will be described later.

In the embodiment, since the optical system for projecting the erected image at the same magnification is adopted as the projection optical systems $PL_1$ to $PL_5$, the shape and the arrangement (positional relationship) of the projection areas $IA_1$ to $IA_5$ are the same as the shape and the arrangement (positional relationship) of the illumination areas $IAM_1$ to $IAM_5$. The detailed configuration of the projection optical system PL according to the embodiment is disclosed in, for example, U.S. Pat. No. 6,552,775 and the like.

The exposure device 100 includes a lens controller LC (refer to FIG. 9) which corrects a distortion (the positional deviation and/or the shape error) of the image projected onto the sheet S by the projection optical systems $PL_1$ to $PL_5$. The lens controller LC drives at least a part of an optical element group (lens group) constituting each of the projection optical systems $PL_1$ to $PL_5$ in a direction parallel to the light axes $AX_1$ to $AX_5$ and a direction inclined relative to the XY plane perpendicular to the light axes $AX_1$ to $AX_5$. Accordingly, the distortion (the shift, the rotation, the magnification (scaling), and the like) of the partial image of the pattern projected onto the projection areas $IA_1$ to $IA_5$ of the sheet S is corrected. In addition, the lens controller LC can change a pressure of a gas inside a hermetic room formed inside the projection optical systems $PL_1$ to $PL_5$ or change the wavelength of the illumination light instead of or in addition to driving the optical element group.

As shown in FIG. 1, the stage device SS is disposed at the low position (−Z side) of the projection optical system PL ($PL_1$ to $PL_5$). The stage device SS includes a base member BS which is supported on a bottom surface by an anti-vibration mechanism (not shown) so as to be substantially horizontal, a stage SST which moves and supports the sheet S on the base member BS, a driving system SSD (not shown in FIG. 1, refer to FIG. 9) which drives the stage SST, a stage interferometer system 18 (refer to FIG. 9) which measures positional information of the stage SST, and the like. In addition, in FIG. 1, the sheet S is adsorbed and held onto the stage SST.

As shown in FIG. 1, the stage SST includes a stage body ST which is supported on the base member BS in an uplifted state by a plurality of non-contact bearings (for example, air bearings (not shown)) provided in the bottom surface, a Z-leveling device 38 (refer to FIG. 4A) which is disposed on the stage body ST, and a table TB which is supported at three points by the Z-leveling device 38.

Figure 4A:
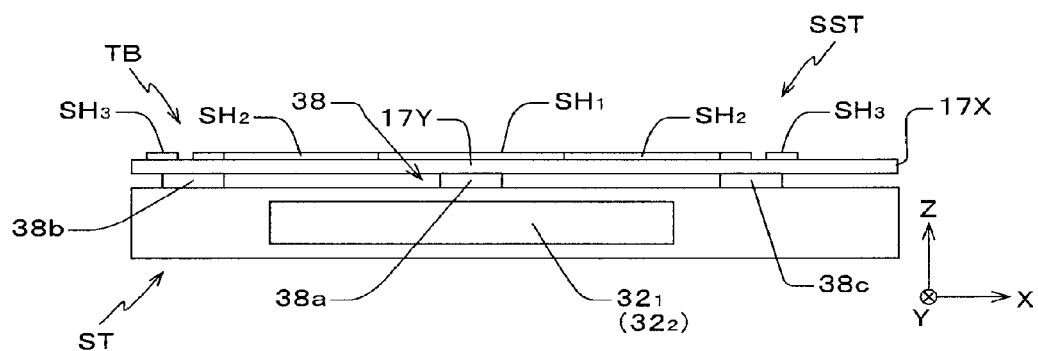
FIG. 4A is a side view showing a schematic configuration of the stage.
Figure 4B:
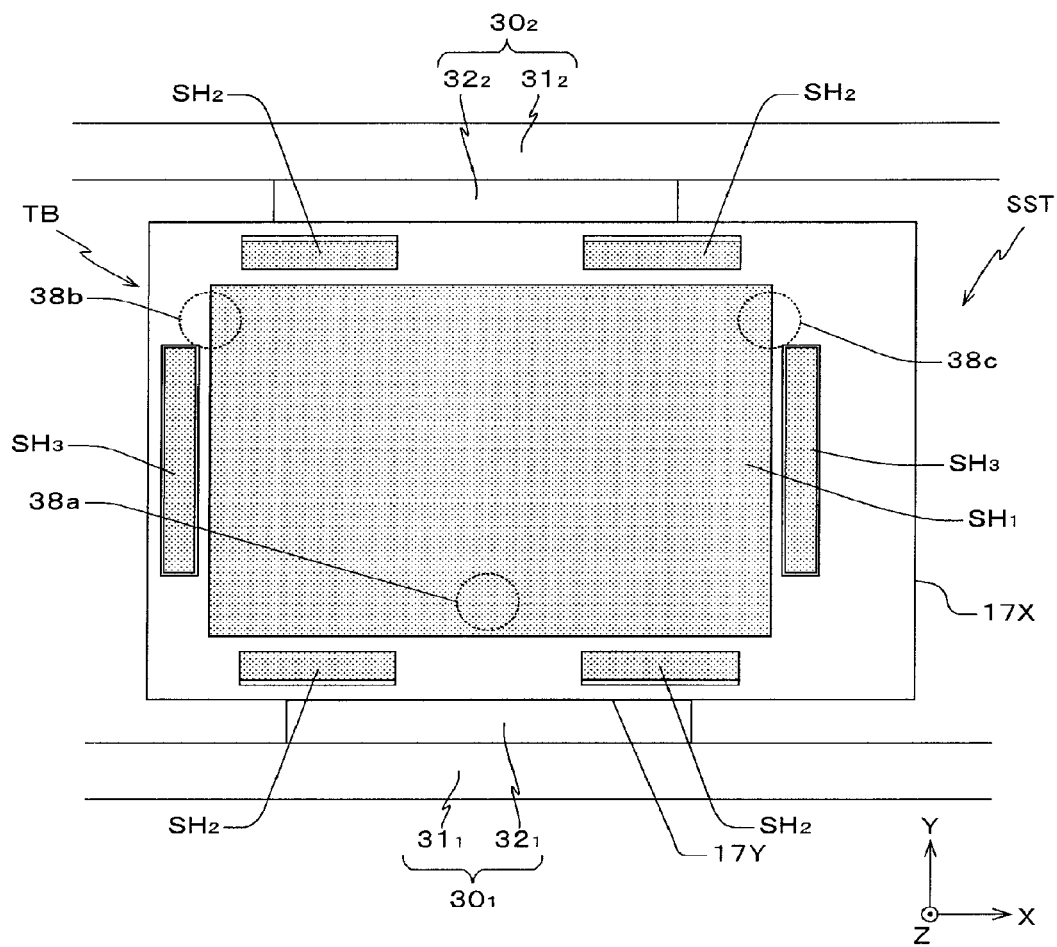
FIG. 4B is a plan view showing a schematic configuration thereof.

As shown in FIG. 4B, the Z-leveling device 38 includes three Z driving mechanisms 38a, 38b, and 38c which are disposed at three points not existing in one line on the stage body ST and including, for example, a voice coil motor and the like. By means of the Z-leveling device 38, it is possible to minutely drive the table TB on the stage body ST in a direction of three degrees of freedom of the Z-axis direction, the θx direction, and the θy direction.

The stage SST (stage body ST) is scan-driven on the base member BS by the stage driving system SSD in the X-axis direction (scanning direction), and is also minutely driven in the Y-axis direction and the θz direction. The stage driving system SSD includes a minute movement device (not shown) which minutely drives the stage SST in the Y-axis direction, and a rough movement device 30 (refer to FIG. 9) which drives the minute movement device (not shown) in the scanning direction (X-axis direction).

Figure 6:
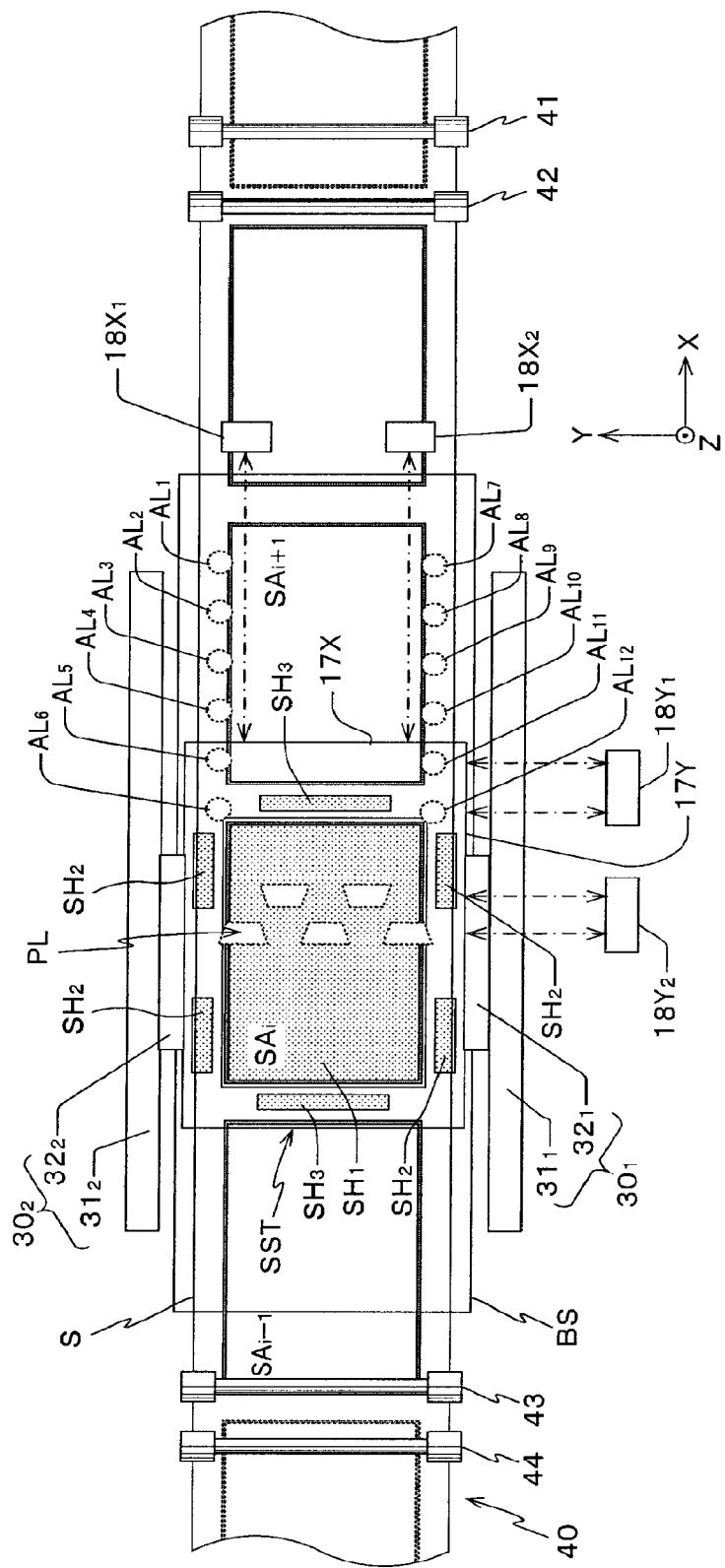
FIG. 6 is a plan view showing a stage device and a sheet transporting system provided in the exposure device of FIG. 1.

As shown in FIGS. 4B and 6, the rough movement device 30 includes a pair of linear motors $30_1$ and $30_2$ respectively provided in one side and the other side of the Y-axis direction of the stage SST. The one linear motor $30_1$ includes a fixed portion $31_1$ which is disposed on the −Y side of the base member BS and extends in the X-axis direction, and a movable portion $32_1$ which is attached to the fixed portion $31_1$ so as to be movable along the longitudinal direction. The other linear motor $30_2$ includes a fixed portion $31_2$ which is disposed on the +Y side of the base member BS and extends in the X-axis direction, and a movable portion $32_2$ which is attached to the fixed portion $31_2$ so as to be movable along the longitudinal direction. Each of the fixed portions $31_1$ and $31_2$ includes a plurality of magnets (or coils) arranged along the X-axis direction, and each of the movable portions $32_1$ and $32_2$ includes coils (or magnets). The movable portions $32_1$ and $32_2$ are respectively fixed to the −Y side surface and the +Y side surface of the stage body ST through a minute movement device (not shown) which minutely moves them in the Y-axis direction. In addition, the stage body ST can be minutely driven in the θz direction by generating different thrust forces in the linear motors $30_1$ and $30_2$. In addition, a stage driving system can be configured which two-dimensionally moves the stage SST along the upper surface (guide surface) of the base member BS by using a planar motor of a Lorentz electromagnetic driving type, a planar motor of a variable electromagnetic resistance driving type, a planar motor of a magnetic suspension type, and the like disclosed in, for example, the specification of U.S. Pat. No. 5,196,745 instead of the rough movement device 30 and the minute movement device.

The table TB is driven on the base member BS by the stage driving system SSD (refer to FIG. 9) including the rough movement device 30, the minute movement device (not shown), and the Z-leveling device 38 so as to have six degrees of freedom in the X-axis direction, the Y-axis direction, the Z-axis direction, the θx direction, the θy direction, and the θz direction.

As shown in FIGS. 4A and 4B, a sheet holder $SH_1$ is provided at the center portion of the upper surface of the table TB so as to adsorb and hold the sheet S. The sheet holder $SH_1$ is substantially parallel to the XY plane, and includes a rectangular holding surface which is slightly larger than the separate area arranged on the sheet S, thereby flatly holding the sheet S on the holding surface. Here, in order to adsorb and hold the sheet S, as the sheet holder $SH_1$, a pin chuck holder is adopted in which the arrangement interval (pitch) of the pins is sufficiently small, and the height of the pin is low so as to be, for example, about 200 μm.

In addition, six auxiliary sheet holders $SH_2$ and $SH_3$ are provided on the upper surface of the table TB so as to adsorb and hold the rear surface in the periphery of the separate areas arranged on the sheet S. In detail, the ±Y sides of the sheet holder $SH_1$ are provided with two auxiliary sheet holders $SH_2$ which are thin and long in the X-axis direction and are distant from each other by a predetermined distance in the X-axis direction. In addition, the ±X sides of the sheet holder $SH_1$ are provided with one auxiliary sheet holder $SH_3$ which is thin and long in the Y-axis direction. Each of the auxiliary sheet holders $SH_2$ and $SH_3$ includes a rectangular holding surface, and the holding surface can be minutely driven in a direction perpendicular to the longitudinal direction and the Z-axis direction by a holder driving device provided in the table TB.

Figure 5A:
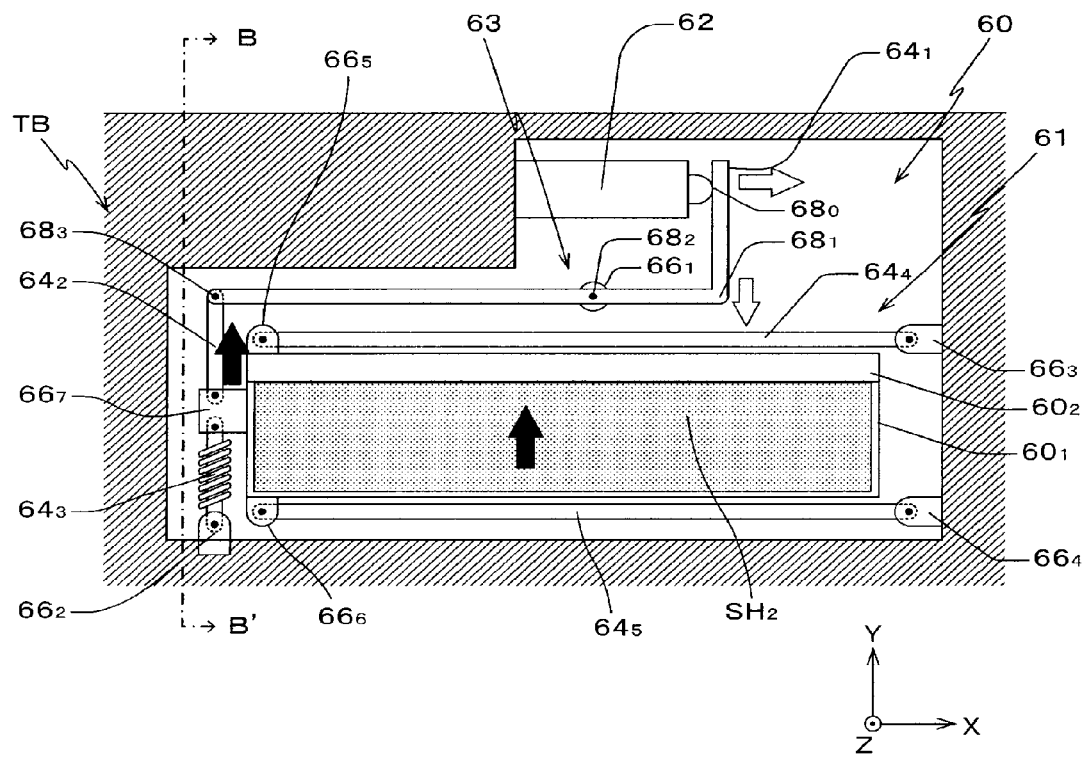
FIG. 5A is a sectional view of a table in the vicinity of a holder driving device and an auxiliary sheet holder.
Figure 5B:
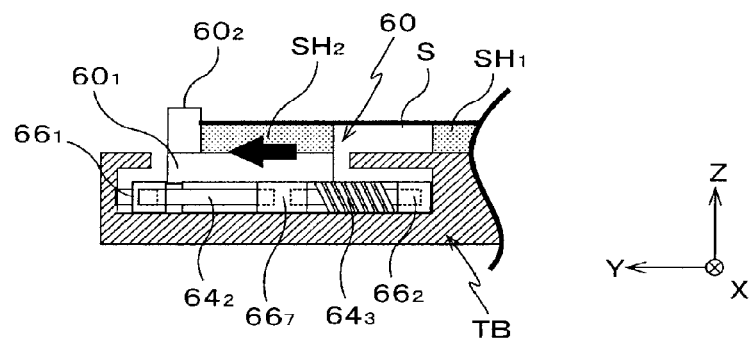
FIG. 5B is a sectional view taken along the line B-B of FIG. 5A.

FIG. 5A is a plan view showing a configuration of a holder driving device 60 provided inside the table TB, and FIG. 5B is a sectional view taken along the line B-B of FIG. 5A. Here, as an example, the holder driving device 60 is shown which drives the auxiliary sheet holder $SH_2$ located at the +Y-side end and the +X-side end of the table TB.

The holder driving device 60 includes a Y driving unit which includes a parallel link mechanism 61 as one type of a four-joint link mechanism provided inside a hollow portion provided in the table TB and a driving mechanism 63 driving (the driving joint of) the parallel link mechanism 61 and drives the auxiliary sheet holder $SH_2$ in the Y-axis direction, and a Z driving unit (not shown) which includes, for example, a driving element, a voice coil motor, and the like supporting a rectangular base $60_1$ having the auxiliary sheet holder $SH_2$ fixed to the upper surface thereof on the bottom surface of the table TB and minutely driving that in the Z-axis direction. One end (−X end) of the base $60_1$ is integrated with a link (hereinafter, conveniently referred to as a parallel movement link) which is located on the opposite side of the fixed link of the parallel link mechanism 61.

In detail, the parallel link mechanism 61 includes a pair of oscillation links $64_4$ and $64_5$ of which one end is respectively connected to a pair of link support members $66_3$ and $66_4$ fixed to the +X side wall of the hollow portion of the table TB and the other ends are respectively connected to one end $66_5$ and the other end $66_6$ of the above-described parallel movement link. In this case, the link support members $66_3$ and $66_4$ are fixed to the table TB to thereby configure a fixed link. The fixed link, the oscillation links $64_4$ and $64_5$, and the parallel link are adjacent links and configure a revolute pair.

The driving mechanism 63 includes an actuator 62 of which one end is fixed to a part of the side wall of the hollow portion of the table TB, an L-shaped lever link $64_1$ of which one end (driving point $68_0$) comes into contact with the actuator 62 with pressure and a support point $68_2$ of the middle portion is rotatably supported to a fixator $66_1$ fixed to the bottom wall of the table TB, and a movable link $64_2$ of which one end is connected to the other end (action point $68_3$) of the lever link $64_1$ and the other end is connected to an attachment member $66_7$ fixed to a part of the above-described parallel movement link. The lever link $64_1$ and the movable link $64_2$ configure a revolute pair, and the movable link $64_2$ and the attachment member $66_7$ configure a revolute pair.

In addition, the attachment member $66_7$ is connected to an attachment member $66_2$ which is fixed to a part of the side wall of the −Y side wall of the hollow portion of the table TB through a spring member (pulling spring) $64_3$. In this case, the attachment member $66_7$ and the spring member (pulling spring) $64_3$ form a revolute pair, and the spring member (pulling spring) $64_3$ and the attachment member $66_2$ form a revolute pair.

In the Y driving unit having the above-described configuration, one end (driving point $68_0$) of the lever link $64_1$ is constantly pressed and contacted by the actuator 62 by the spring member (pulling spring) $64_3$. In addition, when the actuator 62 drives one end (driving point $68_0$) of the lever link $64_1$ in a direction (+X-axis direction) depicted by the white arrow of FIG. 5A while resisting the pressing and contacting force of the spring member $64_3$, the attachment member $66_7$ is driven in a direction (+Y-axis direction) depicted by the black arrow through the movable link $64_2$. That is, the auxiliary sheet holder $SH_2$ is driven in the +Y-axis direction together with the base $60_1$. In this case, the movement amount of the auxiliary sheet holder $SH_2$ is determined by a force generated by the actuator 62. In addition, as described above, the auxiliary sheet holder $SH_2$ is driven in the Z-axis direction together with the base $60_1$ by the Z driving unit disposed below the base $60_1$. However, in the below description, it will be described that the auxiliary sheet holder $SH_2$ is driven in the Z-axis direction by the base $60_1$. That is, the base $60_1$ is described as the Z driving unit.

The driving devices for the auxiliary sheet holder $SH_2$ provided in the +X-side end and the −Y-side end of the table TB have the similar configuration as the above-described holder driving device 60 being symmetric in the X axis. In addition, the driving devices for the pair of auxiliary sheet holders $SH_3$ provided in ±X sides of the table TB have the similar configuration as the above-described holder driving device 60 with deferent direction (rotated by ±90°).

A length between a force point $68_1$ and a support point $68_2$ of the lever link $64_1$ and a length between a support point $68_2$ and an operation point $68_3$ are, for example, 1 to 3. For this reason, when one end of the lever link $64_1$ is driven at the driving point $68_0$ in the +X-axis direction by 10 μm by the actuator 62 of the holder driving device 60 (driving mechanism 63), the bending portion (force point $68_1$) of the lever link $64_1$ is driven in the −Y-axis direction by 10 μm, and hence the other end (action point $68_3$) of the lever link $64_1$ is driven in the +Y-axis direction by 30 μm. Accordingly, it is possible to drive the auxiliary sheet holder $SH_2$ in the +Y-axis direction by 30 μm by using the holder driving device 60 (driving mechanism 63). In addition, in the state where both ends of the sheet S in the Y-axis direction are held by the pair of auxiliary sheet holders $SH_2$ disposed on the table TB while being distant from each other in the Y-axis direction, when the auxiliary sheet holders $SH_2$ are driven in a direction opposite to each other (a direction moving away from each other), it is possible to stretch the sheet S by 60 μm at maximum. In the same way, it is possible to drive two auxiliary sheet holders $SH_3$ in the X-axis direction by 30 μm. Accordingly, in the state where the rear surface portion on the outside of both side separate areas in the X-axis direction of the separate areas of the sheet S are held by two auxiliary sheet holders $SH_3$, when the two auxiliary sheet holders $SH_3$ are driven in a direction opposite to each other (a direction moving away from each other), it is possible to stretch the sheet S in the X-axis direction by 60 μm at maximum.

The driving devices for the auxiliary sheet holders $SH_2$ provided in the +Y side, the −Y side, and the −X-side end of the table TB have the similar configuration as the above-described holder driving device 60 being symmetric in the Y axis.

As described below, the auxiliary sheet holders $SH_2$ and $SH_3$ are used to assist the sheet holder $SH_1$ when the sheet S is flatly held by the sheet holder $SH_1$. In addition, in the +Y end on the base $60_1$, a rectangular-tray-shaped positioning member $60_2$ is fixed to the auxiliary sheet holder $SH_2$ while coming into contact therewith. The positioning member $60_2$ has a role of positioning the sheet S in the Y-axis direction by pressing the +Y end (or −Y end) of the sheet S when the sheet S is adsorbed and held by the holding surface of the auxiliary sheet holder $SH_2$.

As shown in FIG. 4B, the +X side surface and the −Y side surface of the table TB are subjected to mirror-like finishing so as to have reflection surfaces 17X and 17Y. The reflection surfaces 17X and 17Y are used to measure the position of the stage SST by using a stage interferometer system to be described later. In addition, instead of the above-described reflection surface 17Y, a moving mirror formed by a plane mirror can be fixed to the table TB. Further, instead of the reflection surface 17X, a moving mirror formed by a retro-reflector or a plane mirror can be fixed to the table TB.

As shown in FIG. 6, the stage interferometer system 18 (refer to FIG. 9) includes interferometers $18X_1$, $18X_2$, $18Y_1$, and $18Y_2$, and measures constantly the positional information (including the rotation information in the θz direction) within the XY plane of the stage SST (table TB) while having, for example, a resolution of about 0.25 to 1 nm.

The interferometers $18X_1$, $18X_2$, and $18Y_1$, $18Y_2$ are disposed on the +X side and the −Y side of the projection optical system PL so as to face the reflection surfaces 17X and 17Y of the table TB.

The interferometers $18X_1$ and $18X_2$ measure the X position of the stage SST by emitting a length measurement beam parallel to the X axis to the reflection surface 17X of the table TB and receiving the reflected beam from the reflection surface 17X. The interferometers $18Y_1$ and $18Y_2$ measure the Y position of the stage SST by emitting two length measurement beams parallel to the Y axis to the reflection surface 17Y and receiving the reflected beam from the reflection surface 17Y. Here, one of two length measurement beams of the interferometer $18Y_2$ is emitted to the reflection surface 17Y along the light path parallel to the Y axis perpendicular to the light axes $AX_1$, $AX_3$, and $AX_5$, and the other thereof is emitted to the reflection surface 17Y along the light path parallel to the Y axis perpendicular to the light axes $AX_2$ and $AX_4$. In addition, the two light measurement beams of the interferometer $18Y_1$ are emitted to the reflection surface 17Y along two light paths parallel to the Y axis passing the detection center of each of alignment systems $AL_{11}$ and $AL_{12}$ to be described later.

The measurement information of the stage interferometer system 18 (interferometers $18X_1$, $18X_2$, $18Y_1$, and $18Y_2$) is supplied to the main control device 50 (refer to FIG. 9). In addition, when the stage SST is located on the base member BS, at least one of the length measurement beams of the interferometers $18Y_1$ and $18Y_2$ is emitted to the reflection surface 17Y of the stage SST regardless of the X position thereof. Accordingly, the main control device 50 uses any one of the measurement information of the interferometers $18Y_1$ and $18Y_2$ in accordance with the X position of the stage SST. In addition, the main control device 50 measures the rotation in the θz direction of the stage SST on the basis of the measurement information of the interferometers $18X_1$ and $18X_2$.

In addition, as the interferometers $18X_1$, $18X_2$, $18Y_1$, and $18Y_2$, a multi-axis interferometer which emits a plurality of length measurement beams distant from each other in the Z-axis direction can be used. In this case, the main control device 50 can obtain the inclination information (the pitching amount (the rotation amount θx in the θx direction) and the rolling amount (the rotation amount θy in the θy direction)) with respect to the XY plane in addition to the positional information (rotation information (including yawing amount (the rotation amount θz in the θz direction))) within the XY plane of the stage SST (table TB).

As shown in FIGS. 1 and 6, the sheet transporting system 40 includes four transportation roller portions 41 to 44 which are arranged in the X-axis direction across the projection optical system PL.

As shown in FIGS. 7A to 7G, each of the transportation roller portions 41, 42, 43, and 44 includes a pair of a pressure roller and a driving roller located at the upper and lower positions. In the driving rollers $41_2$, $42_2$, $43_2$, and $44_2$ located at the lower position, both ends thereof are rotatably supported by support members (not shown) so that the upper ends thereof are slightly located at the upper position (+Z side) of the upper surface (the holding surface of the sheet holder $SH_1$) of the stage SST (refer to FIG. 1). The driving rollers $41_2$, $42_2$, $43_2$, and $44_2$ are rotationally driven by a rotation motor (not shown). The pressure rollers $41_1$, $42_1$, $43_1$, and $44_1$ located at the upper position are pressed and contacted by the corresponding driving rollers from the upper side (+Z side) by a spring mechanism (not shown).

Figure 7A:
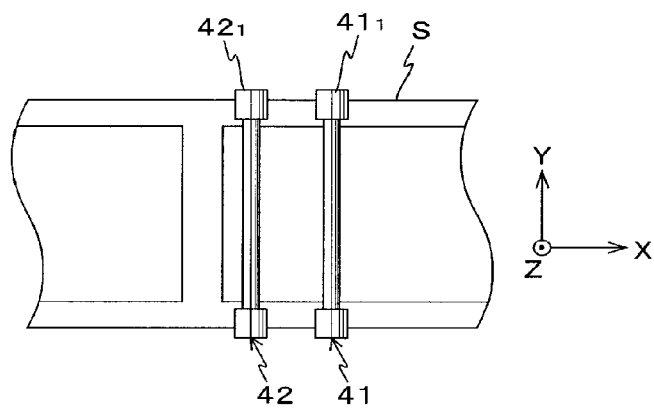
FIG. 7A is a plan view showing the vicinity of transportation roller portions 41 and 42.
Figure 7B:
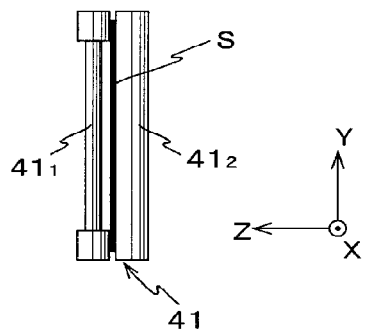
FIG. 7B is a side view showing the transportation roller portion 41.

However, as shown in the transportation roller portion 41 of FIG. 7B, the pressure roller $41_1$ is a stepped cylindrical roller of which a diameter of a portion except for both ends in the longitudinal direction is smaller than those of both ends, and the driving roller $41_2$ is a cylindrical roller which has uniform diameter.

As shown in FIG. 7B by adopting the representative transportation roller portion 41 from the transportation roller portions 41, 42, 43, and 44, the sheet S is sandwiched between the pressure roller (41O and the driving roller ($41_2$), and the pressure roller ($41_1$) does not come into contact with the separate area where the pattern is formed on the surface of the sheet S. In each of the transportation roller portions 41, 42, 43, and 44, it is possible to set a first state where the sheet S can be sandwiched between the pressure roller ($41_1$) and the driving roller ($41_2$) and a second state where the operation of sandwiching the sheet S can be released by separating the pressure roller ($41_1$) from the driving roller ($41_2$) while resisting the pressing force of the spring mechanism. In each of the transportation roller portions 41, 42, 43, and 44, the change between the first state and the second is performed by the main control device 50. In addition, at least a part of the driving rollers can be formed as a stepped cylindrical shape as in the pressure roller $41_1$.

The rotation and the stopping of the driving rollers $41_2$, $42_2$, $43_2$, and $44_2$ are controlled by the main control device 50 together with the rollers $40_1$ and $40_2$. As shown in FIG. 7B by adopting the representative transportation roller portion 41, when the driving roller ($41_2$) is rotated about the axis parallel to the Y axis (and the pressure roller $41_1$ is rotated in the reverse direction) in the first state of the transportation roller portion, the sheet S is transported in the rotation direction.

Figure 7C:
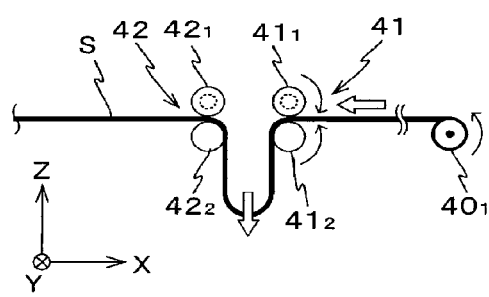
FIGS. 7C to 7G are diagrams illustrating a function of the sheet transporting system.
Figure 7D:
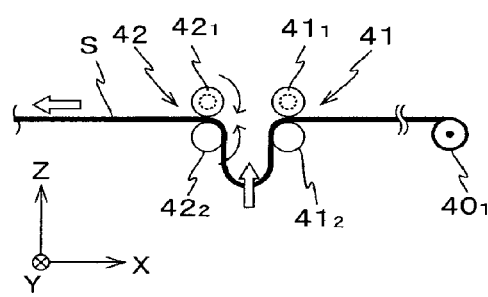

In the sheet transporting system 40, as shown in FIG. 7C, the rollers $41_1$ and $41_2$ of the transportation roller portion 41 are rotated in a direction depicted by the arrow, so that the sheet S is drawn out in the −X-axis direction depicted by the white arrow from the roller $40_1$ and is transported toward the transportation roller portion 42. Here, when the rotation of the rollers $42_1$ and $42_2$ of the transportation roller portion 42 is stopped at a predetermined timing, the sheet S having a predetermined length (a degree corresponding to a distance between the transportation roller portions 42 and 43) is bent in a loop shape between the transportation roller portions 41 and 42. In addition, in the sheet transporting system 40, as shown in FIG. 7D, the rollers $42_1$ and $42_2$ of the transportation roller portion 42 (and the rollers $43_1$ and $43_2$ of the transportation roller portion 43) are rotated in a direction depicted by the arrow in the state where the rotation of each of the rollers $41_1$ and $41_2$ of the transportation roller portion 41 is stopped, so that the sheet S bent in a loop shape is transported in the −X-axis direction depicted by the white arrow toward an area directly below the projection optical system PL.

Figure 7E:
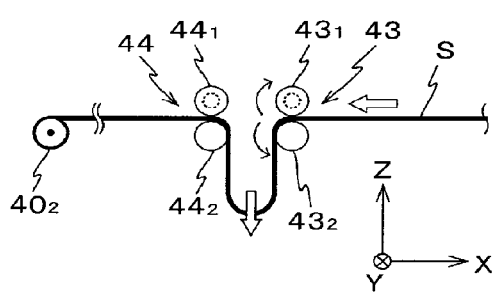
Figure 7F:
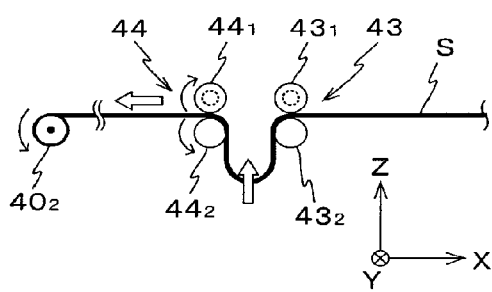

In the sheet transporting system 40, as described above, the sheet S is drawn out from the area directly below the projection optical system PL by means of the rotation and the stopping of each of the rollers of the transportation roller portions 43 and 44. That is, as shown in FIG. 7E, when each of the rollers $43_1$ and $43_2$ of the transportation roller 43 is rotated in a direction depicted by the arrow in the state where the rotation of each of the rollers $44_1$ and $44_2$ of the transportation roller portion 44 is stopped, the sheet S is drawn out to the area directly below the projection optical system PL, and the drawn sheet S is bent in a loop shape between the transportation roller portions 43 and 44. Then, as shown in FIG. 7F, when each of the rollers $44_1$ and $44_2$ of the transportation roller portion 44 is just rotated in a direction depicted by the arrow in the state where the rotation of each of the rollers $43_1$ and $43_2$ of the transportation roller portion 43 is stopped, the sheet S bent in a loop shape is transported to the −X side of the transportation roller portion 44, and is wound on the winding roller $40_2$.

Figure 7G:
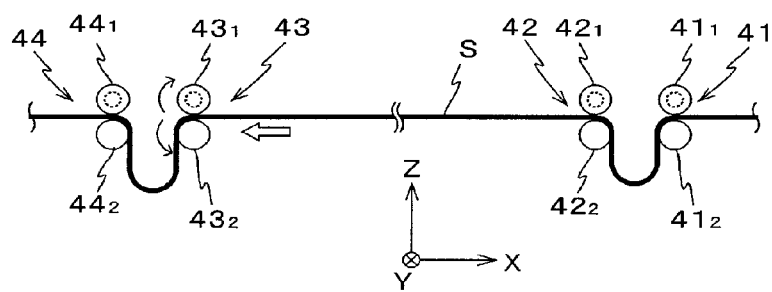

In addition, in the sheet transporting system 40, as shown in FIG. 7G, each of the rollers of the transportation roller portion 43 is rotated in a direction in which the sheet S is transported in the state where the rotation of each of the rollers of the transportation roller portions 41 and 42 is stopped or each of the rollers of the transportation roller portion 42 is reversely rotated in the state where the rotation of each of the rollers of the transportation roller portions 43 and 44 is stopped, so that a predetermined tension is applied to the sheet S in the X-axis direction and the sheet S is stretched between the transportation roller portions 42 and 43. The sheet S stretched in this manner is adsorbed and held by the sheet holder $SH_1$ on the sheet stage SST.

The sheet transporting system 40 further includes a measurement device (not shown) which measures the transportation amount of the sheet S, for example, a rotary encoder and the like which measure the rotation amount of each of the driving rollers $41_2$, $42_2$, $43_2$, and $44_2$.

In addition, the operation of transporting the sheet S, the operation of holding the sheet S on the stage SST, and the like using the sheet transporting system 40 during the exposure process will be described later in detail.

Further, in the exposure device 100 of the embodiment, a plurality of (herein, twelve) off-axis type alignment systems $AL_1$ to $AL_{12}$ is provided so as to detect the alignment marks attached to the separate areas on the sheet S. As shown in FIG. 6, the alignment systems $AL_1$ to $AL_6$ are provided at the position of the +X side of the projection optical system PL along the X axis so as to face the area of the +Y-side end on the outside of the separate area on the sheet S. In addition, as shown in FIG. 6, the alignment systems $AL_7$ to $AL_{12}$ are disposed so as to be symmetric to the alignment systems $AL_1$ to $AL_6$ with respect to the X axis perpendicular to the light axis of the projection area $IA_3$. The alignment systems $AL_7$ to $AL_{12}$ can be disposed so as to face the area of the −Y-side end on the outside of each separate area on the sheet S.

In the embodiment, as an example, as shown in FIG. 8, six alignment marks AM (twelve in total) are provided in each area on the outside of the Y-axis direction of each separate area $SA_1$ on the sheet S, and the alignment systems $AL_1$ to $AL_{12}$ are provided so as to individually and simultaneously detect the twelve alignment marks AM. Accordingly, the present invention is not limited thereto, and when the alignment systems are movable in the X-axis direction, at least one alignment system can be provided instead of the alignment systems $AL_1$ to $AL_6$, and at least one alignment system can be provided instead of the alignment systems $AL_7$ to $AL_{12}$.

As the alignment systems $AL_1$ to $AL_{12}$, an exemplary image process type FIA (Field Image Alignment) system is adopted. The detection result (the image information of the index mark and the detection target mark) of the alignment systems $AL_1$ to $AL_{12}$ are transmitted to the main control device 50 through an alignment signal process system (not shown). In addition, the present invention is not limited to the FIA. An alignment sensor, which emits coherent detection light to the target mark and detects the scattered light or the diffracted light generated from the target mark or detects two beams of diffracted light (for example, the same homogeneous number) generated from the target mark through the interference, can be solely used or appropriately combined.

FIG. 9 is a block diagram showing an input/output relationship of the main control device 50 which generally controls the constituents of the control system of the exposure device 100.

Next, the sequence of the exposure operation for the sheet S using the stage SST in the exposure device 100 of the embodiment will be described with reference to FIGS. 10 to 18. In addition, the operation is described with reference to a plurality of drawings, but the reference numerals can be given or not given to the same constituents for each of the drawings. That is, there is a difference in the mark of the reference numerals in each of the drawings, but the configuration is the same regardless of the mark of the reference numerals of the drawings. The same applies to the drawings which have been used for the description.

Figure 10:
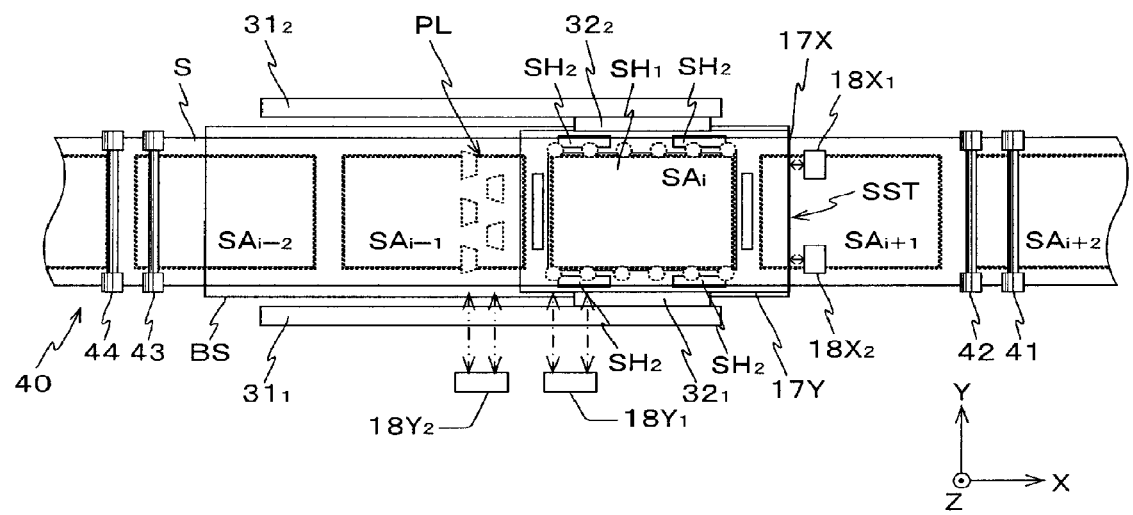
FIG. 10 is a (first) diagram illustrating a sequence of an exposure operation for the sheet in the exposure device of FIG. 1.

FIG. 10 shows a state where the exposure for the first (i−1) number of the separate areas $SA_1$ to $SA_{i-1}$ among the plurality of separate areas arranged on the sheet S is completed, and the exposure for the subsequent separate area $SA_i$ is about to be started. In the state of FIG. 10, the stage SST used for the movement of the sheet S during the exposure for the separate area $SA_i$ stays at the position (standby position) of the +X end on the base member BS.

In addition, since the load of the mask M to the mask stage MST and the mask alignment (the positioning operation of the mask) are generally performed before the start of the exposure for the first separate area $SA_1$ on the sheet S, in the state of FIG. 10, the load of the mask M and the mask alignment are of course completed. In addition, it is assumed that the mask stage MST is moved to the scanning start position (acceleration start position) for the exposure of the separate area $SA_i$.

a. First, the center portion of the sheet S including the separate area $SA_i$ is held onto the stage SST in accordance with the following sequence of a1 to a4.

a1. In detail, for example, as described above with reference to FIG. 7C, the main control device 50 stops the rotation of each of the rollers of the transportation roller portion 42 of the sheet transporting system 40 and then rotates each of the rollers of the transportation roller portion 41 so as to draw out the sheet S from the roller $40_1$. Alternatively, the main control device 50 stops the rotation of each of the rollers of the transportation roller portions 43 and 41 and then reversely rotates the transportation roller portion 42 so as to draw back the sheet S to the area directly below the projection optical system PL. Anyway, the sheet S having a predetermined length is bent in a loop shape between the transportation roller portions 41 and 42. The predetermined length is a length corresponding to a distance between the transportation roller portions 42 and 43.

a2. Next, the main control device 50 controls the sheet transporting system 40 on the basis of the positional information of the stage SST from the stage interferometer 18 ($18X_1$, $18X_2$, $18Y_1$, and $18Y_2$) so as to position the separate area $SA_i$ on the sheet S with respect to (the holding surface of) the sheet holder $SH_1$ of the stage SST. Here, as described above with reference to FIG. 7G the main control device 50 rotates each of the rollers of the transportation roller portion 43 in the state where the rotation of each of the rollers of the transportation roller portions 41, 42, and 44 is stopped or reversely rotates each of the rollers of the transportation roller portion 42 in the state where the rotation of each of the rollers of the transportation roller portions 41, 43, and 44 is stopped, so that the sheet S is applied with a predetermined tension in the X-axis direction so as to be stretched between the transportation roller portions 42 and 43. The main control device 50 further minutely drives the stage SST so as to position (the holding surface of) the sheet holder $SH_1$ to the separate area $SA_i$ on the sheet S. In addition, in this state, a minute space is formed between the sheet S and (the holding surface of) the sheet holder $SH_1$ of the stage SST.

In the state where the sheet S is positioned with respect to the stage SST at the standby position, the alignment marks AM attached to the separate area $SA_i$ are positioned within the detection visual field of each of the alignment systems $AL_1$ to $AL_{12}$.

a3. After the positioning operation, the main control device 50 minutely drives six auxiliary sheet holders $SH_2$ and $SH_3$ on the table TB in the +Z-axis direction through the holder driving device 60 (base $60_1$) while horizontally holding the table TB of the stage SST through the stage driving system SSD (Z-leveling device 38), so that the rear surface of the sheet S of the portion corresponding to the ±Y sides of the separate area $S_1$ is adsorbed and held by using four auxiliary sheet holders $SH_2$, and the rear surface of the sheet S of the portion corresponding to the ±X sides of the separate area $S_1$ is adsorbed and held by using two auxiliary sheet holders $SH_3$.

Figure 11:
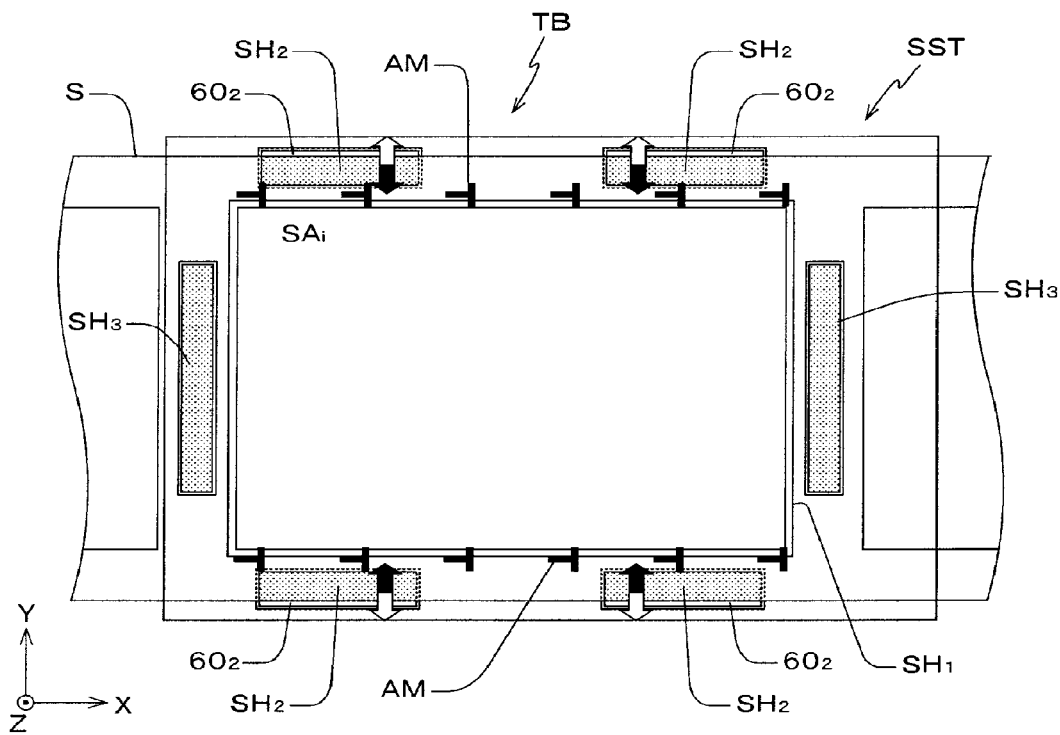
FIG. 11 is a diagram illustrating a temporary holding state of the sheet using an auxiliary sheet holder.

In detail, as shown in FIG. 11, the main control device 50 minutely drives two auxiliary sheet holders $SH_2$ respectively disposed in the +Y-side end and the −Y-side end on the table TB in a direction (+Y-axis direction or −Y-axis direction) depicted by the white arrow so as to widen the distance between the auxiliary sheet holders $SH_2$ distant from each other in the Y-axis direction on the table TB. In addition, the main control device 50 drives each of the auxiliary sheet holders $SH_2$ in the +Z-axis direction through the base $60_1$ so that the rear surfaces of both ends in the Y-axis direction of the sheet S come into contact with the holding surfaces of four auxiliary sheet holders $SH_2$. After the contact, the main control device 50 minutely drives two auxiliary sheet holders $SH_2$ on the +Y side in the −Y-axis direction depicted by the black arrow so as to firmly press the positioning member $60_2$ against the +Y end of the sheet S, and minutely drives two auxiliary sheet holders $SH_2$ on the −Y side in the +Y-axis direction depicted by the black arrow so as to firmly press the positioning member $60_2$ against the −Y end of the sheet S, thereby positioning the sheet S. After the positioning operation, the main control device 50 allows the rear surfaces of both sides in the Y-axis direction of the separate area $SA_i$ of the sheet S to be adsorbed and held by four auxiliary sheet holders $SH_2$, and allows the rear surfaces of both sides in the X-axis direction of the separate area $SA_i$ of the sheet S to be adsorbed and held by the auxiliary sheet holder $SH_3$.

Figure 12:
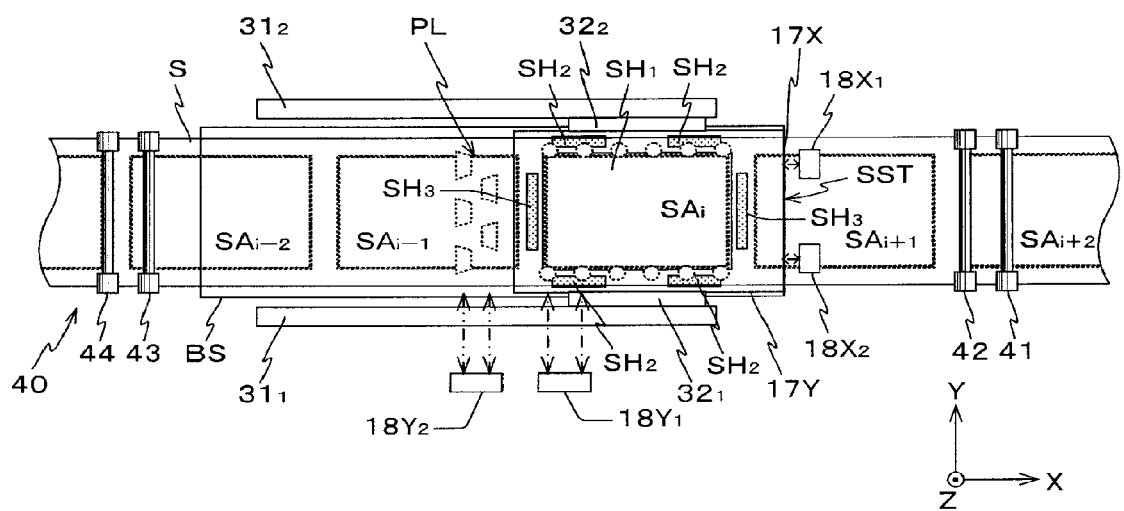
FIG. 12 is a (second) diagram illustrating a sequence of the exposure operation for the sheet in the exposure device of FIG. 1.
Figure 13:
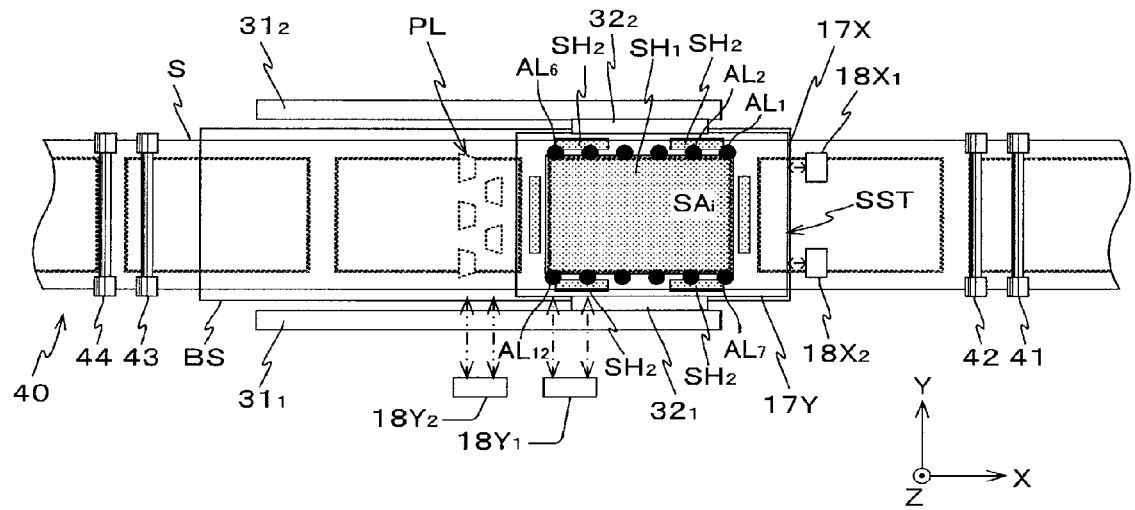
FIG. 13 is a (third) diagram illustrating a sequence of the exposure operation for the sheet in the exposure device of FIG. 1.

FIG. 12 shows a state where the sheet S is temporarily held by the auxiliary sheet holders $SH_2$ and $SH_3$ in this manner.

a4. After the temporary holding operation of the sheet S, the main control device 50 minutely drives each of the auxiliary sheet holders $SH_2$ and $SH_3$ in the −Z-axis direction through the base $60_1$ in the state where the sheet S is temporarily held so as to allow the rear surface of the center portion of the sheet S including the separate area $SA_i$ to come into contact with the holding surface of the sheet holder $SH_1$. Then, the main control device 50 positions the holding surface of each of the auxiliary sheet holders $SH_2$ and $SH_3$ so as to be located on the slightly lower side (−Z side) of the holing surface of the sheet holder $SH_1$. Accordingly, an appropriate tension is applied to the sheet S in the Y-axis direction and the X-axis direction, so that the center portion of the sheet S is fixed to the holding surface of the sheet holder $SH_1$. In this state, the main control device 50 adsorbs and holds the sheet S onto the sheet holder $SH_1$ as shown in FIG. 12. Accordingly, the center portion of the sheet S including the separate area $SA_i$ is flatly held onto the stage SST so as to be parallel to the XY plane.

b. Next, the alignment measurement for the sheet S is performed in accordance with the following sequences b1 to b5.

b1. As described above, in the state where the stage SST is positioned to the standby position, the alignment marks attached to the separate area $SA_i$ are positioned within the detection visual field of each of the alignment systems $AL_1$ to $AL_{12}$. Here, as shown in FIG. 13, the main control device 50 detects the alignment marks attached to the separate area $SA_i$ on the sheet S by using the alignment systems $AL_1$ to $AL_{12}$ (the positions of the alignment marks are measured on the basis of the index center). In addition, the main control device 50 obtains the position coordinates of twelve alignment marks on the XY coordinate on the basis of the detection result of the alignment marks and the positional information of the stage SST obtained from the stage interferometer system 18 through the detection.

b2. Next, the main control device 50 determines whether the contraction amount of the separate area $SA_i$ having the pattern of the sheet S in the X-axis direction and the Y-axis direction is within a predetermined range on the basis of the position coordinates of the twelve alignment marks obtained.

b3. Then, as a result, for example, when it is determined that a contraction exceeding a predetermined range occurs in at least a part inside the separate area $SA_i$, the operation of adsorbing and holding the sheet S using the sheet holder $SH_1$ is released, and each of the auxiliary sheet holders $SH_2$ and $SH_3$ is driven through the base $60_1$ in the +Z-axis direction so as to separate the rear surface of the sheet S from the holding surface of the sheet holder $SH_1$.

Figure 14:
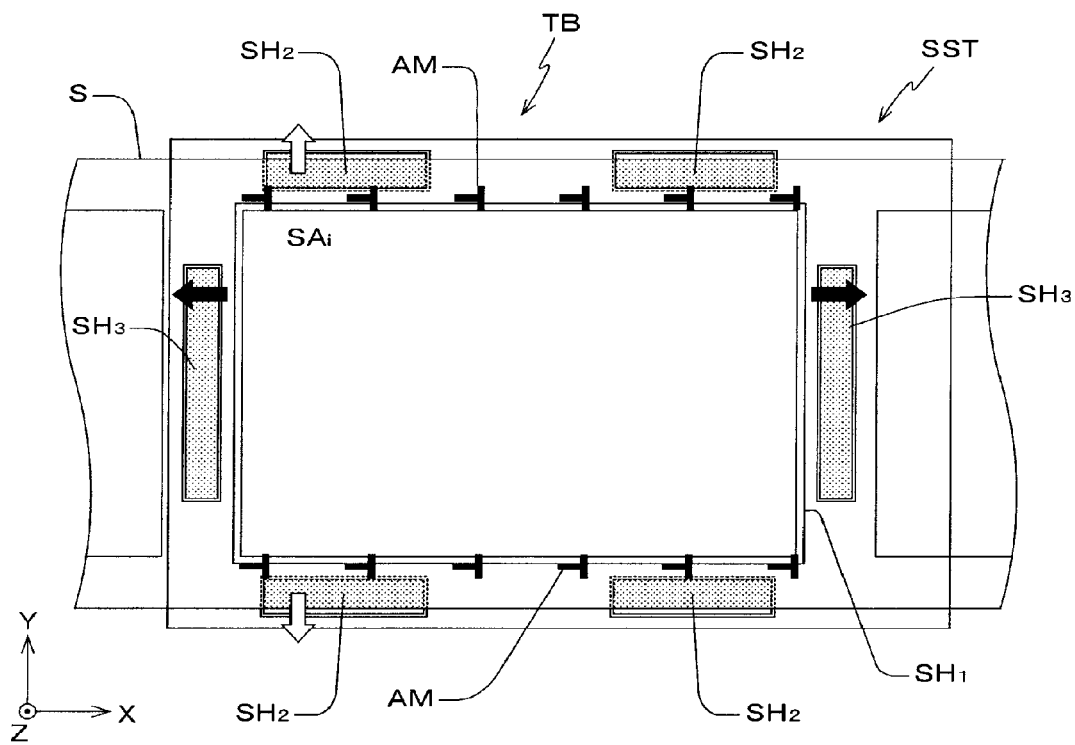
FIG. 14 is a diagram illustrating a positional alignment of the sheet using the auxiliary sheet holder.

Here, for example, when it is determined that the –X end of the inside of the separate area $SA_i$ on the sheet S contracts more than a predetermined range in the Y-axis direction, and the separate area $SA_i$ contracts more than a predetermined range in the X-axis direction, as shown in FIG. 14, two auxiliary sheet holders $SH_2$ on the –X side on the table TB are driven in a direction (depicted by the white arrow of FIG. 14) moving away from each other so as to further apply a tension to the –X-side end of the separate area $SA_i$ of the sheet S in the Y-axis direction, and two auxiliary sheet holders $SH_3$ are driven in a direction (depicted by the black arrow) moving away from each other so as to further apply a tension to the separate area $SA_i$ of the sheet S in the X-axis direction, thereby correcting (adjusting) the deformation.

After the adjustment, the main control device 50 drives each of the auxiliary sheet holders $SH_2$ and $SH_3$ through the base $60_1$ in the –Z-axis direction so that the rear surface of the sheet S comes into contact with the holding surface of the sheet holder $SH_1$ to be adsorbed and held thereon again.

b4. Then, the main control device 50 detects the alignment marks attached to the separate area $SA_i$ on the sheet S by using the alignment systems $AL_1$ to $AL_{12}$, and obtains the position coordinates of twelve alignment marks on the XY coordinates again on the basis of the detection result and the positional information of the stage SST obtained from the interferometer system 18 through the detection.

b5. Then, the main control device 50 performs a predetermined calculation of least squares by using all or a part of the position coordinates of the twelve alignment marks, and obtains the distortion, that is, the XY shift, the rotation, the XY scaling, and the perpendicularity of the pattern formed on the separate area $SA_i$ on the sheet S.

Here, when it is determined that the contraction amount of the separate area $SA_i$ in the Y-axis direction and the X-axis direction is within a predetermined range as the determination result of b2, the main control device 50 skips the processes of b3 and b4 and performs the process of b5.

Subsequently, the main control device 50 releases the restraint (fixation) of the sheet S performed by a predetermined transpiration roller portion of the sheet transporting system 40 used to apply a predetermined tension to the sheet S in the X-axis direction.

Figure 15:
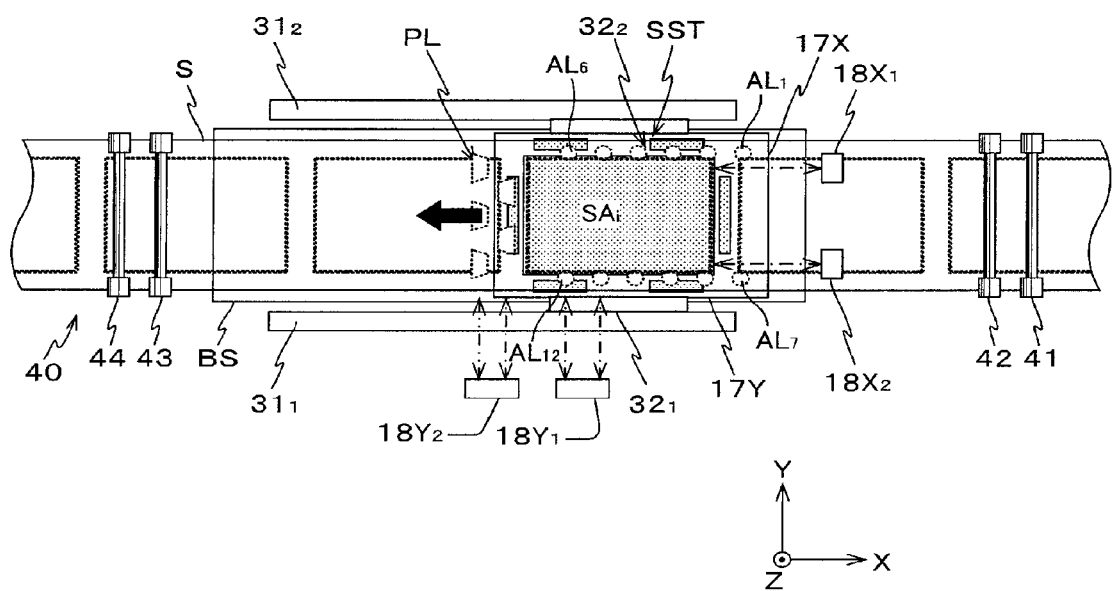
FIG. 15 is a (fourth) diagram illustrating a sequence of the exposure operation for the sheet in the exposure device of FIG. 1.
Figure 16:
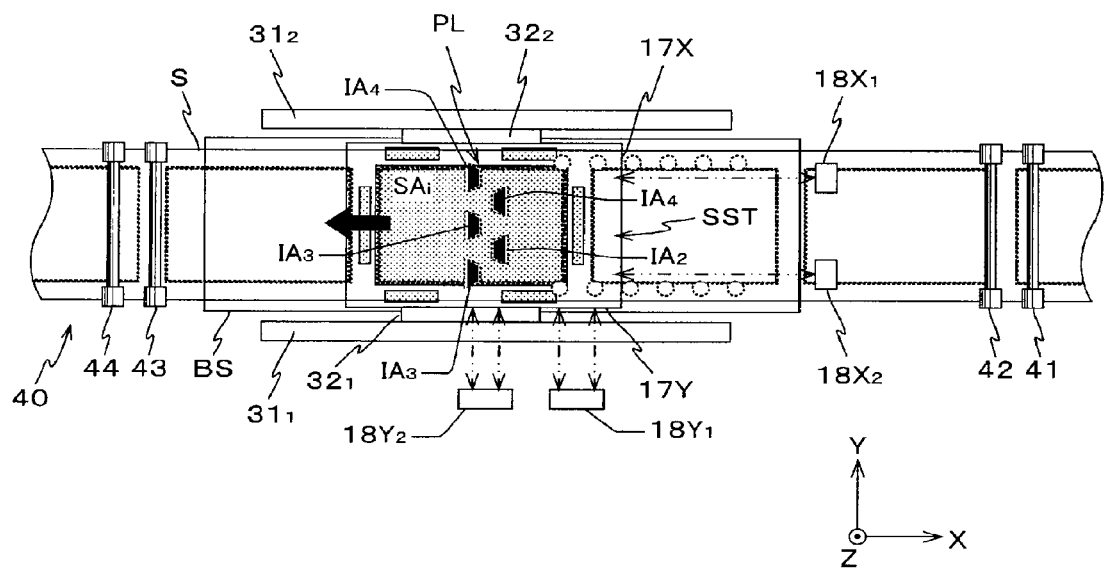
FIG. 16 is a (fifth) diagram illustrating a sequence of the exposure operation for the sheet in the exposure device of FIG. 1.

In addition, when the number of the alignment systems is fewer than the number of the alignment marks to be detected, it is necessary to perform the alignment measurement while stepwisely moving the stage SST holding the sheet S in the X-axis direction. At this time, the main control device 50 controls the rotation and the stopping of each of the driving rollers of the sheet transporting system 40 in accordance with the movement of the stage SST.

c. Next, the scanning exposure for the separate area $SA_i$ on the sheet S is performed.

c1. In detail, the main control device 50 moves the stage SST holding the sheet S to the scanning start position (acceleration start position) for the exposure on the basis of the result of the alignment measurement, and particularly, the XY shift so as to perform a positioning operation with respect to the mask stage MST holding the mask M. Here, in the embodiment, since the acceleration start position of the stage SST is set to the same position (or the vicinity thereof) as the above-described standby position, the minute adjustment of the position of the stage SST within the XY plane is performed.

c2. Next, the main control device 50 starts the acceleration of the stage SST in the scanning direction (–X-axis direction). Accordingly, the movement of the stage SST in the –X-axis direction is started. During the movement, and particularly, before the acceleration end of the stage SST, as shown in FIG. 15, the length measurement beam from the interferometer $18Y_2$ starts to collide with the reflection surface 17Y. Accordingly, immediately after the collision of the length measurement beam, the main control device 50 changes the laser interferometer for measuring the Y position of the stage SST from the interferometer $18Y_1$ to the interferometer $18Y_2$.

c3. Then, when the acceleration operations of both stages SST and MST end, and the acceleration operations of both stages SST and MST are synchronized with uniform speed, the pattern area on the mask M starts to be illuminated by the illumination light $IL_2$ and $IL_4$, thereby starting the exposure. Then, in accordance with the synchronization movement with uniform speed of both stages SST and MST, as shown in FIG. 16, the illumination areas $IAM_1$ to $IAM_5$ (refer to FIG. 2) on the mask M are illuminated by the illumination light $IL_1$ to $IL_5$, and the partial images of the patterns inside the illumination areas $IAM_1$ to $IAM_5$ are projected onto the projection areas $IA_1$ to $IA_5$ on the sheet S held on the stage SST through the projection optical systems $PL_1$ to $PL_5$ (refer to FIG. 3).

When the entire area of the pattern area of the mask M is illuminated by the illumination light $IL_1$ to $IL_5$, that is, the pattern area of the mask M passes through the illumination areas $IAM_1$ to $IAM_5$, the scanning exposure for the separate area $SA_i$ is completed. Accordingly, the pattern of the mask M is transferred to the separate area $SA_i$. That is, a latent image of the pattern of the mask M is formed on the resist layer formed on the surface of the sheet S.

During the scanning exposure, the main control device 50 drives the table TB of the stage SST in the Z-axis direction while horizontally maintaining the table, so that the surface of the sheet S held on the table TB (sheet holder $SH_1$) is positioned to the focal position (within the focal depth) of the projection optical system PL. In addition, during the scanning exposure, the main control device 50 controls the synchronization driving state (the relative position and the relative speed) of the stage SST and the mask stage MST on the basis of the result of the alignment measurement so as to correct the distortion of the entire image of the pattern projected onto the sheet S. Further, the main control device 50 controls the driving state of the optical element group (lens group) constituting the projection optical systems $PL_1$ to $PL_5$ through the lens controller LC so as to correct the distortion of the partial image of the pattern projected onto the projection areas $IA_1$ to $IA_5$ on the sheet S. Accordingly, the projection image of the pattern of the mask M is highly precisely overlapped with the pattern formed within the separate area $SA_i$.

Figure 17:
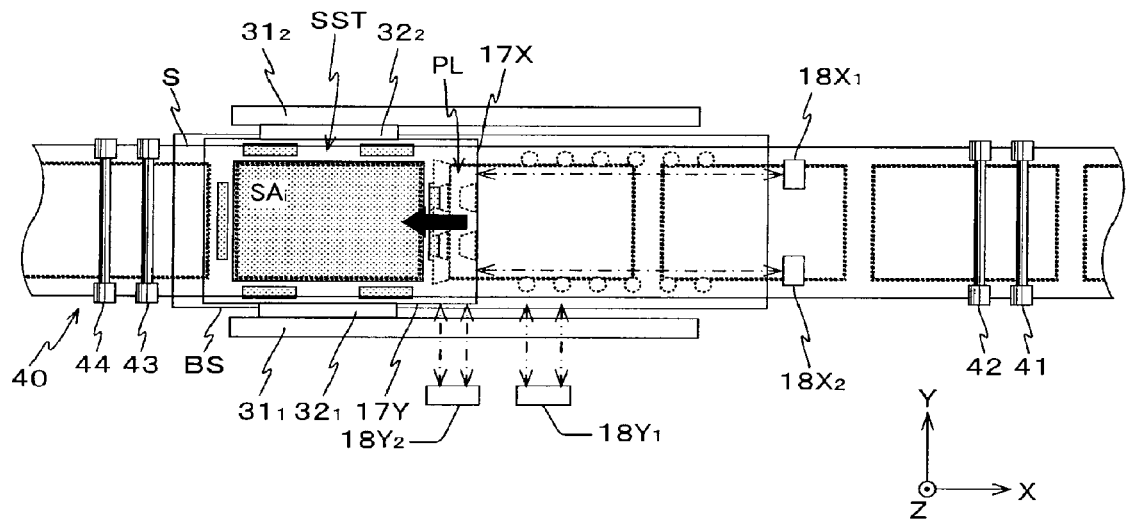
FIG. 17 is a (sixth) diagram illustrating a sequence of the exposure operation in the exposure device of FIG. 1.

After the scanning exposure for the separate area $SA_i$ is completed, both stages SST and MST are decelerated. As shown in FIG. 17, when they arrive at the scanning end position (deceleration end position), they are stopped. In addition, in the embodiment, the deceleration end position of the stage SST during the scanning operation is determined so as to be aligned to the −X end of the base member BS.

Figure 18:
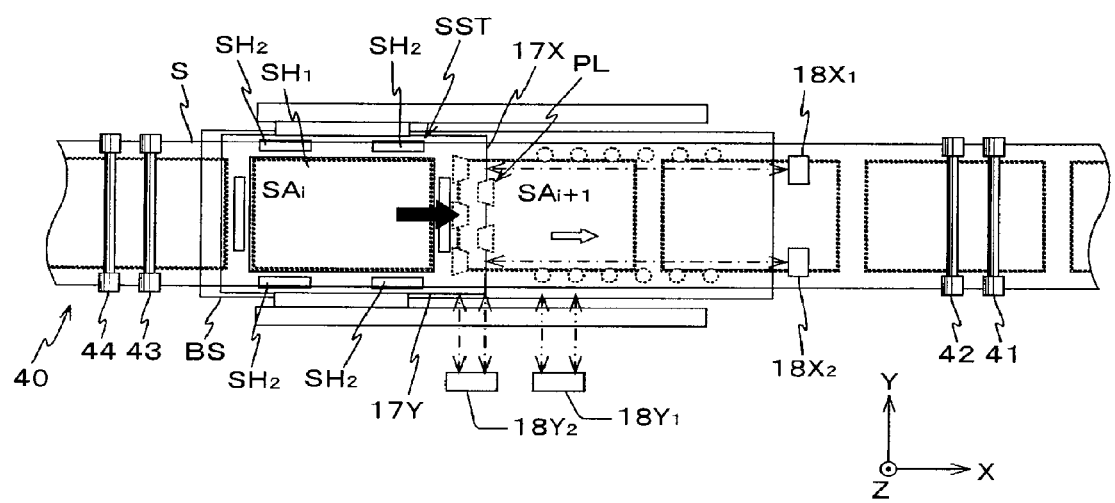
FIG. 18 is a (seventh) diagram illustrating a sequence of the exposure operation in the exposure device of FIG. 1.
Figure 19:
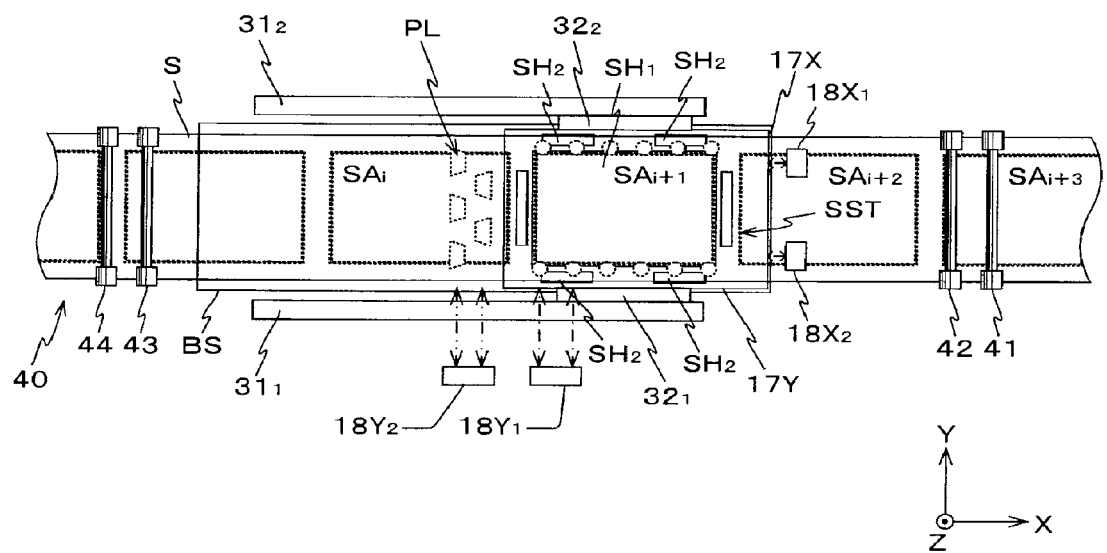
FIG. 19 is an (eighth) diagram illustrating a sequence of the exposure operation in the exposure device of FIG. 1.

In addition, when the main control device 50 drives the stage SST holding the sheet S in the −X-axis direction during the scanning exposure, as described above, the main control device appropriately rotates or stops each of the driving rollers of the sheet transporting system 40 in accordance with the movement of the stage SST so that the movement of the stage SST is not disturbed by a tension applied to the sheet S.

d. As shown in FIG. 17, when the stage SST is stopped at the −X end as the deceleration end position in front of the base member BS, the main control device 50 releases the operation of adsorbing and holding the sheet S using the sheet holder $SH_1$ and the sheet holder $SH_2$ so as to release the sheet S from the stage SST. Further, the main control device 50 retreats the table TB of the stage SST downward (−Z-axis direction). Accordingly, the sheet S is stretched between the transportation roller portions 42 and 43 with a minute space with respect to the sheet holder $SH_1$ of the stage SST.

e. After the sheet S is released, as shown in FIG. 18, the main control device 50 drives the sheet stage SST in the +X-axis direction depicted by the black arrow so as to return to the above-described standby position of the +X end on the base member BS. Here, in accordance with the X position of the sheet stage SST, the interferometer for measuring the Y position is changed from the interferometer $18Y_2$ to the interferometer $18Y_1$. In addition, the main control device 50 drives the mask stage MST to return to the scanning start position (acceleration start position) at a high speed. Further, in addition to the operation of driving the stage, the main control device 50 pulls back the sheet S in the +X-axis direction depicted by the white arrow as shown in FIG. 18.

f. The returning driving operation of the stage SST and the mask stage MST and the operation of pulling back the sheet S are completed, as shown in FIG. 19, the stage SST stays at the standby position, and the center portion of the sheet S including the subsequent separate area $SA_{i+1}$ is positioned to the surface of the stage SST staying at the standby position. This state is the same as that shown in FIG. 10 except that one separate area of the sheet S has transported.

Subsequently, the main control device 50 starts the exposure for the separate area $SA_{i+1}$ as in the former case. Subsequently, in the same manner, the main control device 50 repeats the above-described sequences a. to f. so as to perform an exposure for all separate areas on the sheet S.

As described above in detail, each of the rollers of the transportation roller portion 43 is rotated in the state where the rotation of each of the rollers of the transportation roller portions 41, 42, and 44 of the sheet transporting system 40 is stopped (or each of the rollers of the transportation roller portion 42 is reversely rotated in the state where the rotation of each of the rollers of the transportation roller portions 41, 43, and 44 is stopped) by the main control device 50, so that a predetermined tension is applied to the sheet S in the X-axis direction so as to be stretched between the transportation roller portions 42 and 43. In addition, after the sheet S is temporarily held by six auxiliary sheet holders $SH_2$ and $SH_3$, six auxiliary sheet holders $SH_2$ and $SH_3$ are minutely driven in the −Z-axis direction in the state where the sheet S is temporarily held by the main control device 50, so that the rear surface of the center portion of the sheet S including the separate area $SA_i$ comes into contact with the holding surface of the sheet holder $SH_1$. In addition, the holding surfaces of six auxiliary sheet holders $SH_2$ and $SH_3$ are positioned to be slightly on the lower side (−Z side) of the holding surface of the sheet holder $SH_1$ by the main control device 50, so that the center portion of the sheet S is fixed onto the holding surface of the sheet holder $SH_1$ in the state where an appropriate tension is applied to the sheet S in the width direction (Y-axis direction) and the longitudinal direction. That is, in the state where a tension is applied to the separate area $SA_i$ of the sheet S in the XY two-dimensional direction, the rear surface portion corresponding to the separate area $SA_i$ of the sheet S is adsorbed by the flat holding surface of the sheet holder $SH_1$. Further, the illumination system IOP illuminates the illumination light $IL_1$ to $IL_5$ to the separate area $SA_i$ of the sheet S flatly adsorbed by the holding surface of the sheet holder $SH_1$ through the pattern of the mask M, so that the scanning exposure is performed on the sheet S, and the pattern is formed thereon. Accordingly, even in the case of the sheet S becoming contracted by, for example, heat generated during a treatment of a process, it is possible to perform the exposure with high precision. Therefore, it is possible to contribute to the production of an electronic device such as a flexible large-size display without increasing the size of the device.

In addition, in the above-described embodiment, a case has been described in which the holding surfaces of two auxiliary sheet holders $SH_3$ are positioned slightly below (−Z side) the holding surface of the sheet holder $SH_1$ so as to further apply a tension to the sheet S in the X-axis direction when the rear surface of the center portion of the sheet S including the separate area $SA_i$ is adsorbed by the holding surface of the sheet holder $SH_1$ in the state where a predetermined tension is applied to the sheet S in the X-axis direction by the transportation roller portion of the sheet transporting system 40. However, the present invention is not limited thereto. A tension can be applied to the sheet S in the X-axis direction just by moving two auxiliary sheet holders $SH_3$ adsorbing and holding the sheet S in the −Z-axis direction and the direction moving away from each other. Alternatively, a tension can be applied to the sheet S in the X-axis direction by the restraint of the sheet using the constituting portion of the sheet transporting system 40 without providing the auxiliary sheet holder $SH_3$. In this case, a clamper portion 45 shown in FIG. 21 can be further provided inside the sheet transporting system 40. The case of being provided the damper portion 45 will be described in detail after.

Figure 20:
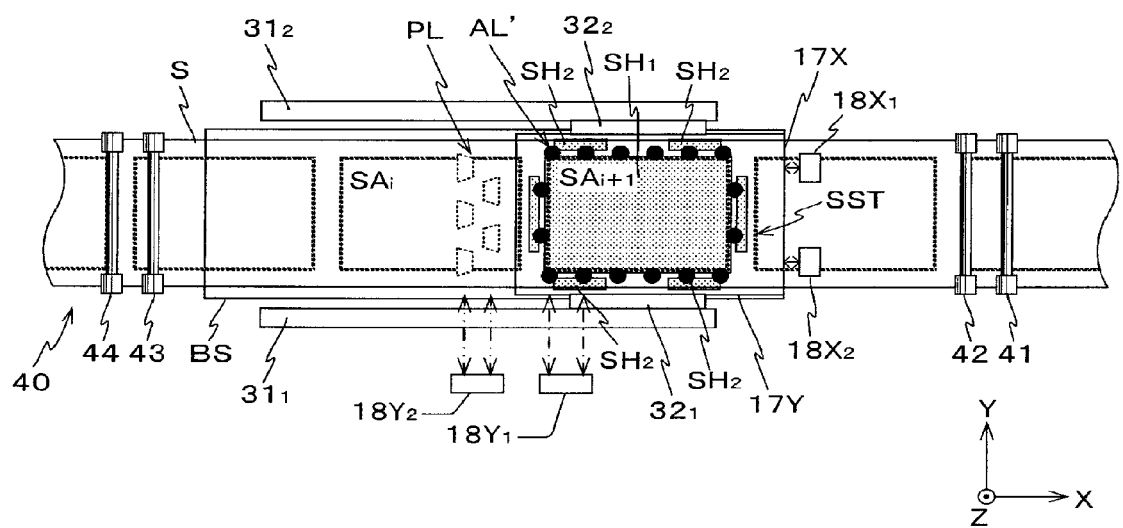
FIG. 20 is a diagram showing an arrangement of an alignment system according to the modified example of the first embodiment.

In addition, in the exposure device 100 of the above-described embodiment, the alignment measurement for the sheet S is performed by using the alignment systems $AL_1$ to $AL_{12}$ arranged along the X-axis direction while being distant from each other in the Y-axis direction. However, the present invention is not limited thereto. For example, the alignment marks are disposed in the periphery of the separate area $SA_i$ on the sheet S at a predetermined interval, and as shown in FIG. 20, the alignment systems AL' are disposed in the periphery of the separate area $SA_i$ so as to correspond to the arrangement of the alignment marks, thereby simultaneously detecting all alignment marks. In this case, when it is detected that the separate area $SA_i$ is decreased in the X-axis direction on the basis of the measurement result of the positions of the alignment marks, the scaling error in the X-axis direction of the separate area can be adjusted in such a manner that the main control device 50 drives two auxiliary sheet holders $SH_3$ adsorbing and holding the sheet S in a direction moving away from each other so as to apply a tension to the sheet S in the X-axis direction. In addition, a plurality of auxiliary sheet holders $SH_3$ can be disposed in the X-axis direction across the sheet holder $SH_1$, and the scaling error in the X-axis direction corresponding to the Y position within the separate area can be adjusted by individually using the auxiliary sheet holders $SH_3$ on the basis of the measurement result of the positions of the alignment marks.

Second Embodiment

Hereinafter, second embodiment of the present invention will be described with reference to FIGS. 21 to 39.

Figure 21:
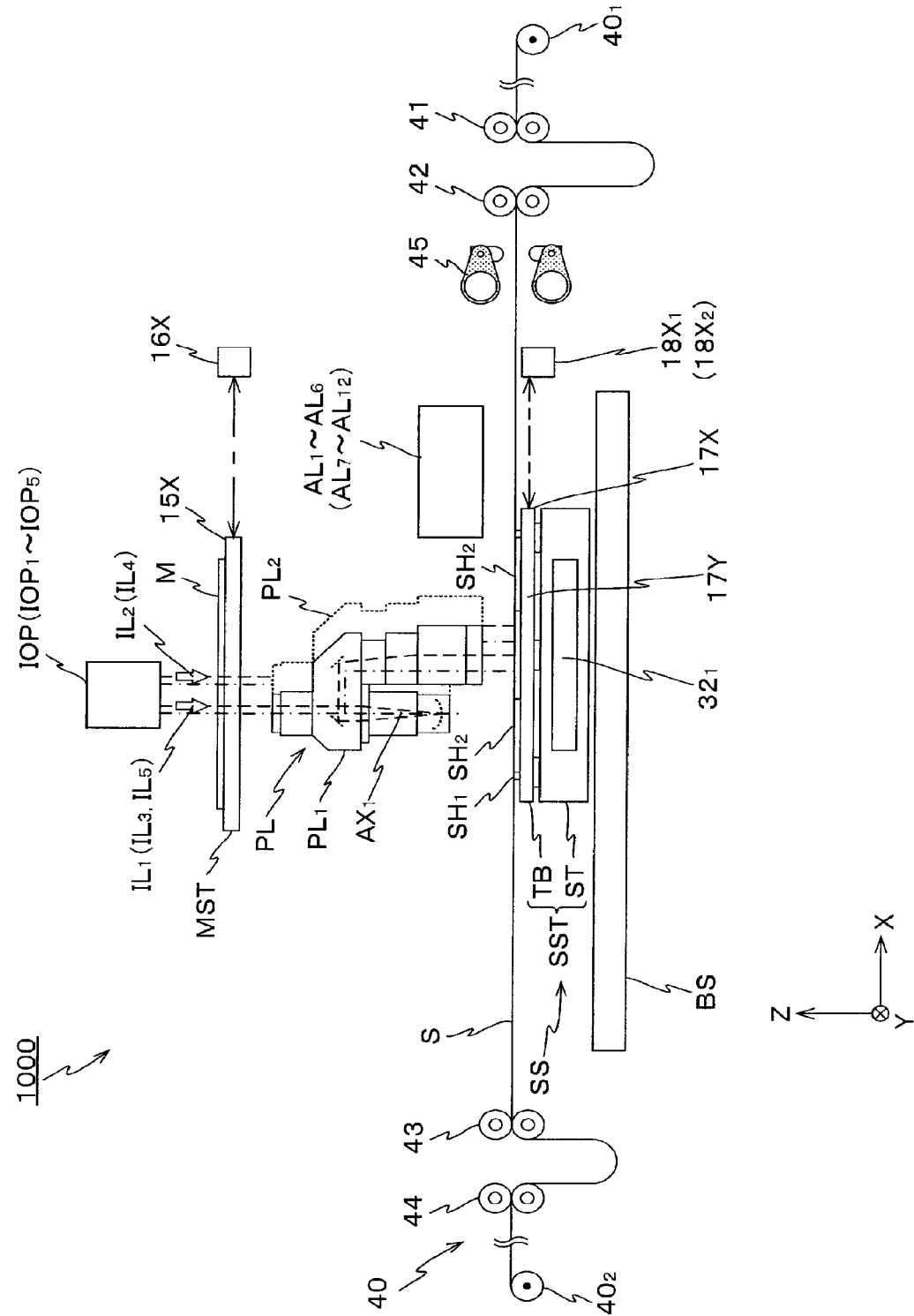
FIG. 21 is a diagram showing a schematic configuration of an exposure device according to a second embodiment.

FIG. 21 shows a schematic configuration of an exposure device 1000 according to a second embodiment. The exposure device 1000 is a multi-lens type projection exposure device, that is, a so-called scanner in which a flexible sheet or film (hereinafter, they are all referred to as a sheet) is an exposure target object. In the embodiment, as an example, a sheet having a thickness of about 100 μm is used.

The exposure device 1000 includes an illumination system IOP, a mask stage MST which holds a mask M, a projection optical system PL which projects an image of a pattern formed on the mask M onto a sheet S, a stage device SS which includes a sheet stage (hereinafter, simply referred to as a stage) SST for holding the sheet S, a sheet transporting system 40 which transports the sheet S, a control system thereof, and the like.

In addition, the sheet S used in the exposure device 1000 of the embodiment is a continuously elongated sheet. The sheet S is wound in a roll shape, and is set in a roller $40_1$. As described below, the sheet S is extracted from the roller $40_1$ by (transportation roller portions 41 to 44 constituting) the sheet transporting system 40, passes through an area directly below of the projection optical system PL, and is wound on a winding roller $40_2$. In addition, a photosensitizing agent (resist) is coated on the surface of the sheet S. In the embodiment, as an example, the sheet S is extracted from the roller $40_1$ and is wound on the winding roller $40_2$, but the present invention is not limited thereto. A sheet extracted from a resist coating device for performing a treatment before an exposure, for example, a resist coating treatment and transported to a developing device for performing a treatment after an exposure, for example, a developing treatment can be subjected to an exposure by the exposure device 1000.

Hereinafter, a vertical direction (the up/down direction of FIG. 21) parallel to the light axis (here, the middle portion between both portions is excluded) of the object surface side and the upper surface side of the projection optical system PL is set to the Z-axis direction, a scanning direction (the left/right direction of FIG. 21) in which the mask M and the sheet S are relatively scanned by the projection optical system PL within a plane perpendicular to the Z-axis direction is set to the X-axis direction, and a direction perpendicular to the Z-axis direction and the X-axis direction is set to the Y-axis direction. Then, the rotation (inclination) directions of the X, Y, and Z-axis directions are respectively described as θx, θy, and θz directions.

The illumination system IOP includes a plurality of (herein, five) illumination system modules (hereinafter, simply referred to as illumination systems) $IOP_1$ to $IOP_5$. Each of the illumination systems $IOP_1$ to $IOP_5$ includes an ultra high pressure mercury lamp (light source) which emits UV light, an oval mirror which collects the UV light from the light source, a wavelength selection filter which is disposed on the light path of the collected UV light, an optical integrator, and an illumination optical system (are not shown) which includes a visual field diaphragm. The emission line, for example, a line i (having a wavelength of 365 nm), a line g (having a wavelength of 436 nm), or a line h (having a wavelength of 405 nm) from the UV light is extracted as illumination light $IL_1$ to $IL_5$ through the wavelength selection filter. Each of the extracted illumination light $IL_1$ to $IL_5$ is emitted (toward the mask M) on the outside of the illumination system IOP ($IOP_1$ to $IOP_5$) along each of the light axes $AX_1$ to $AX_5$ (refer to FIG. 22).

Figure 22:
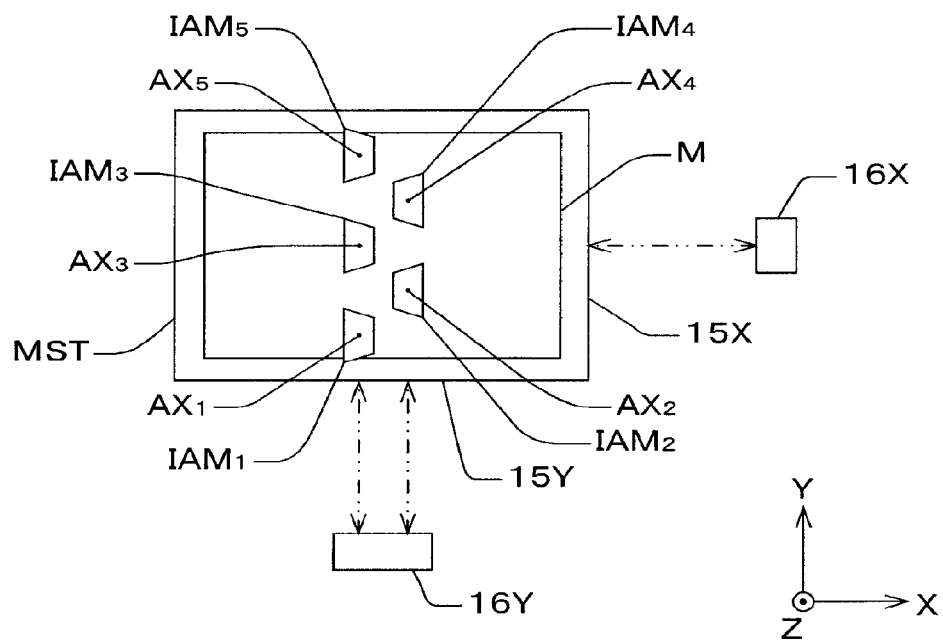
FIG. 22 is a plan view showing an arrangement of an illumination area and a schematic configuration of a mask stage provided in the exposure device of FIG. 21.

In addition, as shown in FIG. 22, the light axes $AX_1$, $AX_3$, and $AX_5$ are arranged at a predetermined interval in the Y-axis direction within the XY plane (the pattern surface of the mask M). Further, the light axes $AX_2$ and $AX_4$ are respectively disposed between the light axes $AX_1$ and $AX_3$ and between the light axes $AX_3$ and $AX_5$ with a predetermined distance therebetween from the light axes $AX_1$, $AX_3$, and $AX_5$ to the +X side. That is, the light axes $AX_1$ to $AX_5$ are arranged in a zigzag shape within the XY plane.

The illumination systems $IOP_1$ to $IOP_5$ illuminate illumination light $IL_1$ to $IL_5$ to illumination areas $IAM_1$ to $IAM_5$ on the mask M along the light axes $AX_1$ to $AX_5$ with uniform intensity of illumination. Each of the illumination areas has an isosceles trapezoid shape stipulated by the visual field diaphragm (not shown) within the illumination optical system. In addition, the detailed configuration of the illumination system IOP ($IOP_1$ to $IOP_5$) is disclosed in, for example, the specification of U.S. Pat. No. 6,552,775.

As shown in FIG. 21, the mask stage MST is disposed at the low position (−Z side) of the illumination system IOP. The rectangular mask M is fixed onto the mask stage MST by, for example, vacuum adsorption, where the mask indicates that a rectangular pattern area is formed in the pattern surface (−Z side surface). The mask stage MST can be minutely driven within the XY plane by a mask stage driving system MSD (not shown in FIG. 21, and refer to FIG. 29) including a linear motor and the like, and can be driven at a predetermined scanning speed of a predetermined stroke in the scanning direction (X-axis direction).

Positional information within the XY plane of the mask stage MST is constantly measured while having, for example, a resolution of about 0.25 to 1 nm by laser interferometers (hereinafter, simply referred to as interferometers) 16X and 16Y constituting a part of a mask stage interferometer system 16 (refer to FIG. 29). As shown in FIG. 22, the +X side surface and the −Y side surface of the mask stage MST are subjected to mirror-like finishing so as to have reflection surfaces 15X and 15Y. The interferometer 16X measures the rotation in the direction θz and the position (X position) in the X-axis direction of the mask stage MST by emitting a plurality of length measurement beams to the reflection surface 15X along the light path parallel to the X axis and receiving the reflected beams from the reflection surfaces 15X. The substantial length measurement axis of the interferometer 16X is an axis parallel to the X axis perpendicular to the light axis $AX_3$. The interferometer 16Y measures the position (Y position) in the Y-axis direction of the mask stage MST by emitting two length measurement beams to the reflection surface 15Y along the light path parallel to the Y axis perpendicular to the light axes $AX_1$ and $AX_2$ and receiving the reflected beams from the reflection surface 15Y. In addition, instead of the above-described reflection surfaces 15X and 15Y, a moving mirror formed by a plane mirror can be fixed to the mask stage MST.

Figure 29:
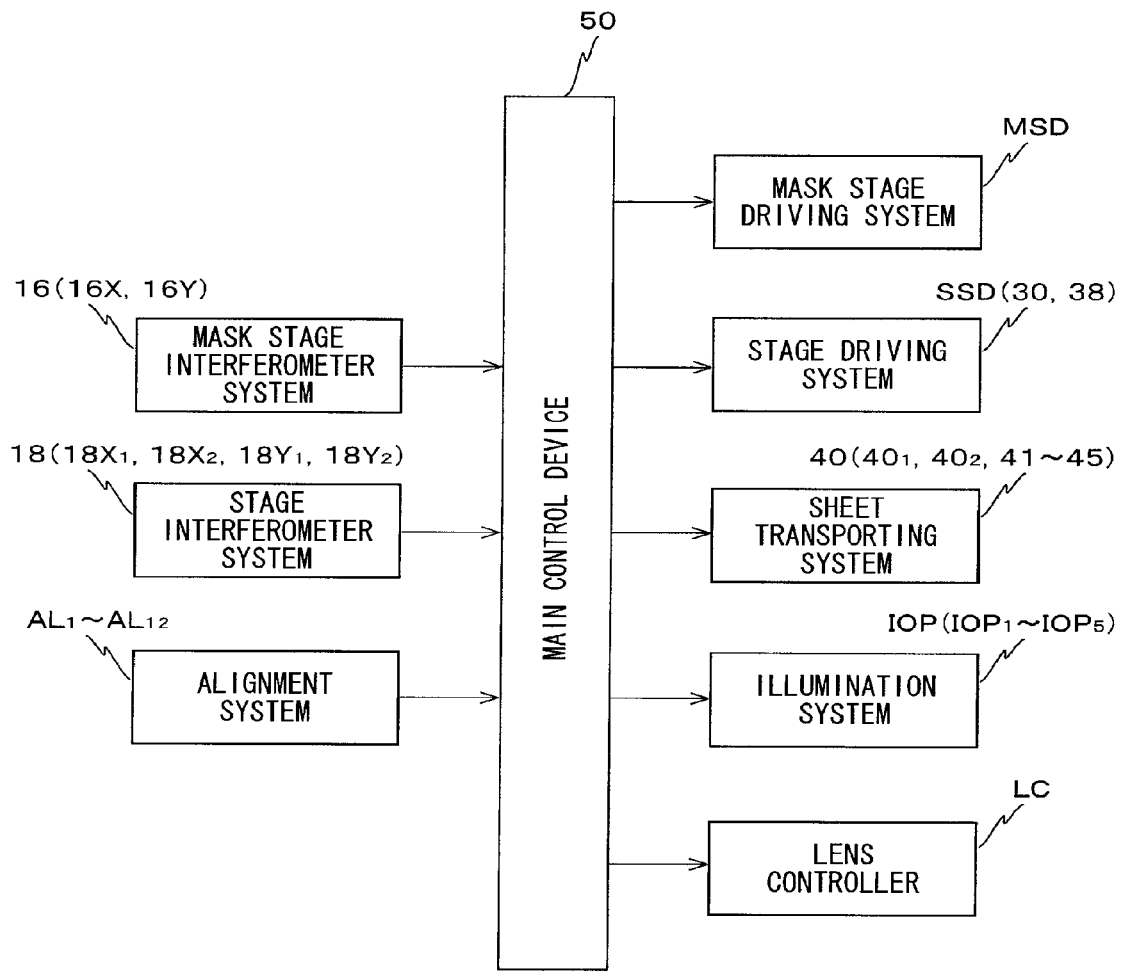
FIG. 29 is a block diagram showing an input/output relationship of a main control device provided in the exposure device of FIG. 21.

The measurement information of the interferometers 16X and 16Y is supplied to a main control device 50 (refer to FIG. 29). The main control device 50 controls the mask stage MST through the mask stage driving system MSD on the basis of the measurement information (the positional information of the mask stage MST) of the interferometers 16X and 16Y.

Figure 23:
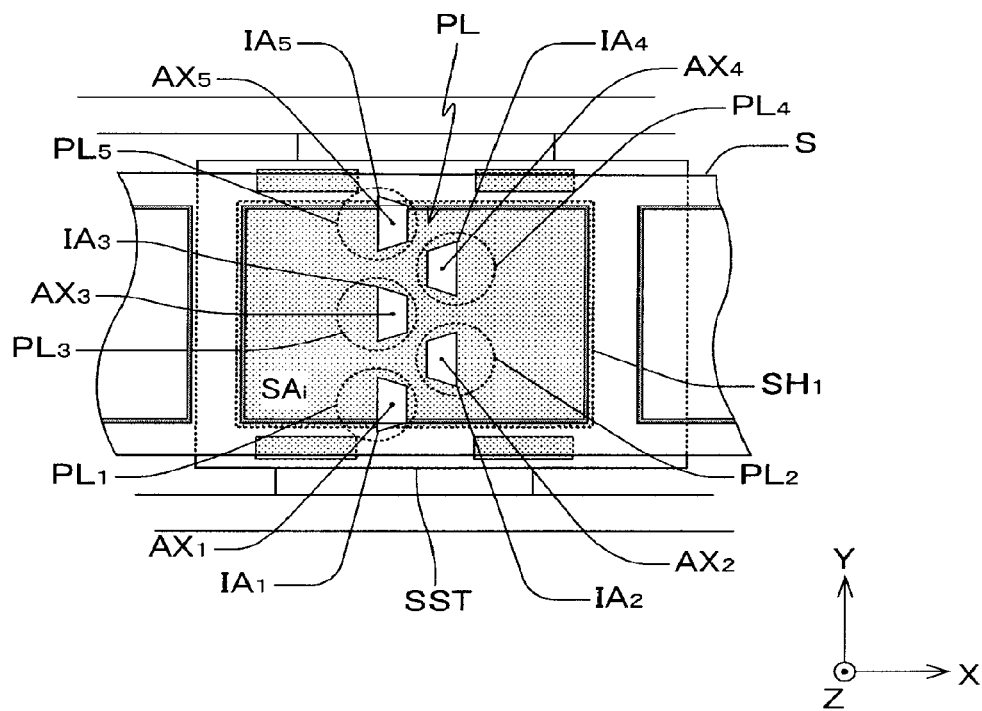
FIG. 23 is a plan view showing an arrangement of a projection area (exposure area) on a sheet and a projection optical system provided in the exposure device of FIG. 21.

As shown in FIG. 21, the projection optical system PL is disposed at the low position (−Z side) of the mask stage MST. For example, as shown in FIG. 23, the projection optical system PL according to the embodiment includes five projection optical system modules (hereinafter, simply referred to as projection optical systems) $PL_1$ to $PL_5$ which are disposed in a zigzag shape so as to correspond to arrangement of the light axes $AX_1$ to $AX_5$. In FIG. 21, the projection optical systems $PL_3$, $PL_5$, and $PL_4$ are disposed backward the projection optical systems $PL_1$ and $PL_2$ in this paper plane. As each of the projection optical systems $PL_1$ to $PL_5$, for example, a both-side telecentric reflection-refraction system is used which forms an erect image on an image surface at the same magnification.

By means of the arrangement of the above-described projection optical systems $PL_1$ to $PL_5$ (the light axes $AX_1$ to $AX_5$), the projection areas $IA_1$ to $IA_5$ where the image of the pattern is projected by the projection optical systems $PL_1$ to $PL_5$ on the sheet S are arranged in a zigzag shape as in the illumination areas $IAM_1$ to $IAM_5$. Here, the projection areas $IA_1$ to $IA_5$ have an isosceles trapezoid shape as in the illumination areas $IAM_1$ to $IAM_5$. By means of the arrangement and the shape of the projection areas $IA_1$ to $IA_5$, the mask M and the sheet S are driven in a synchronized manner in the scanning direction (X-axis direction) while the image (the partial image) of the pattern within the illumination areas $IAM_1$ to $IAM_5$ on the mask M is projected onto the projection areas $IA_1$ to $IA_5$ on the sheet S through the projection optical systems $PL_1$ to $PL_5$, so that the partial images of the pattern projected onto the sheet S are synthesized as one image (synthesized image) which is the same as the pattern formed in the mask M. Accordingly, by means of the scanning exposure, the pattern of the mask M is transferred onto (one short area (separate area) $SA_L$) the sheet S through the projection optical systems $PL_1$ to $PL_5$. In addition, the detail of the scanning exposure will be described later.

In the embodiment, since the optical system for projecting the erected image at the same magnification is adopted as the projection optical systems $PL_1$ to $PL_5$, the shape and the arrangement (positional relationship) of the projection areas $IA_1$ to $IA_5$ are the same as the shape and the arrangement (positional relationship) of the illumination areas $IAM_1$ to $IAM_5$. The detailed configuration of the projection optical system PL according to the embodiment is disclosed in, for example, U.S. Pat. No. 6,552,775 and the like.

The exposure device 1000 includes a lens controller LC (refer to FIG. 29) which corrects a distortion (the positional deviation and/or the shape error) of the image projected onto the sheet S by the projection optical systems $PL_1$ to $PL_5$. The lens controller LC drives at least a part of an optical element group (lens group) constituting each of the projection optical systems $PL_1$ to $PL_5$ in a direction parallel to the light axes $AX_1$ to $AX_5$ and a direction inclined relative to the XY plane perpendicular to the light axes $AX_1$ to $AX_5$. Accordingly, the distortion (the shift, the rotation, the magnification (scaling), and the like) of the partial image of the pattern projected onto the projection areas $IA_1$ to $IA_5$ of the sheet S is corrected. In addition, the lens controller LC can change a pressure of a gas inside a hermetic room formed inside the projection optical systems $PL_1$ to $PL_5$ or change the wavelength of the illumination light instead of or in addition to driving the optical element group.

As shown in FIG. 21, the stage device SS is disposed at the low position (−Z side) of the projection optical system PL ($PL_1$ to $PL_5$). The stage device SS includes a base member BS which is supported on a bottom surface by an anti-vibration mechanism (not shown) so as to be substantially horizontal, a stage SST which moves and supports the sheet S on the base member BS, a driving system SSD (not shown in FIG. 21, refer to FIG. 29) which drives the stage SST, a stage interferometer system 18 (refer to FIG. 29) which measures positional information of the stage SST, and the like. In addition, in FIG. 21, the sheet S is adsorbed and held onto the stage SST.

As shown in FIG. 21, the stage SST includes a stage body ST which is supported on the base member BS in an uplifted state by a plurality of non-contact bearings (for example, air bearings (not shown)) provided in the bottom surface, a Z-leveling device 38 (refer to FIG. 24A) which is disposed on the stage body ST, and a table TB which is supported at three points by the Z-leveling device 38.

Figure 24A:
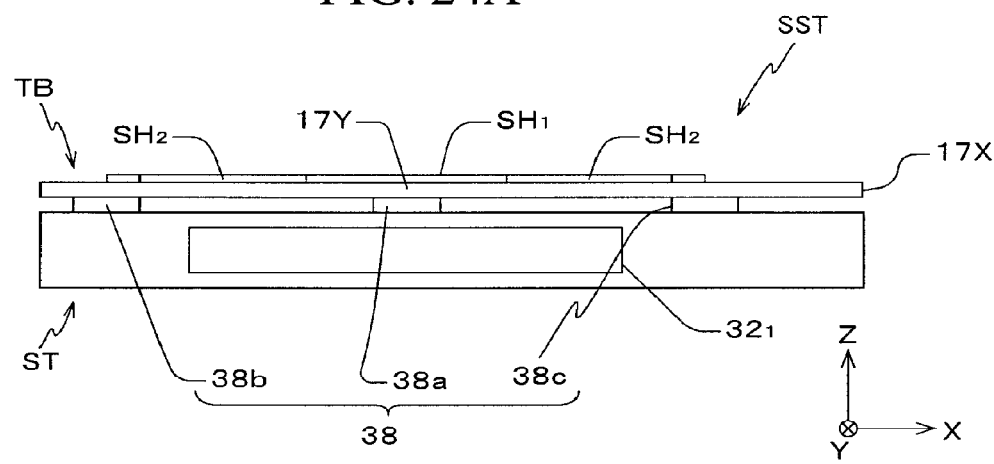
FIG. 24A is a side view showing a schematic configuration of the stage.
Figure 24B:
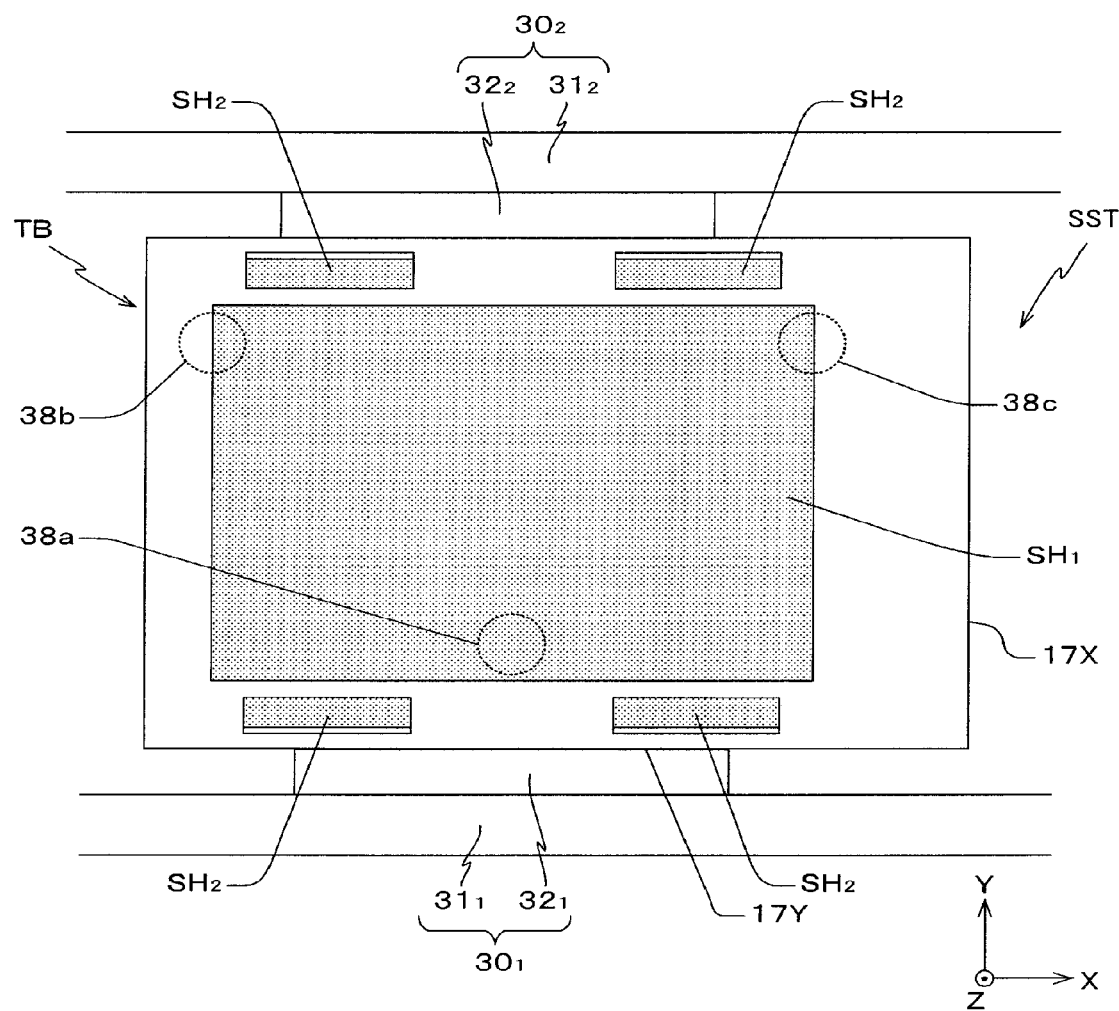
FIG. 24B is a plan view showing a schematic configuration thereof.

As shown in FIG. 24B, the Z-leveling device 38 includes three Z driving mechanisms 38a, 38b, and 38c which are disposed at three points not existing in one line on the stage body ST and including, for example, a voice coil motor and the like. By means of the Z-leveling device 38, it is possible to minutely drive the table TB on the stage body ST in a direction of three degrees of freedom of the Z-axis direction, the θx direction, and the θy direction.

The stage SST (stage body ST) is scan-driven on the base member BS by the stage driving system SSD in the X-axis direction (scanning direction), and is also minutely driven in the Y-axis direction and the θz direction. The stage driving system SSD includes a minute movement device (not shown) which minutely drives the stage SST in the Y-axis direction, and a rough movement device 30 (refer to FIG. 29) which drives the minute movement device (not shown) in the scanning direction (X-axis direction).

As shown in FIGS. 24B and 26, the rough movement device 30 includes a pair of linear motors $30_1$ and $30_2$ respectively provided in one side and the other side of the Y-axis direction of the stage SST. The one linear motor $30_1$ includes a fixed portion $31_1$ which is disposed on the −Y side of the base member BS and extends in the X-axis direction, and a movable portion $32_1$ which is attached to the fixed portion $31_1$ so as to be movable along the longitudinal direction. The other linear motor $30_2$ includes a fixed portion $31_2$ which is disposed on the +Y side of the base member BS and extends in the X-axis direction, and a movable portion $32_2$ which is attached to the fixed portion $31_2$ so as to be movable along the longitudinal direction. Each of the fixed portions $31_1$ and $31_2$ includes a plurality of magnets (or coils) arranged along the X-axis direction, and each of the movable portions $32_1$ and $32_2$ includes coils (or magnets). The movable portions $32_1$ and $32_2$ are respectively fixed to the −Y side surface and the +Y side surface of the stage body ST through a minute movement device (not shown) which minutely moves them in the Y-axis direction. In addition, the stage body ST can be minutely driven in the θz direction by generating different thrust forces in the linear motors $30_1$ and $30_2$. In addition, a stage driving system can be configured which two-dimensionally moves the stage SST along the upper surface (guide surface) of the base member BS by using a planar motor of a Lorentz electromagnetic driving type, a planar motor of a variable electromagnetic resistance driving type, a planar motor of a magnetic suspension type, and the like disclosed in, for example, the specification of U.S. Pat. No. 5,196,745 instead of the rough movement device 30 and the minute movement device.

The table TB is driven on the base member BS by the stage driving system SSD (refer to FIG. 29) including the rough movement device 30, the minute movement device (not shown), and the Z-leveling device 38 so as to have six degrees of freedom in the X-axis direction, the Y-axis direction, the Z-axis direction, the θx direction, the θy direction, and the θZ direction.

As shown in FIGS. 24A and 24B, a sheet holder $SH_1$ is provided at the center portion of the upper surface of the table TB so as to adsorb and hold the sheet S. The sheet holder $SH_1$ is substantially parallel to the XY plane, and includes a rectangular holding surface which is slightly larger than the separate area arranged on the sheet S, thereby flatly holding the sheet S on the holding surface. Here, in order to adsorb and hold the sheet S, as the sheet holder $SH_1$, a pin chuck holder is adopted in which the arrangement interval (pitch) of the pins is sufficiently small, and the height of the pin is low so as to be, for example, about 200 μm.

In addition, four auxiliary sheet holders $SH_2$ are provided on the upper surface of the table TB so as to adsorb and hold the rear surface of both ends of the sheet S in the width direction (the Y-axis direction perpendicular to the longitudinal direction). In detail, the ±Y sides of the sheet holder $SH_1$ are provided with two auxiliary sheet holders $SH_2$ which are thin and long in the X-axis direction and are distant from each other by a predetermined distance in the X-axis direction. Each of the auxiliary sheet holders $SH_2$ includes a rectangular holding surface, and can be minutely driven in the Y-axis direction and the Z-axis direction by a holder driving device provided in the table TB.

Figures 25A, 25B:
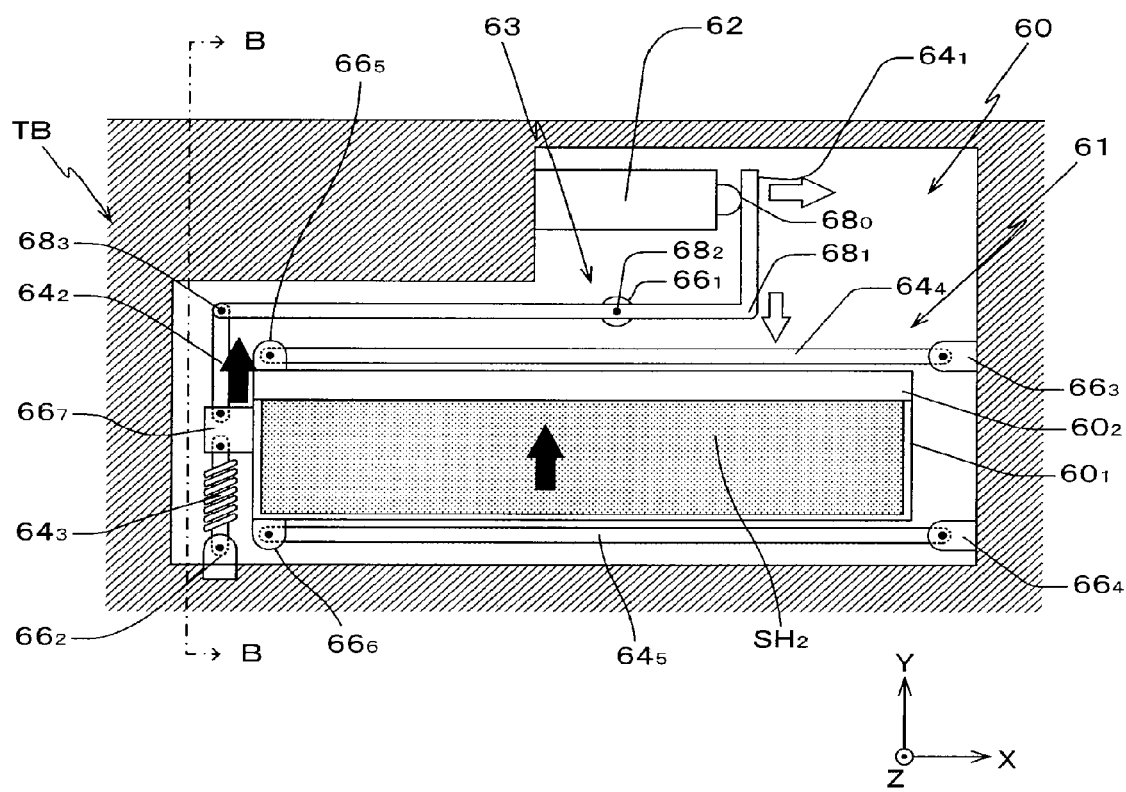
FIG. 25A is a sectional view of a table in the vicinity of a holder driving device and an auxiliary sheet holder.
FIG. 25B is a sectional view taken along the line B-B of FIG. 25A.

FIG. 25A is a plan view showing a configuration of a holder driving device 60 provided inside the table TB, and FIG. 25B is a sectional view taken along the line B-B of FIG. 25A. Here, as an example, the holder driving device 60 is shown which drives the auxiliary sheet holder $SH_2$ located at the +Y-side end and the +X-side end of the table TB.

The holder driving device 60 includes a Y driving unit which includes a parallel link mechanism 61 as one type of a four-joint link mechanism provided inside a hollow portion provided in the table TB and a driving mechanism 63 driving (the driving joint of) the parallel link mechanism 61 and drives the auxiliary sheet holder $SH_2$ in the Y-axis direction, and a Z driving unit (not shown) which includes, for example, a driving element, a voice coil motor, and the like supporting a rectangular base $60_1$ having the auxiliary sheet holder $SH_2$ fixed to the upper surface thereof on the bottom surface of the table TB and minutely driving that in the Z-axis direction. One end (−X end) of the base $60_1$ is integrated with a link (hereinafter, conveniently referred to as a parallel movement link) which is located on the opposite side of the fixed link of the parallel link mechanism 61.

In detail, the parallel link mechanism 61 includes a pair of oscillation links $64_4$ and $64_5$ of which one end is respectively connected to a pair of link support members $66_3$ and $66_4$ fixed to the +X side wall of the hollow portion of the table TB and the other ends are respectively connected to one end $66_5$ and the other end $66_6$ of the above-described parallel movement link. In this case, the link support members $66_3$ and $66_4$ are fixed to the table TB to thereby configure a fixed link. The fixed link, the oscillation links $64_4$ and $64_5$, and the parallel link are adjacent links and configure a revolute pair.

The driving mechanism 63 includes an actuator 62 of which one end is fixed to a part of the side wall of the hollow portion of the table TB, an L-shaped lever link $64_1$ of which one end (driving point $68_0$) comes into contact with the actuator 62 with pressure and a support point $68_2$ of the middle portion is rotatably supported to a fixator $66_1$ fixed to the bottom wall of the table TB, and a movable link $64_2$ of which one end is connected to the other end (action point $68_3$) of the lever link $64_1$ and the other end is connected to an attachment member $66_7$ fixed to a part of the above-described parallel movement link. The lever link $64_1$ and the movable link $64_2$ configure a revolute pair, and the movable link $64_2$ and the attachment member $66_7$ configure a revolute pair.

In addition, the attachment member $66_7$ is connected to an attachment member $66_2$ which is fixed to a part of the side wall of the −Y side wall of the hollow portion of the table TB through a spring member (pulling spring) $64_3$. In this case, the attachment member $66_7$ and the spring member (pulling spring) $64_3$ form a revolute pair, and the spring member (pulling spring) $64_3$ and the attachment member $66_2$ form a revolute pair.

In the Y driving unit having the above-described configuration, one end (driving point $68_0$) of the lever link $64_1$ is constantly pressed and contacted by the actuator 62 by the spring member (pulling spring) $64_3$. In addition, when the actuator 62 drives one end (driving point $68_0$) of the lever link $64_1$ in a direction (+X-axis direction) depicted by the white arrow of FIG. 25A while resisting the pressing and contacting force of the spring member $64_3$, the attachment member $66_7$ is driven in a direction (+Y-axis direction) depicted by the black arrow through the movable link $64_2$. That is, the auxiliary sheet holder $SH_2$ is driven in the +Y-axis direction together with the base $60_1$. In this case, the movement amount of the auxiliary sheet holder $SH_2$ is determined by a force generated by the actuator 62. In addition, as described above, the auxiliary sheet holder $SH_2$ is driven in the Z-axis direction together with the base $60_1$ by the Z driving unit disposed below the base $60_1$. However, in the below description, it will be described that the auxiliary sheet holder $SH_2$ is driven in the Z-axis direction by the base $60_1$. That is, the base $60_1$ is described as the Z driving unit.

The driving devices for the auxiliary sheet holder $SH_2$ provided in the +X-side end and the −Y-side end of the table TB have the similar configuration as the above-described holder driving device 60 being symmetric in the X axis.

A length between a force point $68_1$ and a support point $68_2$ of the lever link $64_1$ and a length between a support point $68_2$ and an operation point $68_3$ are, for example, 1 to 3. For this reason, when one end of the lever link $64_1$ is driven at the driving point $68_0$ in the +X-axis direction by 10 μm by the actuator 62 of the holder driving device 60 (driving mechanism 63), the bending portion (force point $68_1$) of the lever link $64_1$ is driven in the −Y-axis direction by 10 μm, and hence the other end (action point $68_3$) of the lever link $64_1$ is driven in the +Y-axis direction by 30 μm. Accordingly, it is possible to drive the auxiliary sheet holder $SH_2$ in the +Y-axis direction by 30 μm by using the holder driving device 60 (driving mechanism 63). In addition, in the state where both ends of the sheet S in the Y-axis direction are held by the pair of auxiliary sheet holders $SH_2$ disposed on the table TB while being distant from each other in the Y-axis direction, when the auxiliary sheet holders $SH_2$ are driven in a direction opposite to each other (a direction moving away from each other), it is possible to stretch the sheet S by 60 μm at maximum.

The driving devices for the auxiliary sheet holders $SH_2$ provided in the +Y side, the −Y side, and the −X-side end of the table TB have the similar configuration as the above-described holder driving device 60 being symmetric in the Y axis.

As described below, the auxiliary sheet holders $SH_2$ are used to assist the sheet holder $SH_1$ when the sheet S is flatly held by the sheet holder $SH_1$. In addition, in the +Y end on the base $60_1$, a rectangular-tray-shaped positioning member $60_2$ is fixed to the auxiliary sheet holder $SH_2$ while coming into contact therewith. The positioning member $60_2$ has a role of positioning the sheet S in the Y-axis direction by pressing the +Y end (or −Y end) of the sheet S when the sheet S is adsorbed and held by the holding surface of the auxiliary sheet holder $SH_2$.

As shown in FIG. 24B, the +X side surface and the −Y side surface of the table TB are subjected to mirror-like finishing so as to have reflection surfaces 17X and 17Y. The reflection surfaces 17X and 17Y are used to measure the position of the stage SST by using a stage interferometer system to be described later. In addition, instead of the above-described reflection surface 17Y, a moving mirror formed by a plane mirror can be fixed to the table TB. Further, instead of the reflection surface 17X, a moving mirror formed by a retro-reflector or a plane mirror can be fixed to the table TB.

As shown in FIG. 26, the stage interferometer system 18 (refer to FIG. 29) includes interferometers $18X_1$, $18X_2$, $18Y_1$, and $18Y_2$, and measures constantly the positional information (including the rotation information in the $\theta z$ direction) within the XY plane of the stage SST (table TB) while having, for example, a resolution of about 0.25 to 1 nm.

The interferometers $18X_1$, $18X_2$, and $18Y_1$, $18Y_2$ are disposed on the +X side and the −Y side of the projection optical system PL so as to face the reflection surfaces 17X and 17Y of the table TB.

The interferometers $18X_1$ and $18X_2$ measure the X position of the stage SST by emitting a length measurement beam parallel to the X axis to the reflection surface 17X of the table TB and receiving the reflected beam from the reflection surface 17X. The interferometers $18Y_1$ and $18Y_2$ measure the Y position of the stage SST by emitting two length measurement beams parallel to the Y axis to the reflection surface 17Y and receiving the reflected beam from the reflection surface 17Y. Here, one of two length measurement beams of the interferometer $18Y_2$ is emitted to the reflection surface 17Y along the light path parallel to the Y axis perpendicular to the light axes $AX_1$, $AX_3$, and $AX_5$, and the other thereof is emitted to the reflection surface 17Y along the light path parallel to the Y axis perpendicular to the light axes $AX_2$ and $AX_4$. In addition, the two light measurement beams of the interferometer $18Y_1$ are emitted to the reflection surface 17Y along two light paths parallel to the Y axis passing the detection center of each of alignment systems $AL_{11}$ and $AL_{12}$ to be described later.

The measurement information of the stage interferometer system 18 (interferometers $18X_1$, $18X_2$, $18Y_1$, and $18Y_2$) is supplied to the main control device 50 (refer to FIG. 29). In addition, when the stage SST is located on the base member BS, at least one of the length measurement beams of the interferometers $18Y_1$ and $18Y_2$ is emitted to the reflection surface 17Y of the stage SST regardless of the X position thereof. Accordingly, the main control device 50 uses any one of the measurement information of the interferometers $18Y_1$ and $18Y_2$ in accordance with the X position of the stage SST. In addition, the main control device 50 measures the rotation in the $\theta z$ direction of the stage SST on the basis of the measurement information of the interferometers $18X_1$ and $18X_2$.

In addition, as the interferometers $18X_1$, $18X_2$, $18Y_1$, and $18Y_2$, a multi-axis interferometer which emits a plurality of length measurement beams distant from each other in the Z-axis direction can be used. In this case, the main control device 50 can obtain the inclination information (the pitching amount (the rotation amount $\theta x$ in the $\theta X$ direction) and the rolling amount (the rotation amount $\theta y$ in the $\theta y$ direction)) with respect to the XY plane in addition to the positional information (rotation information (including yawing amount (the rotation amount $\theta z$ in the $\theta Z$ direction))) within the XY plane of the stage SST (table TB).

As shown in FIGS. 21 and 26, the sheet transporting system 40 includes four transportation roller portions 41 to 44 which are arranged in the X-axis direction across the projection optical system PL and a clamper portion 45.

As shown in FIGS. 27A to 27G, each of the transportation roller portions 41, 42, 43, and 44 includes a pair of a pressure roller and a driving roller located at the upper and lower positions. In the driving rollers $41_2$, $42_2$, $43_2$, and $44_2$ located at the lower position, both ends thereof are rotatably supported by support members (not shown) so that the upper ends thereof are slightly located at the upper position (+Z side) of the upper surface (the holding surface of the sheet holder $SH_1$) of the stage SST (refer to FIG. 21). The driving rollers $41_2$, $42_2$, $43_2$, and $44_2$ are rotationally driven by a rotation motor (not shown). The pressure rollers $41_1$, $42_1$, $43_1$, and $44_1$ located at the upper position are pressed and contacted by the corresponding driving rollers from the upper side (+Z side) by a spring mechanism (not shown).

Figure 27A:
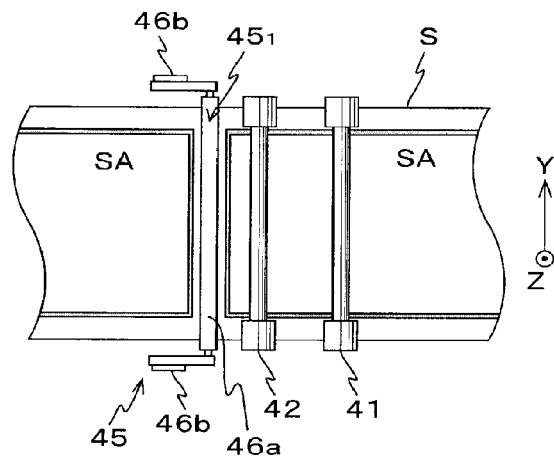
FIG. 27A is a plan view showing the vicinity of transportation roller portions 41 and 42.
Figure 27B:
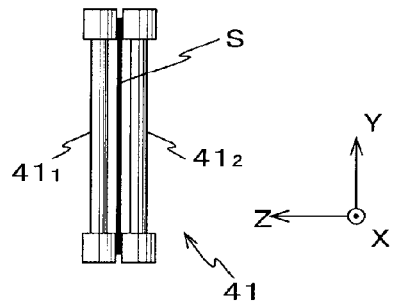
FIG. 27B is a side view showing the transportation roller portion 41.

However, as shown in FIG. 27B by adopting the transportation roller portion 41, the pressure roller $41_1$ and the driving roller $41_2$ are formed as a stepped cylindrical shape of which a diameter of a portion other than both ends in the longitudinal direction is smaller than those of the both ends.

For this reason, in each of the transportation roller portions 41, 42, 43, and 44, as shown in FIG. 27B by adopting the representative transportation roller portion 41, the sheet S is sandwiched by both ends of the pressure roller ($41_1$) and the driving roller ($41_2$) so that that the rollers do not come into contact with the separate area where the pattern is formed on the surface of the sheet S. In each of the transportation roller portions 41, 42, 43, and 44, it is possible to set a first state where the sheet S can be sandwiched between the pressure roller ($41_1$) and the driving roller ($41_2$) and a second state where the operation of sandwiching the sheet S can be released by separating the pressure roller ($41_1$) from the driving roller ($41_2$) while resisting the pressing force of the spring mechanism. In each of the transportation roller portions 41, 42, 43, and 44, the selection of the first state and the second state is performed by the main control device 50. In addition, the driving roller coming into contact with the rear surface of the sheet S can be a cylindrical roller having uniform diameter.

The rotation and the stopping of the driving rollers $41_2$, $42_2$, $43_2$, and $44_2$ are controlled by the main control device 50 together with the rollers $40_1$ and $40_2$. As shown in FIG. 27B by adopting the representative transportation roller portion 41, when the driving roller ($41_2$) is rotated about the axis parallel to the Y axis (and the pressure roller $41_1$ is rotated in the reverse direction) in the first state of the transportation roller portion, the sheet S is transported in the rotation direction.

Figure 27C:
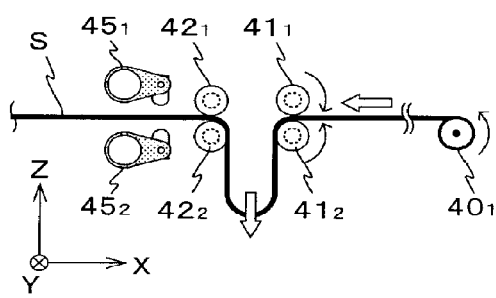
FIGS. 27C to 27G are diagrams illustrating a function of the sheet transporting system.
Figure 27D:
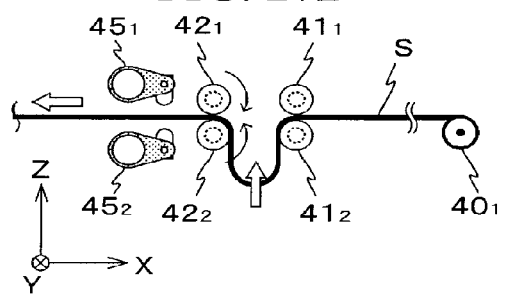

In the sheet transporting system 40, as shown in FIG. 27C, the rollers $41_1$ and $41_2$ of the transportation roller portion 41 are rotated in a direction depicted by the arrow, so that the sheet S is drawn out in the −X-axis direction depicted by the white arrow from the roller $40_1$ and is transported toward the transportation roller portion 42. Here, when the rotation of the rollers $42_1$ and $42_2$ of the transportation roller portion 42 is stopped at a predetermined timing, the sheet S having a predetermined length (a degree corresponding to a distance between the transportation roller portions 42 and 43) is bent in a loop shape between the transportation roller portions 41 and 42. In addition, in the sheet transporting system 40, as shown in FIG. 27D, the rollers $42_1$ and $42_2$ of the transportation roller portion 42 (and the rollers $43_1$ and $43_2$ of the transportation roller portion 43) are rotated in a direction depicted by the arrow in the state where the rotation of each of the rollers $41_1$ and $41_2$ of the transportation roller portion 41 is stopped, so that the sheet S bent in a loop shape is transported in the −X-axis direction depicted by the white arrow toward an area directly below the projection optical system PL.

Figure 27E:
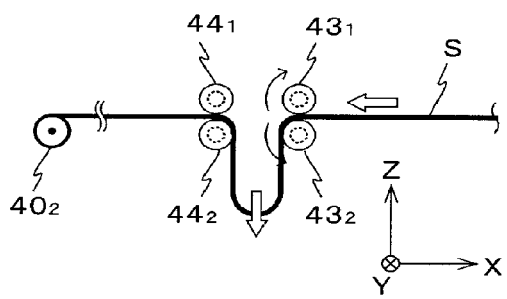
Figure 27F:
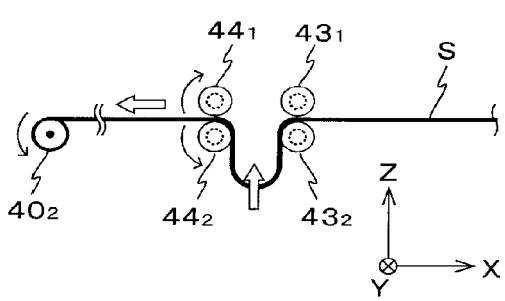

In the sheet transporting system 40, as described above, the sheet S is drawn out from the area directly below the projection optical system PL by means of the rotation and the stopping of each of the rollers of the transportation roller portions 43 and 44. That is, as shown in FIG. 27E, when each of the rollers $43_1$ and $43_2$ of the transportation roller 43 is rotated in a direction depicted by the arrow in the state where the rotation of each of the rollers $44_1$ and $44_2$ of the transportation roller portion 44 is stopped, the sheet S is drawn out to the area directly below the projection optical system PL, and the drawn sheet S is bent in a loop shape between the transportation roller portions 43 and 44. Then, as shown in FIG. 27F, when each of the rollers $44_1$ and $44_2$ of the transportation roller portion 44 is just rotated in a direction depicted by the arrow in the state where the rotation of each of the rollers $43_1$ and $43_2$ of the transportation roller portion 43 is stopped, the sheet S bent in a loop shape is transported to the −X side of the transportation roller portion 44, and is wound on the winding roller $40_2$.

As shown in FIG. 27A and the like, the damper portion 45 is provided on the −X side of the transportation roller portion 42. The clamper portion 45 includes a pair of damper members $45_1$ and $45_2$ capable of setting a first state where the sheet S is sandwiched in the up/down direction and a second state where the sandwiching operation is released.

The upper clamper member $45_1$ includes a cylindrical roller 46a which has a length slightly longer than the width of the sheet S and is disposed along the Y-axis direction, and a pair of arm members 46b which rotatably supports both ends of the roller 46a. The pair of arm members 46b is supported by a support member (not shown) so as to be rotatable about a rotation shaft parallel to the Y axis. In addition, the roller 46a is attached to the rotation end of the pair of arm members 46b. Accordingly, when the clamper member $45_1$ is rotated about the rotation shaft of the pair of arm members 46b in the clockwise direction, the roller 46a comes into contact with the surface of the sheet S (refer to FIG. 27G). When the damper member is rotated about the rotation shaft of the pair of arm members 46b in the counter-clockwise direction, the roller 46 moves away from the sheet S.

The lower clamper member $45_2$ is symmetric to the clamper member $45_1$ in the up/down direction, and has the similar configuration. The changeover of the state of the damper portion 45 is performed by the main control device 50.

Figure 27G:
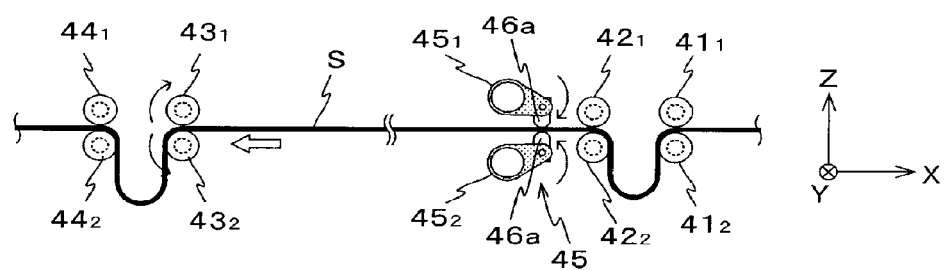

In the sheet transporting system 40, as shown in FIG. 27G the pair of the damper members $45_1$ and $45_2$ of the clamper portion 45 is set to the first state, so that the sheet S is restrained (fixed) by the pair of damper members $45_1$ and $45_2$. Also, when each of the rollers of the transportation roller portion 43 is rotated in a direction in which the sheet S is transported in the state where the rotation of each of the rollers of the transportation roller portions 41 and 42 is stopped, a predetermined tension is applied to a portion between the transportation roller portion 43 and the damper portion 45 of the sheet S in the X-axis direction and the sheet S is stretched.

Here, as shown in FIG. 27A, the main control device 50 restrains (fixes) the sheet S so that the roller 46a does not come into contact with the separate area portion where the pattern is formed on the surface of the sheet S, that is, the rollers 46a of the pair of damper members $45_1$ and $45_2$ of the damper portion 45 come into contact with an area between the adjacent separate areas of the sheet S. The sheet S stretched in this manner is adsorbed and held by the sheet holder $SH_1$ on the stage SST.

The sheet transporting system 40 further includes a measurement device (not shown) which measures the transportation amount of the sheet S, for example, a rotary encoder and the like which measure the rotation amount of each of the driving rollers $41_2$, $42_2$, $43_2$, and $44_2$.

In addition, the operation of transporting the sheet S, the operation of holding the sheet S on the stage SST, and the like using the sheet transporting system 40 during the exposure process will be described later in detail.

Further, in the exposure device 1000 of the embodiment, a plurality of (herein, twelve) off-axis type alignment systems $AL_1$ to $AL_{12}$ is provided so as to detect the alignment marks attached to the separate areas on the sheet S. As shown in FIG. 26, the alignment systems $AL_1$ to $AL_6$ are provided at the position of the +X side of the projection optical system PL along the X axis so as to face the area of the +Y-side end on the outside of the separate area on the sheet S. In addition, as shown in FIG. 26, the alignment systems $AL_7$ to $AL_{12}$ are disposed so as to be symmetric to the alignment systems $AL_1$ to $AL_6$ with respect to the X axis perpendicular to the light axis of the projection area $IA_3$. The alignment systems $AL_7$ to $AL_{12}$ can be disposed so as to face the area of the −Y-side end on the outside of each separate area on the sheet S.

In the embodiment, as an example, as shown in FIG. 28, six alignment marks AM (twelve in total) are provided in each area on the outside of the Y-axis direction of each separate area $SA_i$ on the sheet S, and the alignment systems $AL_1$ to $AL_{12}$ are provided so as to individually and simultaneously detect the twelve alignment marks AM. Accordingly, the present invention is not limited thereto, and when the alignment systems are movable in the X-axis direction, at least one alignment system can be provided instead of the alignment systems $AL_1$ to $AL_6$, and at least one alignment system can be provided instead of the alignment systems $AL_7$ to $AL_{12}$.

As the alignment systems $AL_1$ to $AL_{12}$, an exemplary image process type FIA (Field Image Alignment) system is adopted. The detection result (the image information of the index mark and the detection target mark) of the alignment systems $AL_1$ to $AL_{12}$ are transmitted to the main control device 50 through an alignment signal process system (not shown). In addition, the present invention is not limited to the FIA. An alignment sensor, which emits coherent detection light to the target mark and detects the scattered light or the diffracted light generated from the target mark or detects two beams of diffracted light (for example, the same homogeneous number) generated from the target mark through the interference, can be solely used or appropriately combined.

FIG. 29 is a block diagram showing an input/output relationship of the main control device 50 which generally controls the constituents of the control system of the exposure device 1000.

Next, the sequence of the exposure operation for the sheet S using the stage SST in the exposure device 1000 of the embodiment will be described with reference to FIGS. 30 to 38. In addition, the operation is described with reference to a plurality of drawings, but the reference numerals can be given or not given to the same constituents for each of the drawings. That is, there is a difference in the mark of the reference numerals in each of the drawings, but the configuration is the same regardless of the mark of the reference numerals of the drawings. The same applies to the drawings which have been used for the description.

Figure 30:
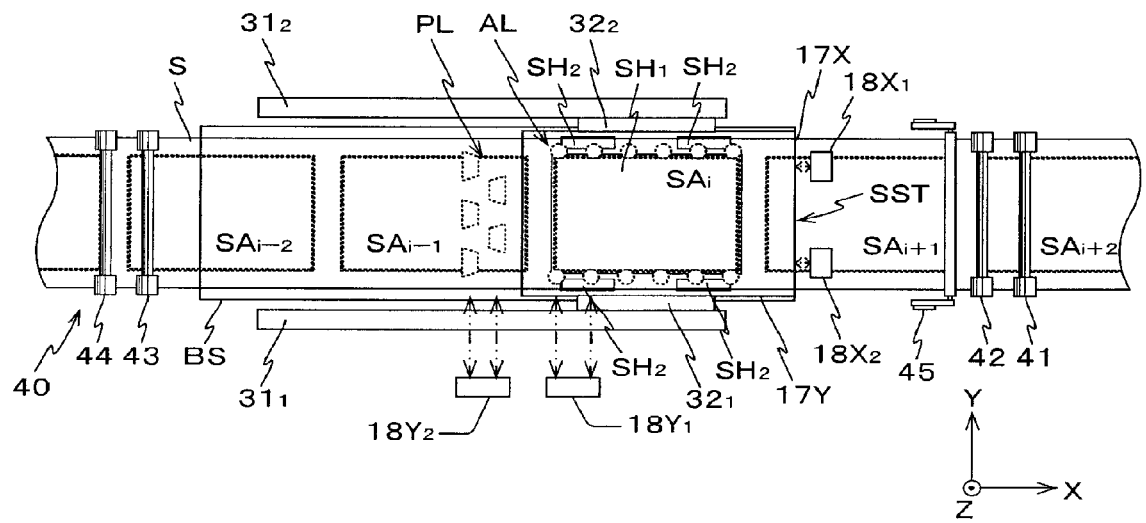
FIG. 30 is a (first) diagram illustrating a sequence of an exposure operation for the sheet in the exposure device of FIG. 21.

FIG. 30 shows a state where the exposure for the first (i−1) number of the separate areas $SA_1$ to $SA_{i-1}$ among the plurality of separate areas arranged on the sheet S is completed, and the exposure for the subsequent separate area $SA_i$ is about to be started. In the state of FIG. 30, the stage SST used for the movement of the sheet S during the exposure for the separate area $SA_i$ stays at the position (standby position) of the +X end on the base member BS.

In addition, since the load and the mask alignment (the positioning operation of the mask) of the mask M on the mask stage MST are generally performed before the start of the exposure for the first separate area $SA_1$ on the sheet S, in the state of FIG. 30, the load and the mask alignment of the mask M are of course completed. In addition, it is assumed that the mask stage MST is moved to the scanning start position (acceleration start position) for the exposure of the separate area $SA_i$.

p. First, the center portion of the sheet S including the separate area $SA_i$ is held onto the stage SST in accordance with the following sequence of p1 to p4.

p1. In detail, for example, as described above with reference to FIG. 27C, the main control device 50 stops the rotation of each of the rollers of the transportation roller portion 42 of the sheet transporting system 40 and then rotates each of the rollers of the transportation roller portion 41 so as to draw out the sheet S from the roller $40_1$. Alternatively, the main control device 50 stops the rotation of each of the rollers of the transportation roller portions 43 and 41 and then reversely rotates the transportation roller portion 42 so as to draw back the sheet S to the area directly below the projection optical system PL. Anyway, the sheet S having a predetermined length is bent in a loop shape between the transportation roller portions 41 and 42. The predetermined length is a length corresponding to a distance between the transportation roller portions 42 and 43.

p2. Next, the main control device 50 controls the sheet transporting system 40 on the basis of the positional information of the stage SST obtained from the stage interferometer system 18 ($18X_1$, $18X_2$, $18Y_1$, and $18Y_2$) so as to position the separate area $SA_i$ on the sheet S onto (the holding surface of) the sheet holder $SH_1$ of the stage SST. Here, as described above with reference to FIG. 27G the main control device 50 restrains (fixes) the sheet S by sandwiching a portion between the separate area $SA_{i+1}$ and $SA_{i+2}$ of the sheet S using the clamper portion 45 and rotates each of the rollers of the transportation roller portion 43 in the state where the rotation of each of the rollers of the transportation roller portions 41, 42, and 44 is stopped, so that a predetermined tension is applied to the sheet S in the X-axis direction so as to be stretched between the clamper portion 45 and the transportation roller portion 43. The main control device 50 further minutely drives the stage SST so as to position (the holding surface of) the sheet holder $SH_1$ to the separate area $SA_i$ on the sheet S. In addition, in this state, a minute space is formed between the sheet S and (the holding surface of) the sheet holder $SH_1$ of the stage SST.

In the state where the sheet S is positioned with respect to the stage SST at the standby position, the alignment marks AM attached to the separate area $SA_i$ are positioned within the detection visual field of each of the alignment systems $AL_1$ to $AL_{12}$.

p3. After the positioning operation, the main control device 50 minutely drives four auxiliary sheet holders $SH_2$ on the table TB through the base 60; in the +Z-axis direction while horizontally holding the table TB of the stage SST through the stage driving system SSD (Z-leveling device 38), so that the rear surfaces of the external portions on the ±Y sides of the separate area $SA_i$ of the sheet S are adsorbed and held by four auxiliary sheet holders $SH_2$.

Figure 31:
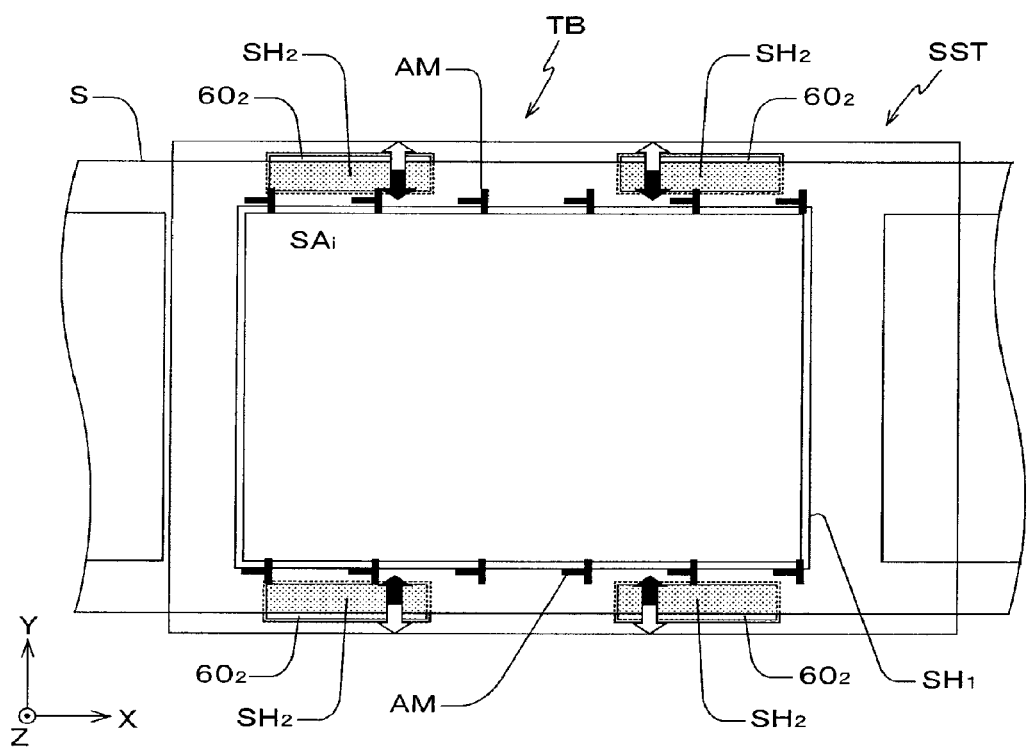
FIG. 31 is a diagram illustrating a temporary holding state of the sheet using an auxiliary sheet holder.
Figure 32:
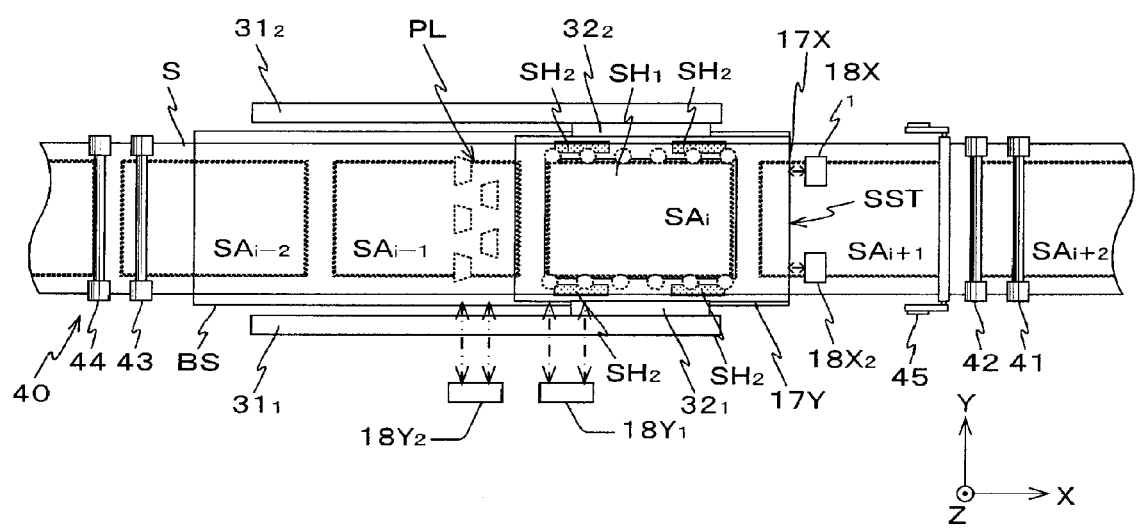
FIG. 32 is a (second) diagram illustrating a sequence of the exposure operation for the sheet in the exposure device of FIG. 21.
Figure 33:
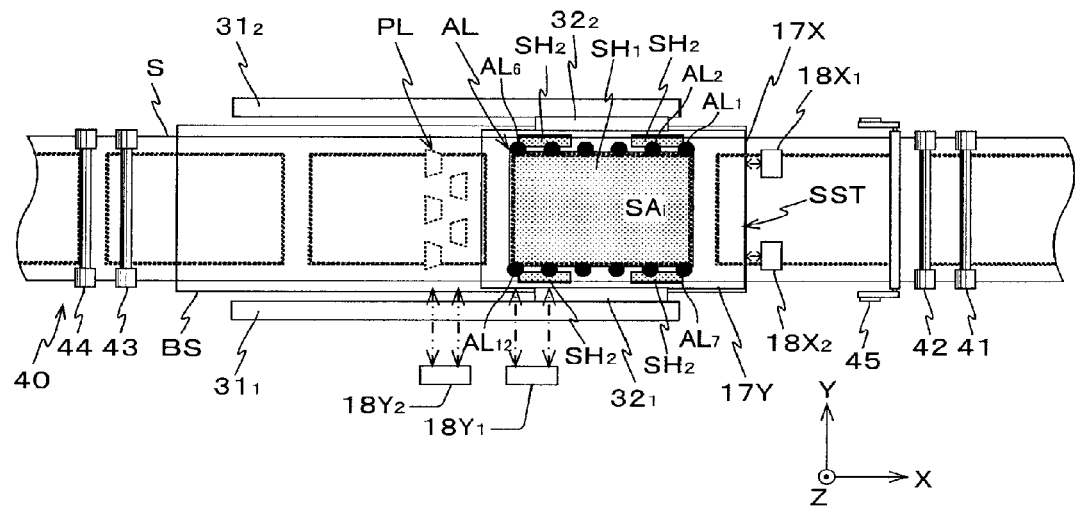
FIG. 33 is a (third) diagram illustrating a sequence of the exposure operation for the sheet in the exposure device of FIG. 21.

In detail, as shown in FIG. 31, the main control device 50 minutely drives two auxiliary sheet holders $SH_2$ respectively disposed in the +Y-side end and the −Y-side end on the table TB in a direction (+Y-axis direction or −Y-axis direction) depicted by the white arrow so as to widen the distance between the auxiliary sheet holders $SH_2$ distant from each other in the Y-axis direction on the table TB. In addition, the main control device 50 drives each of the auxiliary sheet holders $SH_2$ in the +Z-axis direction through the base $60_1$ so that the rear surfaces of both ends in the Y-axis direction of the sheet S come into contact with the holding surfaces of four auxiliary sheet holders $SH_2$. After the contact, the main control device 50 minutely drives two auxiliary sheet holders $SH_2$ on the +Y side in the −Y-axis direction depicted by the black arrow so as to firmly press the positioning member $60_2$ against the +Y end of the sheet S, and minutely drives two auxiliary sheet holders $SH_2$ on the −Y side in the +Y-axis direction depicted by the black arrow so as to firmly press the positioning member $60_2$ against the −Y end of the sheet S, thereby positioning the sheet S. After the positioning operation, the main control device 50 allows the rear surfaces of both ends of the sheet S in the Y-axis direction to be adsorbed and held by four auxiliary sheet holders $SH_2$. FIG. 32 shows a state where the sheet S is temporarily held by the auxiliary sheet holder $SH_2$.

p4. After the temporary holding operation of the sheet S, the main control device 50 minutely drives each of four auxiliary sheet holders $SH_2$ in the −Z-axis direction through the base $60_1$ in the state where the sheet S is temporarily held so as to allow the rear surface of the center portion of the sheet S including the separate area $SA_i$ to come into contact with the holding surface of the sheet holder $SH_1$. Then, the main control device 50 positions the holding surface of each of the four auxiliary sheet holders $SH_2$ so as to be located on the slightly lower side (−Z side) of the holing surface of the sheet holder $SH_1$. Accordingly, an appropriate tension is applied to the sheet S in at least the Y-axis direction, so that the center portion of the sheet S is fixed to the holding surface of the sheet holder $SH_1$. In this state, the main control device 50 adsorbs and holds the sheet S onto the sheet holder $SH_1$ as shown in FIG. 32. Accordingly, the center portion of the sheet S including the separate area $SA_i$ is flatly held onto the stage SST so as to be parallel to the XY plane.

q. Next, the alignment measurement for the sheet S is performed in accordance with the following sequences q1 to q5.

q1. As described above, in the state where the stage SST is positioned to the standby position, the alignment marks attached to the separate area $SA_i$ are positioned within the detection visual field of each of the alignment systems $AL_1$ to $AL_{12}$. Here, as shown in FIG. 33, the main control device 50 detects the alignment marks attached to the separate area $SA_i$ on the sheet S by using the alignment systems $AL_1$ to $AL_{12}$ (the positions of the alignment marks are measured on the basis of the index center). In addition, the main control device 50 obtains the position coordinates of twelve alignment marks on the XY coordinate on the basis of the detection result of the alignment marks and the positional information of the stage SST obtained from the stage interferometer system 18 through the detection.

q2. Next, the main control device 50 determines whether the contraction amount inside the separate area $SA_i$ having the pattern of the sheet S in the Y-axis direction is within a predetermined range on the basis of the position coordinates of the twelve alignment marks obtained.

q3. Then, as a result, for example, when it is determined that a contraction in the Y-axis direction exceeding a predetermined range occurs in at least a part inside the separate area $SA_i$, the operation of adsorbing and holding the sheet S using the sheet holder $SH_1$ is released, and the auxiliary sheet holder $SH_2$ is driven through the base $60_1$ in the +Z-axis direction so as to separate the rear surface of the sheet S from the holding surface of the sheet holder $SH_1$.

Figure 34:
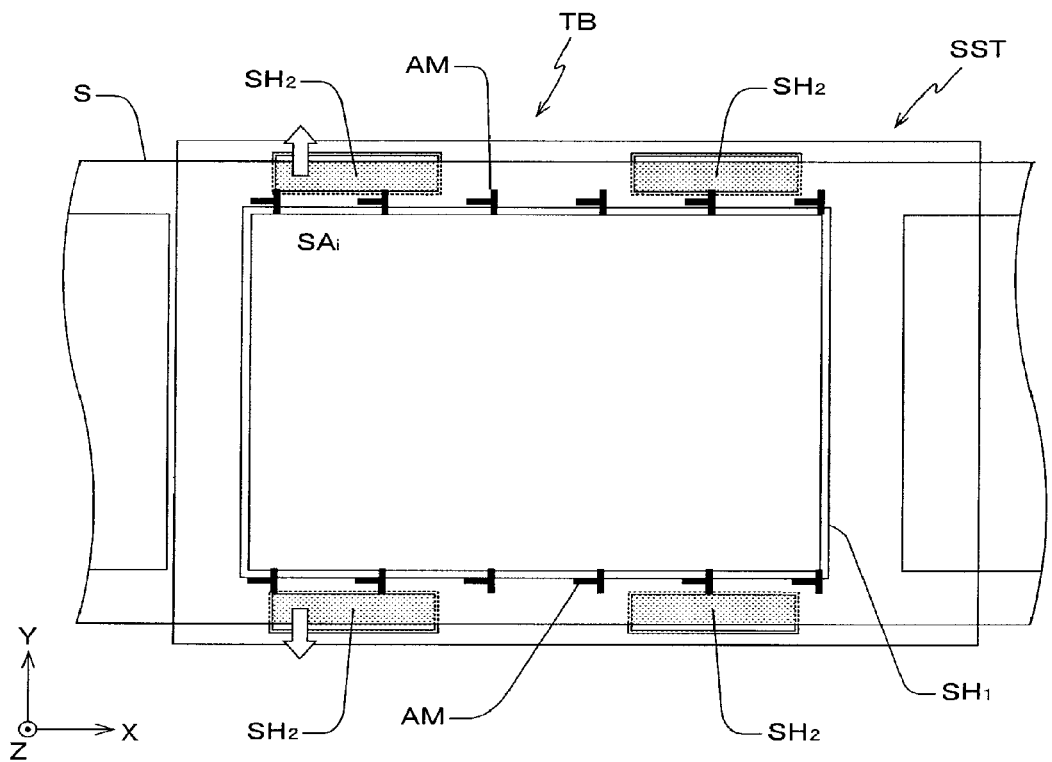
FIG. 34 is a diagram illustrating a positional alignment of the sheet using the auxiliary sheet holder.

Here, for example, when it is determined that the −X end inside the separate area $SA_i$ is contracted more than a predetermined range in the Y-axis direction, as shown in FIG. 34, two auxiliary sheet holders $SH_2$ on the −X side on the table TB are driven in a direction (depicted by the white arrow in FIG. 34) moving away from each other, so that a tension in the Y-axis direction is further applied to the −X side end of the separate area $SA_i$ of the sheet S and the distortion of the pattern is corrected (adjusted).

After the adjustment, the main control device 50 drives each of the auxiliary sheet holders $SH_2$ through the base $60_1$ in the −Z-axis direction so that the rear surface of the sheet S comes into contact with the holding surface of the sheet holder $SH_1$ to be adsorbed and held thereon again.

q4. Then, the main control device 50 detects the alignment marks attached to the separate area $SA_i$ on the sheet S by using the alignment systems $AL_1$ to $AL_{12}$, and obtains the position coordinates of twelve alignment marks on the XY coordinates again on the basis of the detection result and the positional information of the stage SST obtained from the stage interferometer system 18 through the detection.

q5. Then, the main control device 50 performs a predetermined calculation of least squares by using all or a part of the position coordinates of the twelve alignment marks, and obtains the distortion, that is, the XY shift, the rotation, the XY scaling, and the perpendicularity of the pattern formed on the separate area $SA_i$ on the sheet S.

Here, when it is determined that no contraction exceeding a predetermined ratio in the Y-axis direction occurs in a part of the inside of the separate area $SA_i$ as a detection result of q2, the main control device 50 skips the processes of q3 and q4, and performs the process of q5.

Subsequently, the main control device 50 releases the operation of fixing the sheet S using the clamper 45.

Figure 35:
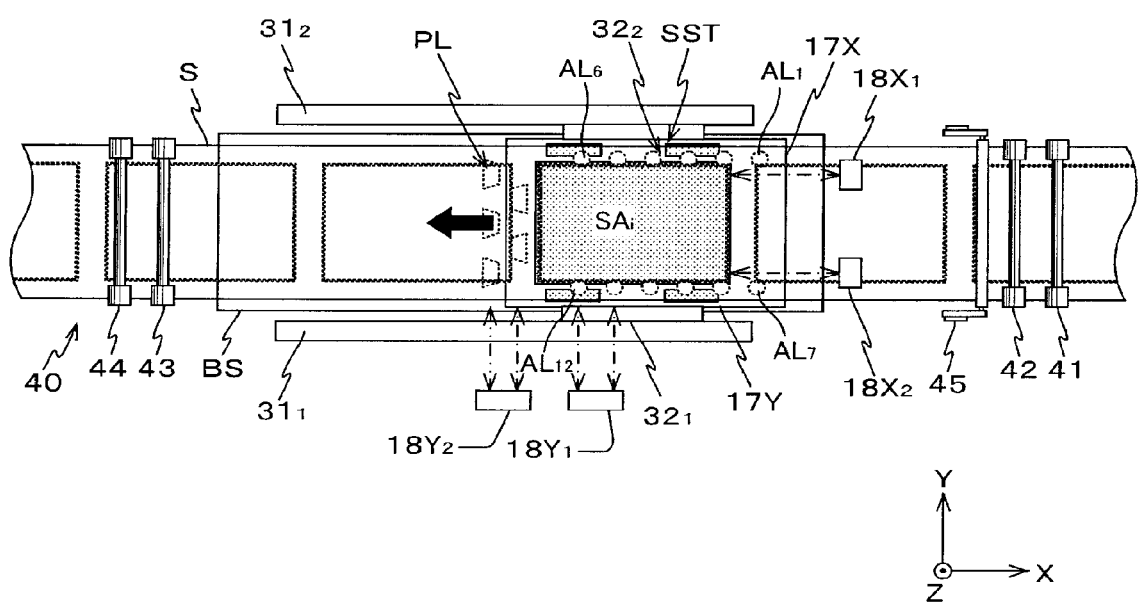
FIG. 35 is a (fourth) diagram illustrating a sequence of the exposure operation for the sheet in the exposure device of FIG. 21.
Figure 36:
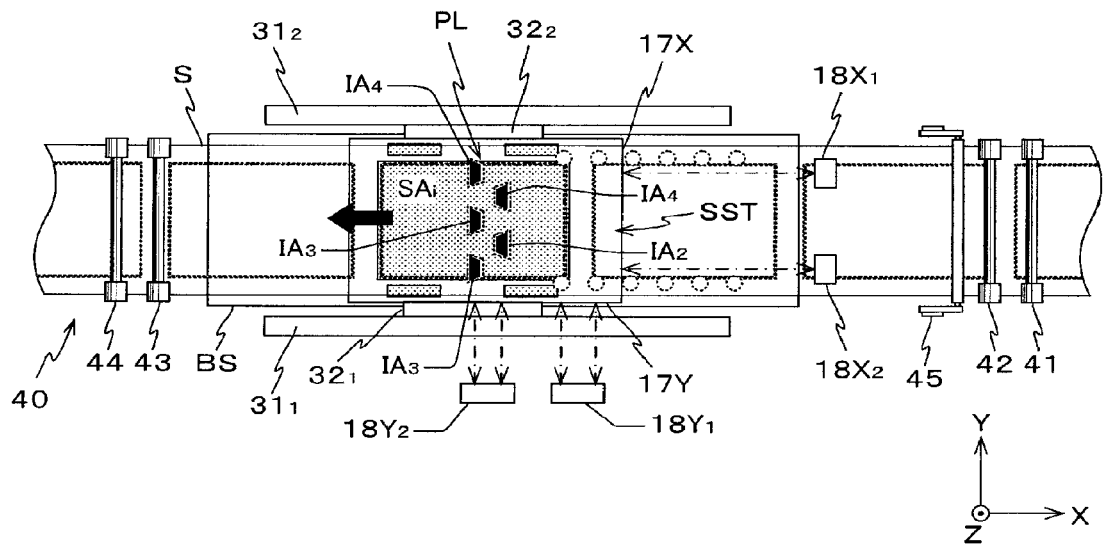
FIG. 36 is a (fifth) diagram illustrating a sequence of the exposure operation for the sheet in the exposure device of FIG. 21.

In addition, when the number of the alignment systems is fewer than the number of the alignment marks to be detected, it is necessary to perform the alignment measurement while stepwise moving the stage SST holding the sheet S in the X-axis direction. At this time, the main control device 50 controls the rotation and the stopping of each of the driving rollers of the sheet transporting system 40 in accordance with the movement of the stage SST.

r. Next, the scanning exposure for the separate area $SA_i$ on the sheet S is performed.

r1. In detail, the main control device 50 moves the stage SST holding the sheet S to the scanning start position (acceleration start position) for the exposure on the basis of the result of the alignment measurement, and particularly, the XY shift so as to perform a positioning operation with respect to the mask stage MST holding the mask M. Here, in the embodiment, since the acceleration start position of the stage SST is set to the same position (or the vicinity thereof) as the above-described standby position, the minute adjustment of the position of the stage SST within the XY plane is performed.

r2. Next, the main control device 50 starts the acceleration of the stage SST in the scanning direction (−X-axis direction). Accordingly, the movement of the stage SST in the −X-axis direction is started. During the movement, and particularly, before the acceleration end of the stage SST, as shown in FIG. 35, the length measurement beam from the interferometer $18Y_2$ starts to collide with the reflection surface 17Y. Accordingly, immediately after the collision of the length measurement beam, the main control device 50 changes the laser interferometer for measuring the Y position of the stage SST from the interferometer $18Y_1$ to the interferometer $18Y_2$.

r3. Then, when the acceleration operations of both stages SST and MST end, and the acceleration operations of both stages SST and MST are synchronized with uniform speed, the pattern area on the mask M starts to be illuminated by the illumination light $IL_2$ and $IL_4$, thereby starting the exposure. Then, in accordance with the synchronization movement with uniform speed of both stages SST and MST, as shown in FIG. 36, the illumination areas $IAM_1$ to $IAM_5$ (refer to FIG. 22) on the mask M are illuminated by the illumination light $IL_1$ to $IL_5$, and the partial images of the patterns inside the illumination areas $IAM_1$ to $IAM_5$ are projected onto the projection areas $IA_1$ to $IA_5$ on the sheet S held on the stage SST through the projection optical systems $PL_1$ to $PL_5$ (refer to FIG. 23).

When the entire area of the pattern area of the mask M is illuminated by the illumination light $IL_1$ to $IL_5$, that is, the pattern area of the mask M passes through the illumination areas $IAM_1$ to $IAM_5$, the scanning exposure for the separate area $SA_i$ is completed. Accordingly, the pattern of the mask M is transferred to the separate area $SA_i$. That is, a latent image of the pattern of the mask M is formed on the resist layer formed on the surface of the sheet S.

During the scanning exposure, the main control device 50 drives the table TB of the stage SST in the Z-axis direction while horizontally maintaining the table, so that the surface of the sheet S held on the table TB (sheet holder SW is positioned to the focal position (within the focal depth) of the projection optical system PL. In addition, during the scanning exposure, the main control device 50 controls the synchronization driving state (the relative position and the relative speed) of the stage SST and the mask stage MST on the basis of the result of the alignment measurement so as to correct the distortion of the entire image of the pattern projected onto the sheet S. Further, the main control device 50 controls the driving state of the optical element group (lens group) constituting the projection optical systems $PL_1$ to $PL_5$ through the lens controller LC so as to correct the distortion of the partial image of the pattern projected onto the projection areas $IA_1$ to $IA_5$ on the sheet S. Accordingly, the projection image of the pattern of the mask M is highly precisely overlapped with the pattern formed within the separate area $SA_i$.

Figure 37:
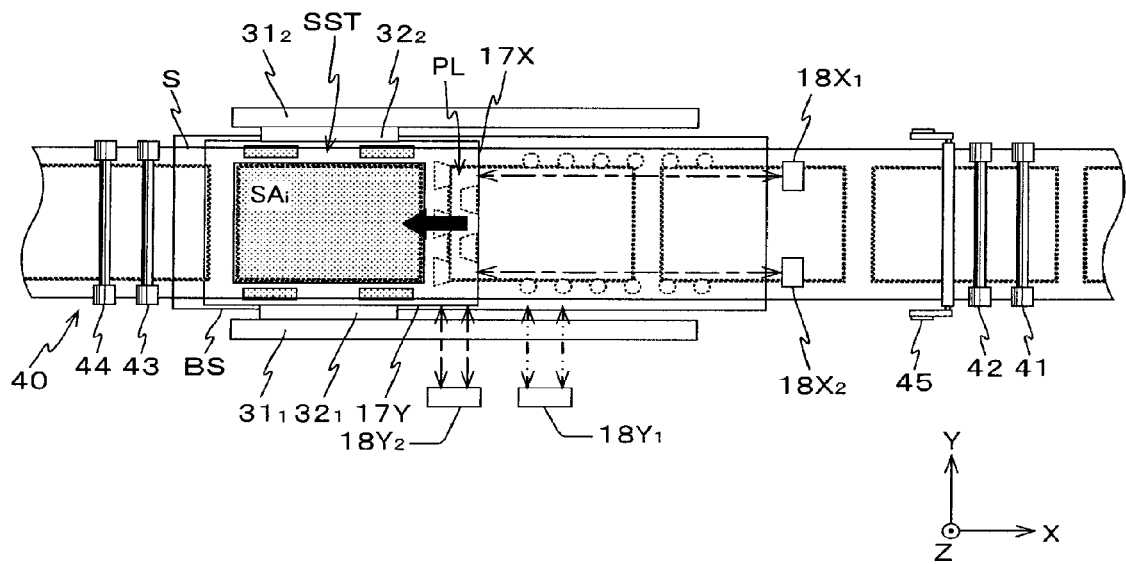
FIG. 37 is a (sixth) diagram illustrating a sequence of the exposure operation in the exposure device of FIG. 21.

After the scanning exposure for the separate area $SA_i$ is completed, both stages SST and MST are decelerated. As shown in FIG. 37, when they arrive at the scanning end position (deceleration end position), they are stopped. In addition, in the embodiment, the deceleration end position of the stage SST during the scanning operation is determined so as to be aligned to the −X end of the base member BS.

Figure 38:
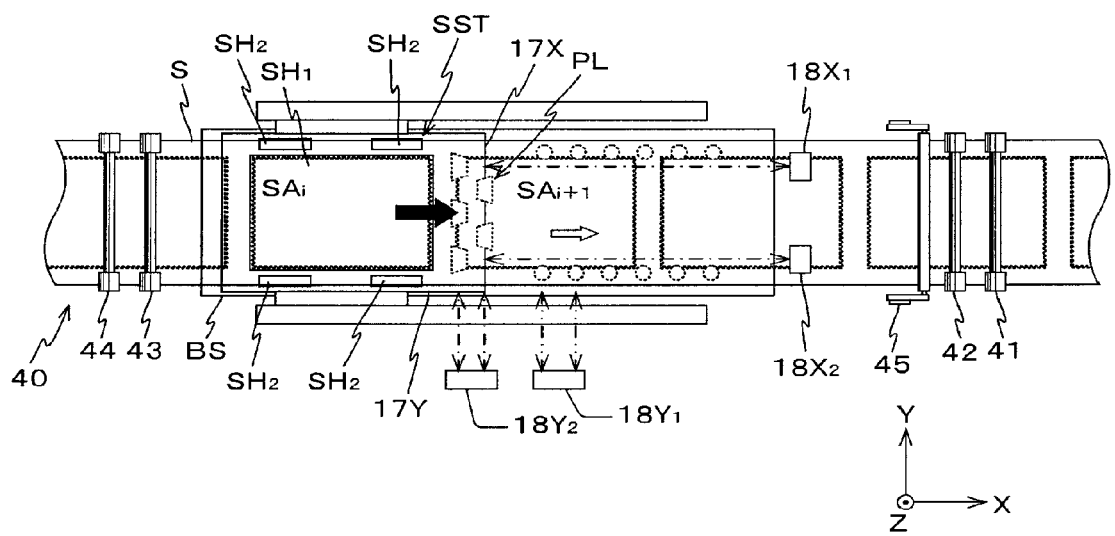
FIG. 38 is a (seventh) diagram illustrating a sequence of the exposure operation in the exposure device of FIG. 21.
Figure 39:
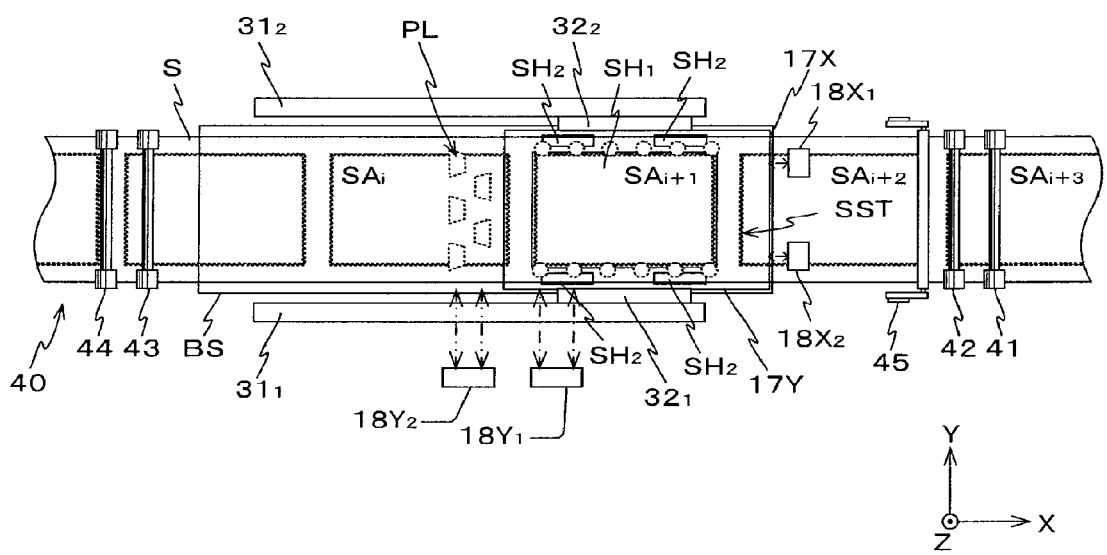
FIG. 39 is an (eighth) diagram illustrating a sequence of the exposure operation in the exposure device of FIG. 21.

In addition, when the main control device 50 drives the stage SST holding the sheet S in the −X-axis direction during the scanning exposure, as described above, the main control device appropriately rotates or stops each of the driving rollers of the sheet transporting system 40 in accordance with the movement of the stage SST so that the movement of the stage SST is not disturbed by a tension applied to the sheet S.

s. As shown in FIG. 37, when the stage SST is stopped at the −X end as the deceleration end position in front of the base member BS, the main control device 50 releases the operation of adsorbing and holding the sheet S using the sheet holder $SH_1$ and the sheet holder $SH_2$ so as to release the sheet S from the stage SST. Further, the main control device 50 retreats the table TB of the stage SST downward (in the −Z-axis direction). Accordingly, the sheet S is stretched between the transportation roller portions 42 and 43 with a minute space with respect to the sheet holder $SH_1$ of the stage SST.

t. After the sheet S is released, as shown in FIG. 38, the main control device 50 drives the sheet stage SST in the +X-axis direction depicted by the black arrow so as to be returned to the above-described standby position of the +X end on the base member BS. Here, in accordance with the X position of the sheet stage SST, the interferometer for measuring the Y position is changed from the interferometer $18Y_2$ to the interferometer $18Y_1$. In addition, the main control device 50 drives the mask stage MST to return to the scanning start position (acceleration start position) at a high speed. Further, in addition to the operation of driving the stage, the main control device 50 pulls back the sheet S in the +X-axis direction depicted by the white arrow as shown in FIG. 38.

u. The returning driving operation of the stage SST and the mask stage MST and the operation of pulling back the sheet S are completed, as shown in FIG. 39, the stage SST stays at the standby position, and the center portion of the sheet S including the subsequent separate area $SA_{i+1}$ is positioned to the surface of the stage SST staying at the standby position. This state is the same as that shown in FIG. 30 except that one separate area of the sheet S has transported.

Subsequently, the main control device 50 starts the exposure for the separate area $SA_{i+i}$ as in the former case. Subsequently, in the same manner, the main control device 50 repeats the above-described sequences p to u so as to perform an exposure for all separate areas on the sheet S.

As described above in detail, the main control device 50 restrains (fixes) the sheet S by sandwiching a portion between the separate area $SA_{i+1}$ and $SA_{i+2}$ of the sheet S using the clamper portion 45 of the sheet transporting system 40 and rotates each of the rollers of the transportation roller portion 43 in the state where the rotation of each of the rollers of the transportation roller portions 41, 42, and 44 is stopped, so that a predetermined tension is applied to the sheet S in the X-axis direction so as to be stretched between the damper portion 45 and the transportation roller portion 43. Then, after the sheet S is temporarily held by four auxiliary sheet holders $SH_2$, the four auxiliary sheet holders $SH_2$ temporarily holding the sheet S are minutely driven in the −Z direction by the main control device 50, so that the rear surface of the center portion of the sheet S including the separate area $SA_i$ comes into contact with the holding surface of the sheet holder $SH_1$. Then, the holding surfaces of four auxiliary sheet holders $SH_2$ are positioned on the slightly lower side (−Z side) of the holding surface of the sheet holder $SH_1$ by the main control device 50, so that an appropriate tension is applied to the sheet S in the width direction (Y-axis direction) and the center portion of the sheet S is fixed to the holding surface of the sheet holder $SH_1$. That is, in the state where an XY two-dimensional tension is applied to the separate area $SA_i$ of the sheet S, the rear surface portion corresponding to the separate area $SA_i$ of the sheet S is changed in accordance with the flat shape of the holding surface of the sheet holder $SH_1$. Then, the illumination system IOP illuminates the illumination light $IL_1$ to $IL_5$ to the separate area $SA_i$ of the flattened sheet S through the pattern of the mask M, so that the sheet S is scan-exposed and a pattern is formed thereon. Accordingly, even in the case of the sheet S becoming contracted by, for example, heat generated during a treatment of a process, it is possible to perform the exposure with high precision. Therefore, it is possible to contribute to the production of an electronic device such as a flexible large-size display without increasing the size of the device.

Figure 40:
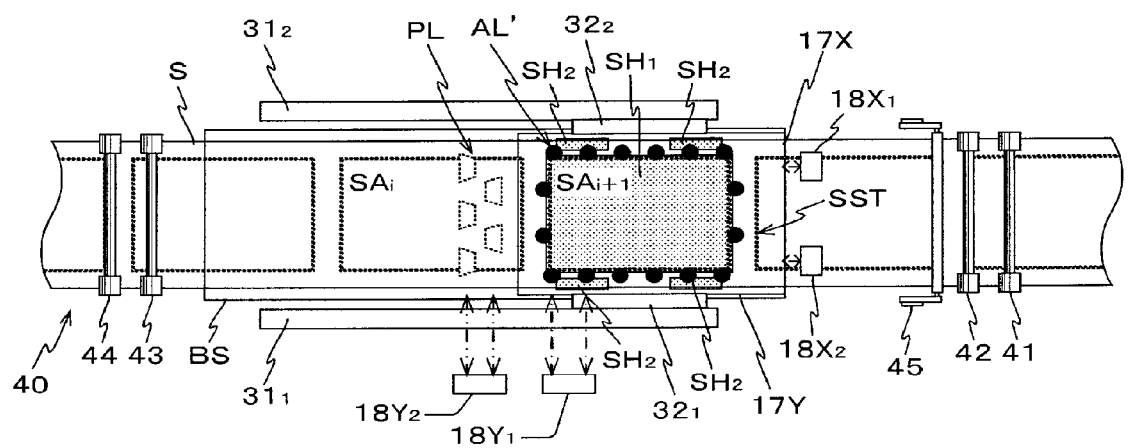
FIG. 40 is a diagram showing an arrangement of an alignment system relating to a modified example of the second embodiment.

In addition, in the exposure device 1000 of the above-described embodiment, the alignment measurement for the sheet S is performed by using the alignment systems $AL_1$ to $AL_{12}$ which are distant from each other in the Y-axis direction and are arranged along the X-axis direction. However, the present invention is not limited thereto. For example, the alignment marks can be disposed in the periphery of the separate area $SA_i$ on the sheet S at a predetermined interval therebetween, the alignment systems can be disposed so as to correspond to the peripheral portion of the separate area $SA_i$ in accordance with the arrangement of the alignment marks as shown in FIG. 40, and all the alignment marks can be simultaneously detected. In this case, when it is detected that the separate area $SA_i$ is decreased in the X-axis direction on the basis of the measurement result of the alignment marks, the scaling error in the X-axis direction of the separate area can be adjusted in such a manner that the main control device 50 applies a tension to the sheet S in the X-axis direction by using the damper portion 45 and the transportation roller portion 43.

Further, in the above-described embodiments, a case has been exemplified in which the sheet S having patterns formed in a plurality of separate areas is set as the exposure target, and the second layer exposure is performed by the exposure device 100, 1000, but the present invention is not limited thereto. Of course, the first exposure can be performed by the exposure device 100, 1000 by setting the unexposed sheet S as the exposure target.

Further, in the above-described embodiments, a case has been described in which the stage SST and the mask stage MST are scan-driven in the −X-axis direction so as to perform the scanning exposure (called a minus scan exposure) on the sheet S. However, in addition to this case, a configuration can be adopted in which the stage SST and the mask stage MST are scan-driven in the +X-axis direction so as to perform the scanning exposure (plus scan exposure) on the sheet S. Then, the minus scan exposure and the plus scan exposure can be alternately repeated so as to perform the exposure on a plurality of separate areas $SA_{k-1}$, $SA_k$, $SA_{k+1}$, . . . on the sheet S. With such a configuration, it is not necessary to rewind the mask stage MST and the stage SST. In this case, it is desirable to further provide clampers on the +X sides of the transportation roller portions 43 and 44 in order to hold the sheet S on the stage SST at the −X end on the base member BS. In addition, it is desirable to dispose the alignment system on the −X side of the projection optical system PL.

Further, in the above-described embodiments, a configuration is adopted in which only one stage SST is used, but a configuration can be adopted in which the rear surfaces of the separate areas of the exposure target of the sheet are sequentially adsorbed and held by using two or more stages. In this case, in the stage, the stage device SS can be configured so as to orbit a closed path including the scanning exposure section on the base member. Accordingly, after the exposure for one separate area is completed, the used stage can be retreated to a position outside the exposure section, and another stage can be used to promptly start the exposure for the next separate area. In addition, a configuration can be adopted in which a plurality of sheets is simultaneously subjected to the exposure by using a plurality of stages.

Further, in the exposure device of the above-described embodiments, the auxiliary sheet holder is provided on the upper surface of the stage (table) so as to be minutely driven in the Z-axis direction. However, instead of or in addition to this configuration, the sheet holder can be adapted to be minutely movable in the Z-axis direction. Accordingly, the sheet holder and the auxiliary sheet holder temporarily holding the sheet are relatively moved in the Z-axis direction so as to attach or detach the sheet to or from the stage (sheet holder). In addition, in the above-described embodiments, the transportation roller portion included in the sheet transporting system 40 can be adapted to be elevated in the Z-axis direction. Accordingly, the transportation roller portion having the sheet stretched thereon can be elevated so as to attach or detach the sheet to or from the stage (sheet holder).

Further, in the above-described embodiments, a case has been exemplified in which the stage SST is dissymmetric with respect to the Y axis passing the center, but the present invention is not limited thereto. Of course, a stage can be used which is symmetric with respect to the X axis and the Y axis passing the center. In this case, since it is not possible to measure the position of the stage using the interferometer $18Y_2$ immediately after the scanning exposure is completed, it is desirable to provide a measurement device for measuring the Y position thereof.

Further, in the above-described embodiments, the interferometer system 18 is adopted as the position measurement system of the stage SST, but instead of the interferometer system, an encoder (or an encoder system including a plurality of encoders) can be adopted. Alternatively, the interferometer system 18 and the encoder can be simultaneously used. In addition, the interferometer system is adopted as the position measurement system of the mask stage, but instead of the interferometer system, an encoder (or an encoder system including a plurality of encoders) can be adopted. Alternatively, the interferometer system and the encoder can be simultaneously used.

Further, in the exposure device 100, 1000 of the above-described embodiments, the multi-lens type projection optical system of the same magnification is used, but the present invention is not limited thereto. For example, the magnification multi-lens type projection optical system disclosed in the specification or the like of US Patent Application Publication No. 2008/0165334 can be used. In addition, of course, the projection optical system is not limited to the multi-lens type. Further, the projection optical system is not limited to the same magnification system and the magnification system, but can be the reduction system. The projection optical system is not limited to the reflection-refraction system, but can be the refraction system and the reflection system. The projection image can be any one of the erected image or the inverted image.

In addition, as the light source of the exposure device 100, 1000, in addition to the ultra high pressure mercury lamp for emitting an emission line such as a line i (having a wavelength of 365 nm), a line g (having a wavelength of 436 nm), or a line h (having a wavelength of 405 nm), solid-state laser (for example, triple harmonics of YAG laser: a wavelength of 355 nm), KrF excimer laser (248 nm), ArF excimer laser (193 nm), and $F_2$ laser (157 nm) can be used.

Further, in the above-described embodiments, a case has been exemplified in which a light transmission type mask having a predetermined light shielding pattern (or a phase pattern/dimming pattern) formed on a light transmission type substrate is used, and the pattern of the mask is projected onto the sheet through the projection optical system. However, the present invention is not limited thereto. By using an SLM (Spatial Light Modulator) as an element for spatially modulating the amplitude (intensity), the phase, or the polarization state of light traveling in a predetermined direction, for example, a reflection type spatial light modulator, that is, a light non-emission type image display element, for example, a DMD (Digital Micro-mirror Device), a reflection type liquid crystal display element, an EPD (Electro Phonetic Display), an electronic paper (an electronic ink), a grating light valve, and the like instead of the mask, an electronic mask (called a variable molding mask, an active mask, or an image generator) for forming a transmission pattern, a reflection pattern, or a light emission pattern on the basis of electronic data of the pattern can be used. Such an electronic mask is disclosed in, for example, the specification of U.S. Pat. No. 6,778,257. In addition, an electronic mask can be used which uses a transmission type spatial modulator such as an LCD (Liquid Crystal Display) and an ECD (Electrochromic Display). For example, in the case of using an electronic mask such as a DMD, an energy beam corresponding to a pattern to be formed on a sheet material is projected from the electronic mask onto the sheet material through a projection optical system, and an image corresponding to the pattern is formed on the sheet material. In this case, when the projection optical system is not used, the energy beam corresponding to the pattern is illuminated onto the sheet by the electronic mask, and the pattern is formed on the sheet.

The exposure device is not limited to the exposure device for the liquid crystal display element. For example, the exposure device can be widely applied to the exposure devices for manufacturing a flexible display as an organic EL display element, an electronic paper, a printed interconnection substrate, and the like.

In addition, the device for forming a pattern on the sheet is not limited to the above-described exposure device (lithography system), but for example, the present invention can be applied to a device for forming a pattern on a sheet through an ink jet method. In this case, instead of arranging the plurality of projection optical systems $PL_1$ to $PL_5$ along the Y-axis direction, a plurality of ink jet heads (or one large ink jet head) can be arranged along the Y-axis direction.

<Device Manufacturing Method>

By forming a predetermined pattern on a sheet using the exposure device of the above-described embodiment, it is possible to manufacture a liquid crystal display element as an example of an electronic device.

[Pattern Forming Process]

First, by using the exposure device of above-described embodiments, a so-called optical lithography process is performed in which an image corresponding to the pattern to be formed on the sheet is sequentially formed on the sheet coated with a resist through the projection optical system. By means of the optical lithography process, a predetermined pattern including a plurality of electrodes is formed on the sheet. Subsequently, the exposed sheet is subjected to respective processes such as a developing process, an etching process, and a resist separation process so that a predetermined pattern is formed on the sheet.

[Color Filter Forming Process]

Next, a color filter having a plurality of three sets of dots corresponding to R (Red), G (Green), and B (Blue) arranged thereon in a matrix shape or a color filter having a plurality of three pairs of stripes of R, G, and B arranged in a horizontal scanning direction is formed.

[Cell Assembling Process]

After the color filter forming process, a cell assembling process is performed in which a liquid crystal cell is assembled by using a sheet having a predetermined pattern obtained in the pattern forming process and the color filter obtained in the color filter forming process. In the cell assembling process, for example, a liquid crystal panel (liquid cell) is manufactured by injecting a liquid crystal between the sheet having a predetermined pattern obtained in the pattern forming process and the color filter obtained in the color filter forming process.

[Module Assembling Process]

Subsequently, components such as an electric circuit and a backlight for performing a display operation of the assembled liquid crystal cell are installed to complete as a liquid crystal display element. Accordingly, in the pattern forming process of the method of manufacturing the micro device, it is possible to highly precisely form a pattern image having a desired line width at a desired position, and thus to manufacture the liquid crystal display element with a good yield.

In addition, the exposure device and the exposure method of the above-described embodiments are suitable for manufacturing a flexible electronic device (micro device) and a flexible display. For example, in the first embodiment, the manufacture line for manufacturing the electronic device can be configured in such a manner that a resist coating device for coating a resist on the surface of the sheet S is disposed between the roller $40_1$ and the exposure device 100, 1000, and a developing device for developing the sheet S having a pattern formed thereon is disposed between the exposure device 100, 1000 and the winding roller $40_2$ in the longitudinal direction of the sheet.

Further, in general, the electronic device including at least a part of the sheet S can be manufactured in such a manner that a pattern is formed on the sheet S using the exposure device and the exposure method of the above-described embodiment, and the sheet S having a pattern formed thereon is processed on the basis of the pattern. Here, in the process of the sheet S on the basis of the formed pattern, a process of developing, etching, or printing the sheet S on the basis of the formed pattern can be appropriately applied. In addition, as the printing process, for example, a predetermined material such as conductive ink can be coated on the sheet S on the basis of the formed pattern. Further, as the printing process, a layer of a functional material (for example, a material having a variable property such as a water-repellent property, a hydrophilic property, or a hydrophobic property due to the irradiation of UV light) is formed in advance on the sheet S, an exposure pattern is formed on the layer of the functional material, and a material such as conductive ink is coated on the sheet S in accordance with the formed exposure pattern.

The exposure device and the exposure method according to the present invention are suitable for forming a pattern on an elongated sheet. In addition, the device manufacturing method according to the present invention is suitable for manufacturing an electronic device (micro device).

What is claimed is:

1. A pattern forming method of forming a predetermined pattern in each of a plurality of predetermined areas aligned in a longitudinal direction of an elongated sheet material, the pattern forming method comprising:

locating a stage, which has a reference surface and is configured to flatly support the sheet material with the reference surface, by moving the stage in the longitudinal direction so that a predetermined area selected from the predetermined areas of the sheet material faces the reference surface of the stage;

applying a two-dimensional tension to the predetermined area of the sheet material by adsorbing the sheet material at several portions with adsorbing-holding members that are provided on the stage and outside the reference surface while driving the adsorbing-holding members on the stage along a two-dimensional plane parallel to the reference surface, the several portions including two portions separated in the longitudinal direction and two portions separated in a width direction orthogonal to the longitudinal direction;

allowing the reference surface to adsorb a rear surface portion corresponding to the predetermined area of the sheet material with the two-dimensional tension applied; and illuminating an energy beam corresponding to the pattern to the predetermined area of the sheet material adsorbed to the reference surface.

2. The pattern forming method according to claim 1, further comprising:

transporting the sheet material in the longitudinal direction by using at least two driving rollers provided to be distant from each other in the longitudinal direction of the sheet material and rotating while coming into contact with the sheet material, wherein when the two-dimensional tension is applied to the sheet material, the tension is applied to the sheet material in the longitudinal direction by stopping the rotation of the driving roller located on the downstream side of the transportation direction of the sheet material during the transportation of the sheet material.

3. The pattern forming method according to claim 2, further comprising:

sandwiching a portion on the outside of the predetermined area of the sheet material using a pair of clamp members during the transportation of the sheet material using the driving rollers so as to temporarily stop the transportation of the sheet material.

4. The pattern forming method according to claim 1, further comprising:

detecting at least a part of a plurality of positioning marks attached to the predetermined area on the sheet material so as to correct the two-dimensional tension on the basis of the detection result.

5. The pattern forming method according claim 1, further comprising:

projecting the energy beam corresponding to the pattern to the sheet material through a projection optical system so as to form an image of the pattern on the sheet material; and detecting at least a part of the plurality of positioning marks attached to the predetermined areas on the sheet material so as to adjust at least one of an optical characteristic of the projection optical system and the two-dimensional tension on the basis of the detection result.

6. A device manufacturing method comprising:

forming a pattern on an elongated sheet material by using the pattern forming method according to any one of claims 1 to 5; and performing a process on the sheet material having the pattern formed thereon.

7. A pattern forming method of forming a predetermined pattern in each of a plurality of predetermined areas aligned in a longitudinal direction of a surface of an elongated sheet material, the pattern forming method comprising:

locating a stage, which has a reference surface and is configured to flatly support the sheet material with the reference surface, by moving the stage in the longitudinal direction so that a predetermined area selected from the predetermined areas of the sheet material faces the reference surface of the stage;

applying a first tension to the predetermined area of the sheet material in the longitudinal direction with a first tension-applying device that is configured to restrain at least two positions of the sheet material in the longitudinal direction;

applying a second tension to the predetermined area of the sheet material in a width direction orthogonal to the longitudinal direction by adsorbing the sheet material at several portions including two portions separated in the width direction with adsorbing-holding members that are provided on the stage and outside the reference surface while driving the adsorbing-holding members on the stage in the width direction;

allowing the reference surface to adsorb a rear surface portion corresponding to the predetermined area of the sheet material with a two-dimensional tension caused by the first and second tensions; and illuminating an energy beam corresponding to the pattern to the predetermined area of the flattened sheet material.

8. The pattern forming method according to claim 7, wherein in order to apply the first tension to the sheet material, when the sheet material is transported in the longitudinal direction by using at least two driving rollers provided to be distant from each other in the longitudinal direction of the sheet material and rotating while coming into contact with the sheet material, the rotation of the driving roller located on the upstream side of the transportation direction of the sheet material is stopped.

9. The pattern forming method according to claim 7, wherein in order to apply the first tension to the sheet material, when the sheet material is transported in the longitudinal direction by using a driving roller rotating while coming into contact with the sheet material, the transportation of the sheet material is temporarily stopped by sandwiching the sheet material by using a pair of clamp members.

10. The pattern forming method according to claim 7, wherein in order to apply the second tension to the sheet material, a rear surface portion on the outside of the predetermined area of the sheet material is adsorbed by using a plurality of adsorbing-holding members, at least one of which is provided on one side and the other side in a direction parallel to a second axis perpendicular to a first axis parallel to the longitudinal direction across the reference surface member, and the plurality of adsorbing-holding members is mutually relatively moved along a direction parallel to the second axis.

11. The pattern forming method according to claim 7, further comprising:
detecting at least a part of a plurality of positioning marks attached to the predetermined area on the sheet material so as to correct the first and second tensions on the basis of the detection result.

12. The pattern forming method according to claim 7, further comprising:
projecting the energy beam corresponding to the pattern to the sheet material through a projection optical system so as to form an image of the pattern on the sheet material; and
detecting at least a part of the plurality of positioning marks attached to the predetermined area on the sheet material so as to adjust at least one of the first and second tensions and an optical characteristic of the projection optical system on the basis of the detection result.

13. A device manufacturing method comprising:
forming a pattern on an elongated sheet material by using the pattern forming method according to any one of claims 7 to 12; and
performing a process on the sheet material having the pattern formed thereon.

\* \* \* \* \*